(12) United States Patent
Chang et al.

(10) Patent No.: US 6,915,323 B1
(45) Date of Patent: Jul. 5, 2005

(54) MACROCELLS SUPPORTING A CARRY CASCADE

(75) Inventors: Jason Chang, Fremont, CA (US); Satwant Singh, Fremont, CA (US); Ju Shen, Saratoga, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 65 days.

(21) Appl. No.: 10/368,023

(22) Filed: Feb. 13, 2003

Related U.S. Application Data

(63) Continuation of application No. 10/133,106, filed on Apr. 26, 2002, now Pat. No. 6,765,408
(60) Provisional application No. 60/356,507, filed on Feb. 11, 2002.

(51) Int. Cl.[7] .................................................. G06F 7/50
(52) U.S. Cl. ....................................................... 708/707
(58) Field of Search ................................. 708/707, 671

(56) References Cited

U.S. PATENT DOCUMENTS

| | | | |
|---|---|---|---|
| 4,769,562 A | | 9/1988 | Ghisio |
| 5,898,602 A | * | 4/1999 | Rothman et al. ........... 708/230 |
| 5,977,791 A | | 11/1999 | Veenstra |
| 5,978,826 A | * | 11/1999 | Kolagotla ................... 708/707 |
| 6,020,759 A | | 2/2000 | Heile ........................... 326/40 |
| 6,029,236 A | | 2/2000 | Steele et al. |
| 6,064,599 A | | 5/2000 | Cliff et al. |
| 6,144,573 A | | 11/2000 | Heile ........................... 365/49 |
| 6,150,838 A | | 11/2000 | Wittig et al. .................. 326/39 |
| 6,188,240 B1 | * | 2/2001 | Nakaya ....................... 326/39 |
| 6,208,163 B1 | | 3/2001 | Wittig et al. .................. 326/39 |
| 6,215,326 B1 | | 4/2001 | Jefferson et al. ............. 326/41 |
| 6,292,017 B1 | | 9/2001 | Rangasayee ................. 326/40 |
| 6,505,226 B1 | * | 1/2003 | Ahn ........................... 708/707 |

FOREIGN PATENT DOCUMENTS

EP        0866558        9/1998

* cited by examiner

Primary Examiner—D. H. Malzahn
(74) Attorney, Agent, or Firm—MacPherson Kwok Chen & Heid LLP; Jon W. Hallman

(57) ABSTRACT

A programmable logic device includes a plurality of logic blocks. Each logic block includes a plurality of macrocells, with each macrocell being configurable to register a sum of product term output. In addition, the macrocells within each logic block are arranged from a first macrocell to a last macrocell. Each macrocell is associated with a carry-in and a carry-out signal. The macrocells are configured to support a carry cascade such that the carry-out signal from the first macrocell becomes the carry-in signal for the second macrocell, and so on.

20 Claims, 54 Drawing Sheets

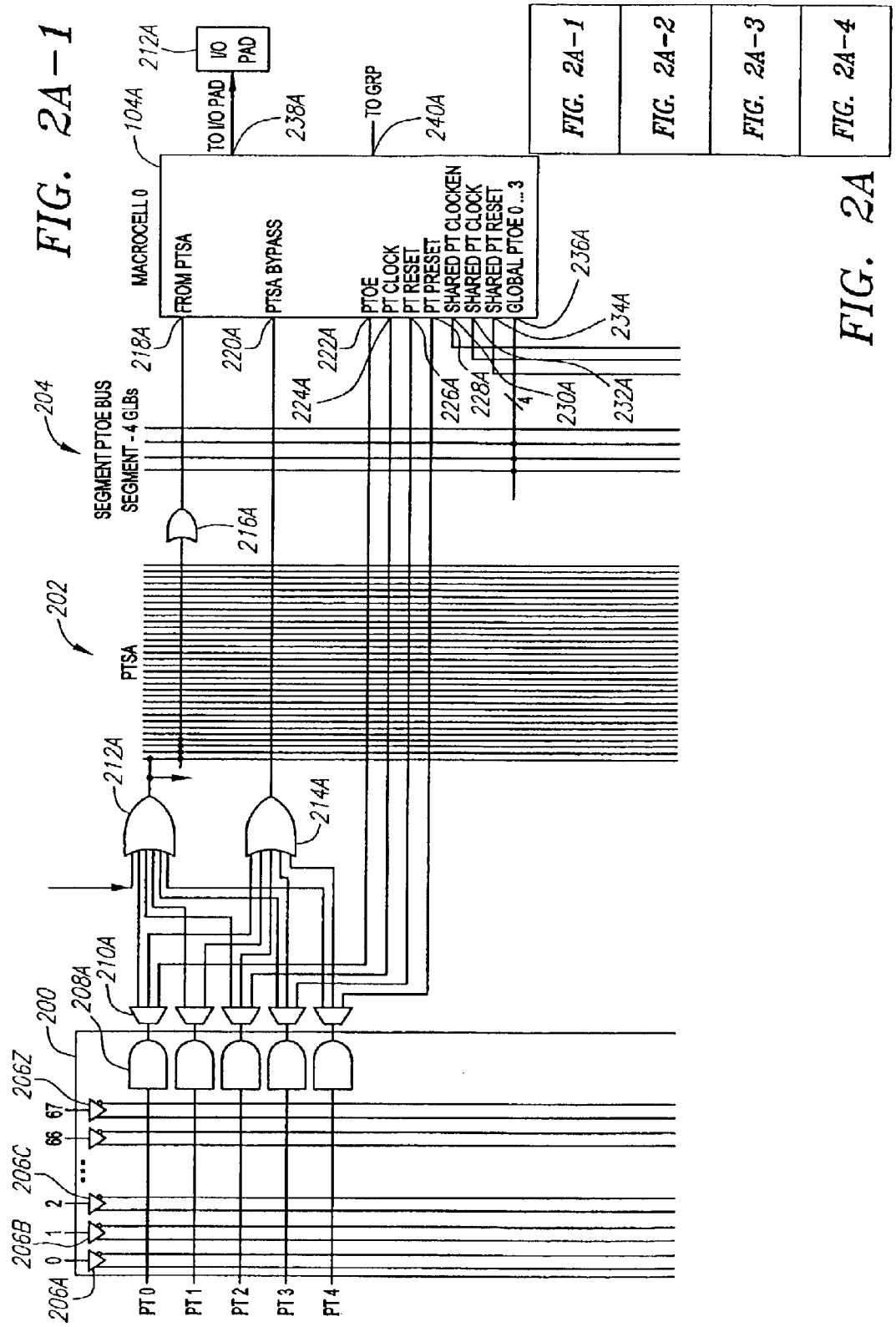

Synchronous memory with Independent Read and Write ports

| Configuration | W_Address (WA) | R_Address (RA) | W_Data (WD) | Control Signals WE, WCLKEN, WCS<0:1>, WCLK, RCLKEN, RCLK, RESET | Total Number of inputs | R_Data (RD - Total number of outputs) |
|---|---|---|---|---|---|---|
| 16384 x 1 | 14 | 14 | 1 | 8 | 37 | 1 |
| 8192 x 2 | 13 | 13 | 2 | 8 | 36 | 2 |
| 4096 x 4 | 12 | 12 | 4 | 8 | 36 | 4 |
| 2048 x 8 | 11 | 11 | 8 | 8 | 38 | 8 |
| 1024 x 16 | 10 | 10 | 16 | 8 | 44 | 16 |
| 512 x 32 | 9 | 9 | 32 | 8 | 58 | 32 |

FIG. 6D

Synchronous Dual Port Memory

| Configuration | Read/Write Address (RWA) | Read/Write Address (RWB) | W_Data, Port A (WDA) | W_Data Port B (WDB) | Control Signals WEA, RESETA, ENA, WCSA<0:1>, WCLKA, WEB, ENB, WCSB<0:1>, WCLKB, RESETB | Total Number of inputs | R_Data (RD - Total number of outputs, RDA + RDB) |
|---|---|---|---|---|---|---|---|
| 8192 x 1 | 13 | 13 | 1 | 1 | 12 | 40 | 2 |
| 4096 x 2 | 12 | 12 | 2 | 2 | 12 | 40 | 4 |
| 2048 x 4 | 11 | 11 | 4 | 4 | 12 | 42 | 8 |
| 1024 x 8 | 10 | 10 | 8 | 8 | 12 | 48 | 16 |
| 512 x 16 | 9 | 9 | 16 | 16 | 12 | 62 | 32 |

FIG. 7D

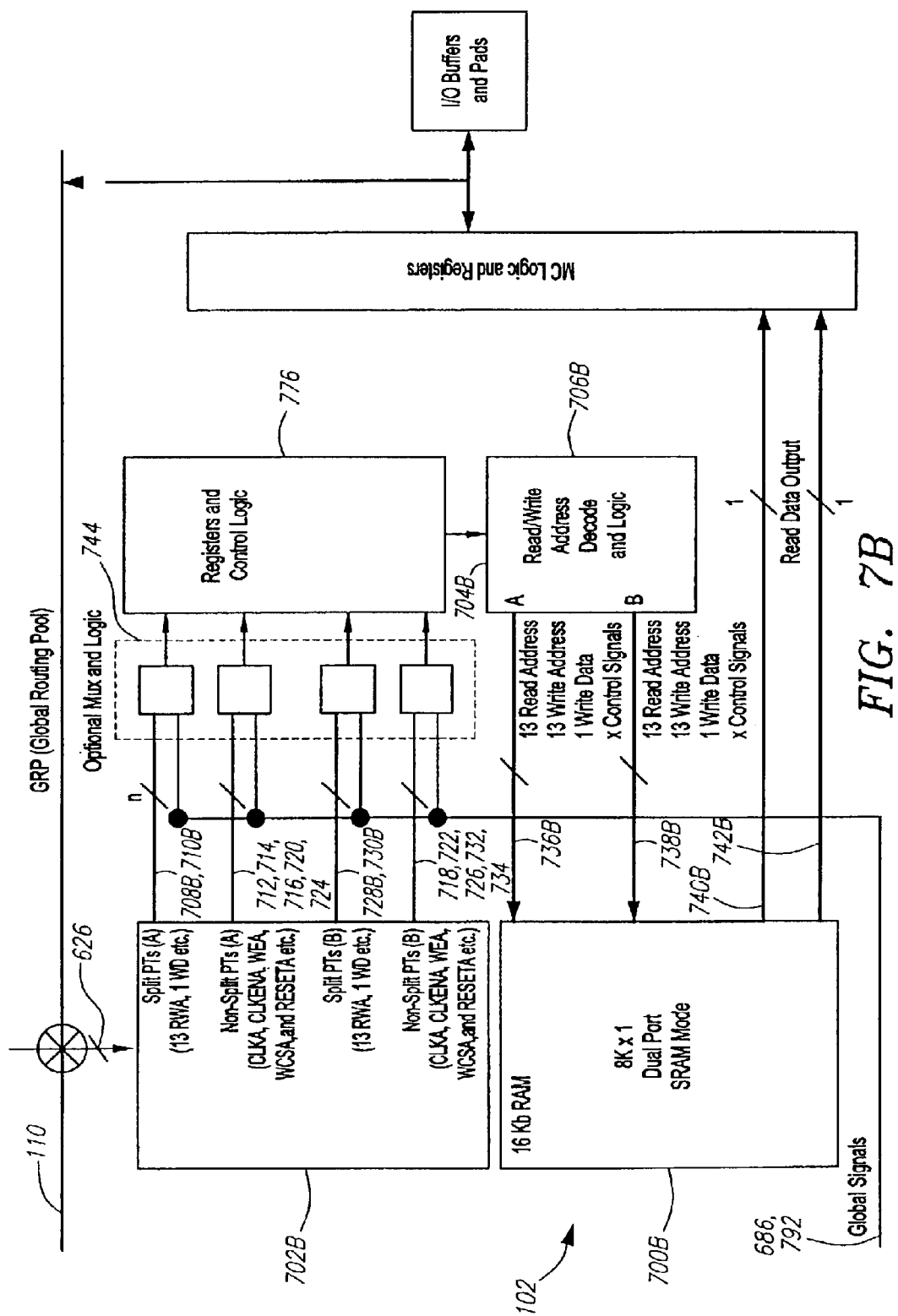

SYNCHRONOUS WRITE AND READ FROM THE SAME LOCATION

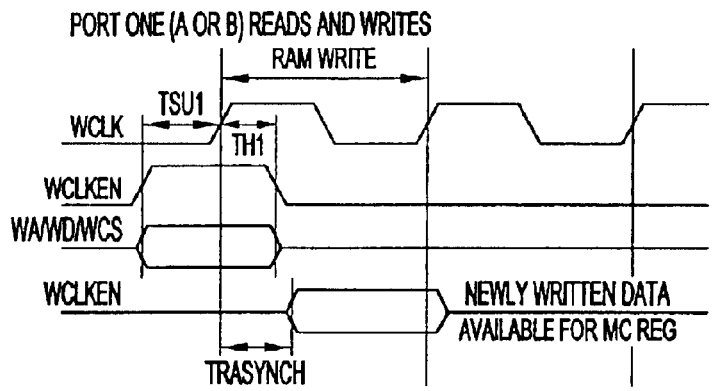

*FIG. 7E*

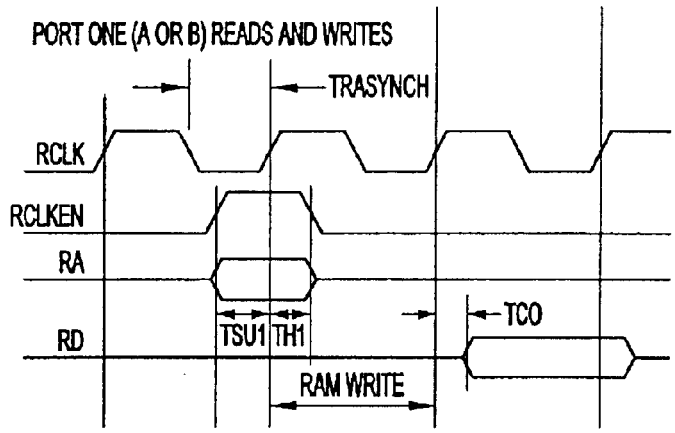

*FIG. 7F*

| SYNCHRONOUS RAM TIMING PARAMETERS | |
|---|---|
| SYMBOL | PARAMETER |
| FMAX | MAXIMUM WRITE (READ) CLOCK FREQUENCY (NOTE 2) |
| TSU1 | MAXIMUM WRITE (READ) ADDRESS SET UP TIME BEFORE WRITE (READ) CLOCK |
| TH1 | WRITE (READ) ADDRESS HOLD TIME AFTER WRITE (READ) CLOCK |
| TCO | READ CLOCK TO READ DATA OUT |
| TSKEW | SKEW BETWEEN READ AND WRITE CLOCK FOR VALID READ AFTER WRITE (NEEDED ONLY IF READ AND WRITE ADDRESSES ARE THE SAME) |
| TCK2CK | CLOCK TO CLOCK SETUP TIME FOR VALID WRITE, IF THIS IS SIMILAR TO TSKEW, THEN DELETE THIS |

*FIG. 7G*

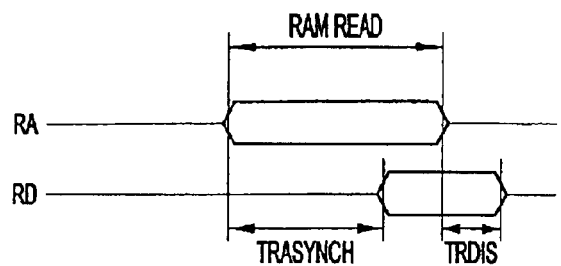
FIG. 7H
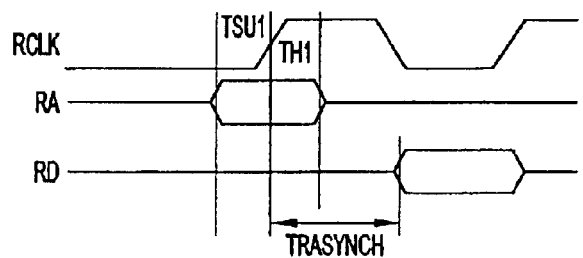
FIG. 7I
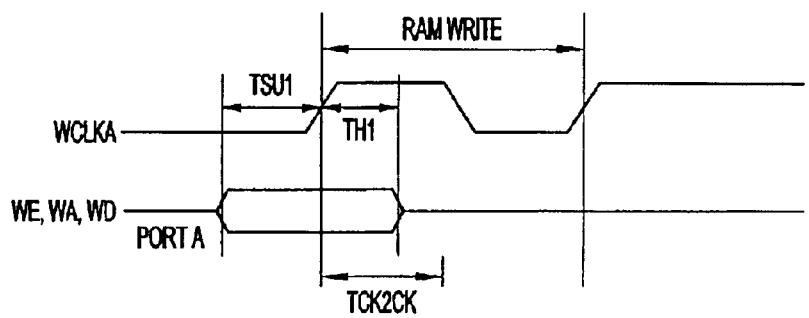
FIG. 7J
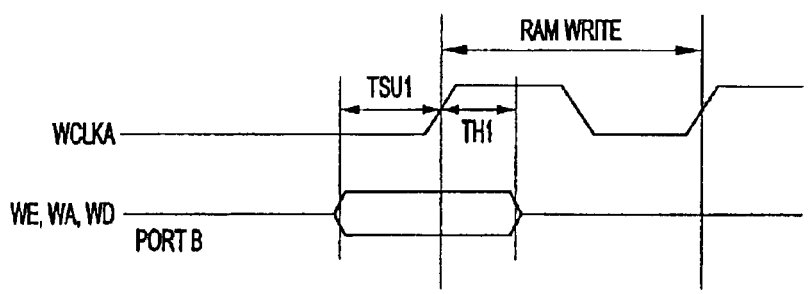
FIG. 7K
| ASYNCHRONOUS RAM TIMING PARAMETERS | |
|---|---|
| SYMBOL | PARAMETER |
| TRASYNCH | READ ACCESS TIME EXPRESSED AS AN ADDER FOR TPD OR TCO |
| TRDIS | READ DATA VALID AFTER ADDRESS GOES AWAY (USEFUL FOR HOLD TIMES) |
FIG. 7L Update Mode

| EN_MASK_REG | WR_DONT_CARE | MASK_REGISTER | Data to be written into CAM |
|---|---|---|---|
| 0 | X | X | Data Register |
| 1 | X | 0 | Data Register |
| 1 | 0 | 1 | Don't Write / Keep previous bit |
| 1 | 1 | 1 | Write don't care |

Compare Mode

| EN_MASK_REG | WR_DONT_CARE | MASK_REGISTER | Compared Value |
|---|---|---|---|
| 0 | X | X | CAM Data bit |
| 1 | X | 0 | CAM Data bit |
| 1 | X | 1 | Don't Care always |

FIG. 8H

| | Power On reset conditions | |
|---|---|---|
| | <47:N> (Don't cares) | <N-1:0> (Data bits & User Classes) Note 1 |
| CAM Data word | Always Set to "1" | Hardware Defaults |
| Data / Comparand register | Always Set to "1" | Reset |
| Mask register | Does not matter-Hardware Defaults | |

FIG. 8I

| | | CAM is in normal user mode | |
|---|---|---|---|
| | | <47:N> (Don't cares) | <N-1:0> (Data bits & User Classes) Note 1 |
| CAM Data word | Updated word | Always Set to "1" | Data |
| | Never been Updated since Power-On Reset | | Hardware Defaults |
| Data / Comparand register | | Always Set to "1" | Update / Compare Data |
| Mask register | | Does not matter-Hardware Defaults | Mask Data |

| Configuration | W_Data (WD) | Control Signals WE, WCLK, RE, RCLK, RESET, RESET_RP | Total number of inputs |
|---|---|---|---|
| 16384 x 1 | 1 | 6 | 7 |
| 8192 x 2 | 2 | 6 | 8 |
| 4096 x 4 | 4 | 6 | 10 |
| 2048 x 8 | 8 | 6 | 14 |
| 1024 x 16 | 16 | 6 | 22 |
| 512 x 32 | 32 | 6 | 38 |

| R_Data (RD) | flags | Total number of outputs |
|---|---|---|
| 1 | 4 | 5 |
| 2 | 4 | 6 |
| 4 | 4 | 8 |
| 8 | 4 | 12 |
| 16 | 4 | 20 |
| 32 | 4 | 36 |

*FIG. 9B*

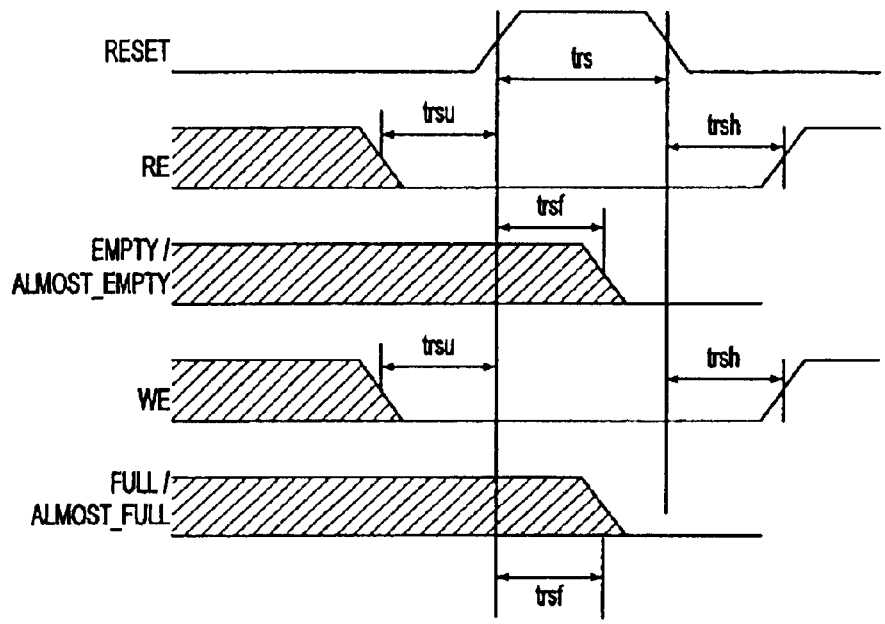

RESET pulse width (trs), RESET to Flag valid (trsf),
RESET setup (trsu) and hold (trsh) times Note: This timing diagram illustrates only the function of the RESET. The actual timings depend on whether RESET is from -GSR or Block level reset.

FIG. 9H

| Symbol | Parameter |
|---|---|
| fmax | Maximum Write(Read) clock frequency |
| tsu1 | Write(Read) address set up time before Write(Read) Clock |
| th1 | Write(Read) address hold time after Write(Read) Clock |
| tco | Write(Read) Clock to FULL (ALMOST_FULL, {EMPTY (ALMOST_EMPTY) Flag register output |
| tskew | Skew time between Read Clock and Write Clock for Flag signal registers (not a timing constraint for proper device operation) |

FIG. 9I

| | Switch timing parameters |
|---|---|
| Symbol | Parameter |
| twsa | Switch Address Clock (ACLK) frequency, twsa = 1/fswa |
| tsu1 | Address / Data / Control set up time before ACLK / DCLK |
| th1 | Address / Data / Control hold time after ACLK / DCLK |
| tco | Data Clock (DCLK) to valid Data out (DOUT) |
| tnewconf | Address Clock (ACLK) to valid DOUT |
| tswch | Switch delay expressed as an adder for tpd |

DUAL WRITE PORT CELL WITH SHADOW MEMORY

MACROCELLS SUPPORTING A CARRY CASCADE

CLAIM OF PRIORITY

This patent application is a continuation of U.S. Ser. No. 10/133,106, filed Apr. 26, 2002, issued as U.S. Pat. No. 6,765,408, which in turn claims the benefit of U.S. Provisional Patent Application No. 60/356,507, filed on Feb. 11, 2002, both of which applications are hereby incorporated by reference in their entirety.

INCORPORATION BY REFERENCE

The following co-assigned U.S. patent applications and Patents are hereby incorporated by reference in their entireties: (1) U.S. patent application Ser. No. 09/704,487, entitled "Wide Input Programmable Logic System And Method" filed on Nov. 2, 2000, issued as U.S. Pat. No. 6,507,212; and (2) U.S. Pat. No. 6,067,252, entitled "Electrically Erasable Non-Volatile Memory Cell With Virtually No Power Dissipation", filed on May 26, 1999.

TECHNICAL FIELD

The present invention relates generally to programmable devices. Specifically, the present invention relates to logic blocks having macrocells supporting a carry cascade.

BACKGROUND

Field-programmable gate arrays (FPGAs) and programmable logic devices (PLDs) have been used in data communication and telecommunication systems. Conventional PLDs and FPGAs have a predetermined number of non-configurable blocks, where each block performs a predetermined function. Some currently-available CPLD products comprise arrays of logic cells. On high-density CPLD products, memory modules may be included. The memory module is usually limited to SRAM.

Conventional PLD devices and methods have several drawbacks, such as footprint requirements on a circuit board, limited speed and limited data processing capabilities.

SUMMARY

One aspect of the invention relates to a programmable logic device including a plurality of logic blocks. Each logic block includes a plurality of product term circuits each operable to provide a product term output. A plurality of M OR gates are configured to receive the product term outputs, wherein each OR gate is configured to receive a subset of the product term outputs and provide a sum of products output. A plurality of M macrocells corresponds to the plurality of M OR gates, wherein each macrocell is configurable to register the sum of products output from its corresponding OR gate. A plurality of M multiplexers corresponds to the plurality of M OR gates and the plurality of M macrocells, wherein each multiplexer is configured to select between a product term output and a carry-in signal to provide a carry-out signal, and wherein the multiplexers are arranged from a first multiplexer to an Mth multiplexer to form a carry cascade such that the carry-out signal from the first multiplexer becomes the carry-in signal for the second multiplexer, the carry-out signal from the second multiplexer becomes the carry-in signal for the third multiplexer, and so on.

Another aspect of the invention relates to a method including the steps of: (a) providing a logic block having a plurality of macrocells arranged from a first macrocell to an Nth macrocell, each macrocell being configurable to register a corresponding sum of products output; (b) generating a carry-in signal for the first macrocell; (c) generating a carry-out signal from either the carry-in signal or a product term output, wherein selection of either the carry-in signal or the product term output is based upon the sum of products output corresponding to the first macrocell; and (d) continuing the carry cascade such that the carry-out signal from the first macrocell becomes a carry-in signal for the second macrocell, a carry-out signal for the second macrocell becomes the carry-in signal for the third macrocell, and so on, wherein the carry generation at each macrocell is based upon its corresponding sum of products output.

BRIEF DESCRIPTION OF THE DRAWINGS

FIG. 2A is a key to FIGS. 2A-1 through 2A-4.

FIGS. 2A-1 illustrates a portion of one embodiment of a GLB of FIG. 1A configured in a logic/arithmetic mode.

FIGS. 2A-2 illustrates a portion of one embodiment of a GLB of FIG. 1A configured in a logic/arithmetic mode.

FIGS. 2A-3 illustrates a portion of one embodiment of a GLB of FIG. 1A configured in a logic/arithmetic mode.

FIGS. 2A-4 illustrates a portion of one embodiment of a GLB of FIG. 1A configured in a logic/arithmetic mode.

FIG. 3 illustrates one embodiment of a macrocell of FIG. 1B and surrounding logic.

FIG. 6D illustrates six exemplifying memory configurations for the single-port RAM of FIG. 6C.

FIG. 7B illustrates one embodiment of a GLB 102 of FIG. 1A in a dual-port RAM mode with a configurable 8192×1 SRAM.

FIG. 7D illustrates five exemplifying memory configurations for the dual-port RAM of FIG. 7C.

FIGS. 7E–7L illustrate exemplifying signal timing diagrams and timing parameters for the dual-port RAM of FIG. 7C.

FIG. 8H illustrates exemplifying power-on reset conditions of the CAM in FIG. 8F.

FIG. 8I illustrates exemplifying normal user mode conditions of the CAM in FIG. 8F.

FIG. 9A is a key to FIGS. 9A-1 and 9A-2.

FIGS. 9A-1 illustrates a portion of one embodiment of a GLB of FIG. 1A in a FIFO mode with a configurable 512×32 FIFO.

FIGS. 9A-2 illustrates a portion of one embodiment of a GLB of FIG. 1A in a FIFO mode with a configurable 512×32 FIFO.

FIG. 9B illustrates exemplifying FIFO configurations for the FIFO of FIG. 9A.

FIGS. 9F–9I illustrate exemplifying signal timing diagrams and parameters for the GLB of FIG. 9A in FIFO mode.

FIG. 11A is a key to FIGS. 11A-1 through 11A-3.

FIG. 11A-1 illustrates a portion of one embodiment of one product term circuit in FIG. 2A.

FIG. 11A-2 illustrates a portion of one embodiment of one product term circuit in FIG. 2A.

FIG. 11A-3 illustrates a portion of one embodiment of one product term circuit in FIG. 2A.

Use of the same reference symbols in different figures indicates similar or identical items.

DETAILED DESCRIPTION

Figure 1A:
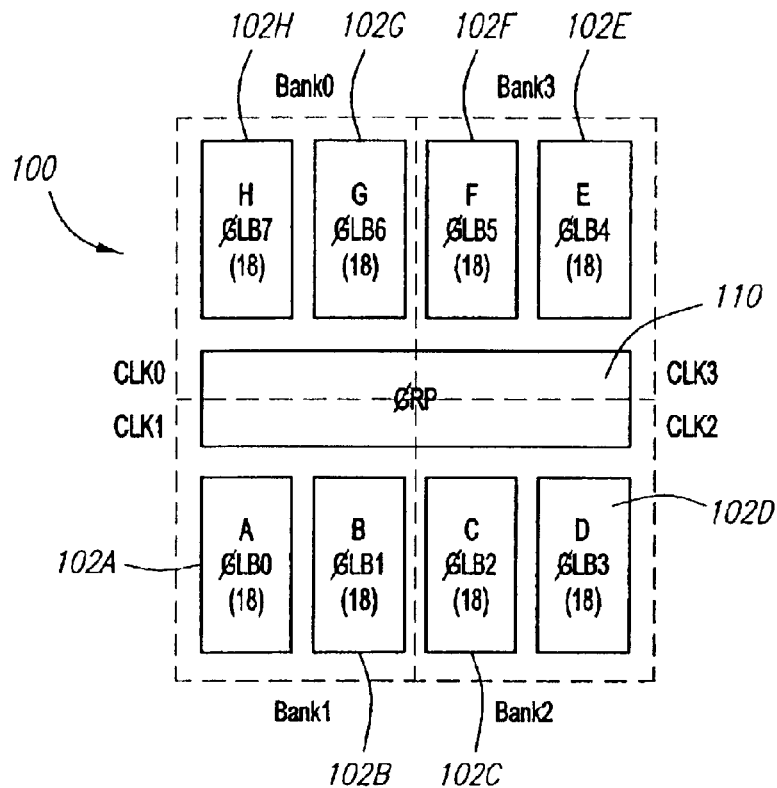
FIG. 1A illustrates one embodiment of a programmable device with a plurality of generic logic blocks (GLBs).

The present invention recognizes that the pre-determined ratio of memory vs. logic blocks in conventional PLDs and FPGAs is often undesirable for particular user applications. It is always challenging to determine the ratio of memory vs. logic desired by users. The desired ratio varies, e.g., more than 50% or less then 10%, depending on particular system applications.

A programmable device with configurable generic logic blocks and methods of using the programmable device are provided in accordance with the present invention. In one embodiment, the programmable device comprises a microchip with a plurality of generic logic blocks (GLBs). The programmable device may be a general purpose, non-volatile, wide-input programmable device with super high gate densities, e.g., over one million system gates.

The structure of each generic logic block may be substantially similar, but each generic logic block is configurable to act as a complex programmable logic device (CPLD), an arithmetic unit, a configurable random access memory (RAM), a dual-port RAM, a configurable read only memory (ROM), a configurable content addressable memory (CAM), a configurable first-in-first-out memory (FIFO) and/or a configurable switch. The generic logic blocks improve data processing capabilities, flexibility, scalability and speed of a PLD and use a smaller footprint (less space on a microchip).

In one embodiment, a programmable device has one or more generic logic blocks that may be configured to perform a first function, while one or more other generic logic blocks are configured to perform a second function. For example, one generic logic block in the programmable logic device is configured as a RAM while two other blocks are configured as a FIFO, where all three blocks have the same structure. A user application may configure the generic logic blocks of the PLD for any ratio of logic, RAM, ROM, CAM, FIFO and switch functions. Thus, system functions can be implemented with any configurable ratio of memory vs. logic. The configurable generic logic blocks provide a homogeneous design environment that adapts to various system design challenges.

In accordance with the invention, each versatile generic logic block uses a configurable AND array to implement logic, SRAM, dual-port SRAM, ROM (RAM with the write port deactivated), FIFO, CAM or dynamic connectivity, cross point switch functions with minimum on-chip logic. In one embodiment, the AND array comprises low-power complementary metal oxide semiconductor (CMOS) circuits with n-channel MOS (NMOS) gates. In another embodiment, the AND array comprises one or more sense amplifiers.

In one embodiment, the CMOS circuits in the AND array advantageously consume or dissipate substantially zero direct current (DC) power. In contrast to PLD devices with sense amplifiers, the CMOS circuits in a programmable device according to the present invention reduce the memory cell size, increase memory cell margins and decrease memory cell stresses, allow the device to have a higher density of gates, reduce direct current and voltage requirements and provide speed advantages that scale with semiconductor processes.

In another embodiment, the programmable device is coupled to input/output cells that consume or dissipate substantially zero direct current (DC) power.

In one embodiment, each generic logic block in the programmable device may be configured to be a dual-port RAM with a first port and a second port. Each port is configured to write data to or read data from the memory.

In one embodiment, each generic logic block further comprises internal hardwired control logic, such as multiplexers, address decoders and/or polarity control circuits. In one embodiment, all control logic is implemented in hardware and are self-contained within each generic logic block. The generic logic block advantageously does not require additional logic to perform CPLD, dual-port RAM, ROM, FIFO, CAM and switch operations.

In one embodiment, the programmable device further comprises hardwired control logic coupled to one or more of the generic logic blocks. The hardwired control logic is configured to control one or more generic logic blocks.

In one embodiment, the programmable device may cascade product terms from one generic logic block to another generic logic block.

In one embodiment, each generic logic block in the programmable device comprises a plurality of configurable macrocells. Each macrocell may be configured to operate according to one of the above-mentioned functions: CPLD, arithmetic, RAM, ROM, CAM, switch or FIFO.

In one embodiment, the programmable device further comprises product term sharing arrays configured to share product terms between macrocells.

In one embodiment, the programmable device further comprises product term chain logic configured to expand product terms from two or more macrocells into a chain of product terms.

In one embodiment, each generic logic block may be configured to perform memory functions and input routing. Input signals from a global routing resource routed to a memory module (configured in the generic logic block) should be in a pre-determined sequence or order, i.e., received on specific data input pins and address input pins. In contrast, when a generic logic block is performing logic, input signals from a global routing resource may not be required to be in a predetermined sequence, and thus enhanced input routing may not be needed. The configurable input routing resources in accordance with the present invention meets the input routing requirements of a memory, avoids increasing routing overheads when the generic logic block performs logic, and reduces the die size of the programmable device because global routing resources may be reduced.

In one embodiment, each generic logic block is configurable to simultaneously perform two or more of the above-mentioned functions: CPLD, arithmetic, RAM, ROM, CAM, switch or FIFO.

In one embodiment, each generic logic block is configurable to function as a memory, such as a first-in-first-out memory, with programmable width modulation. Input and output port widths of the memory may be configurable, such that an input port has a width configured differently than the width of an output port. In addition, the width (size of each stored word) and depth (number of stored words) of the memory may be configurable.

FIG. 1A illustrates one embodiment of a programmable device 100 with a plurality of generic logic blocks 102A–102H. The programmable device 100 may be implemented on a single microchip. There are eight generic logic blocks (GLBs) 102A–102H in FIG. 1, but other embodiments of the programmable device 100 may have any suitable number of GLBs, such as 16, 32, 64, 1000 or 10,000 GLBs. Also, the generic logic blocks 102A–102H may be arranged in a number of different configurations.

In FIG. 1A, the GLBs 102A–102H receive and transmit signals, such as data and control signals, via a global routing pool (GRP) or bus 110. The device 100 may also have an isolated, non-volatile memory block, such as EEPROM, that transfers control signals and instructions to the GLBs 102A–102H upon power-up.

Figure 1B:
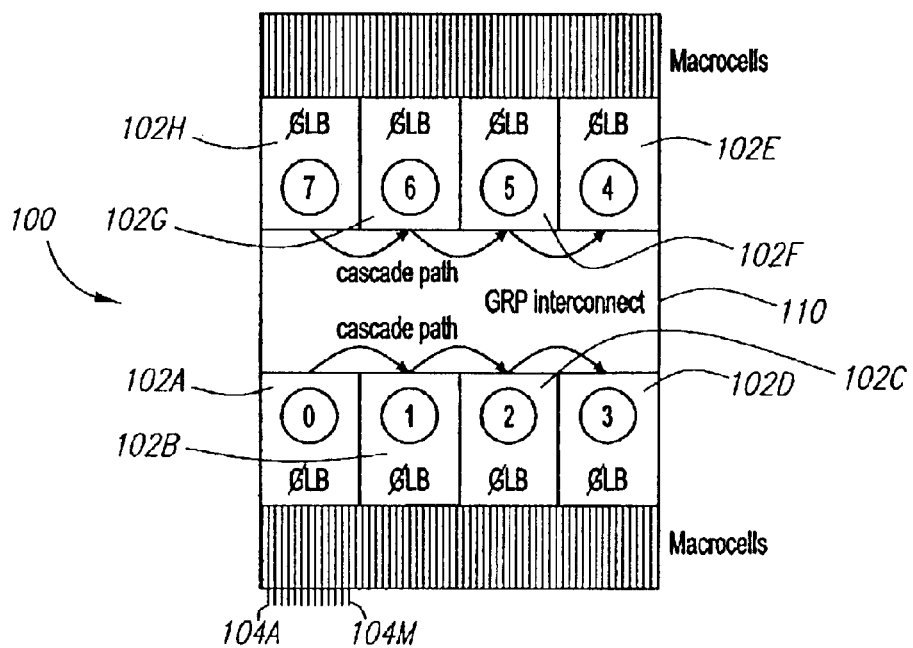
FIG. 1B illustrates the programmable device of FIG. 1A where each GLB comprises a plurality of macrocells in addition to other elements.

FIG. 1B illustrates the programmable device 100 of FIG. 1A where each GLB 102, such as the first GLB 102A, comprises a plurality of macrocells 104A–104M in addition to other elements. Each GLB 102 may comprise any suitable number of macrocells 104. In one embodiment, each GLB 102 has 32 macrocells 104, and eight GLBs 102A–102H have a total of 256 macrocells 104. In another embodiment, there are 64 GLBs with a total of 2048 macrocells 104 (each GLB 102 has 32 macrocells 104).

The generic logic blocks 102A–102H may be referred to as 'generic' or 'homogeneous' because the structure of each generic logic block 102 is similar, but each block 102 may be separately configured to perform one or more functions, such as complex programmable logic, arithmetic, random access memory (RAM), read only memory (ROM), content addressable memory (CAM), a first-in-first-out memory (FIFO) or switching. Similarly, each macrocell 104 (FIG. 1B) may operate in a complex programmable logic mode, an arithmetic mode, a RAM mode, a ROM mode, a CAM mode, a FIFO mode or a switch mode.

In one embodiment with a one-level general routing pool 110, the routing wires from each macrocell 104 and input pad 242 (FIG. 2A) span an entire microchip and feedback to AND array inputs through GRPs 110 of the device 100.

Two-Level Routing or Segment Routing

Figure 1C:
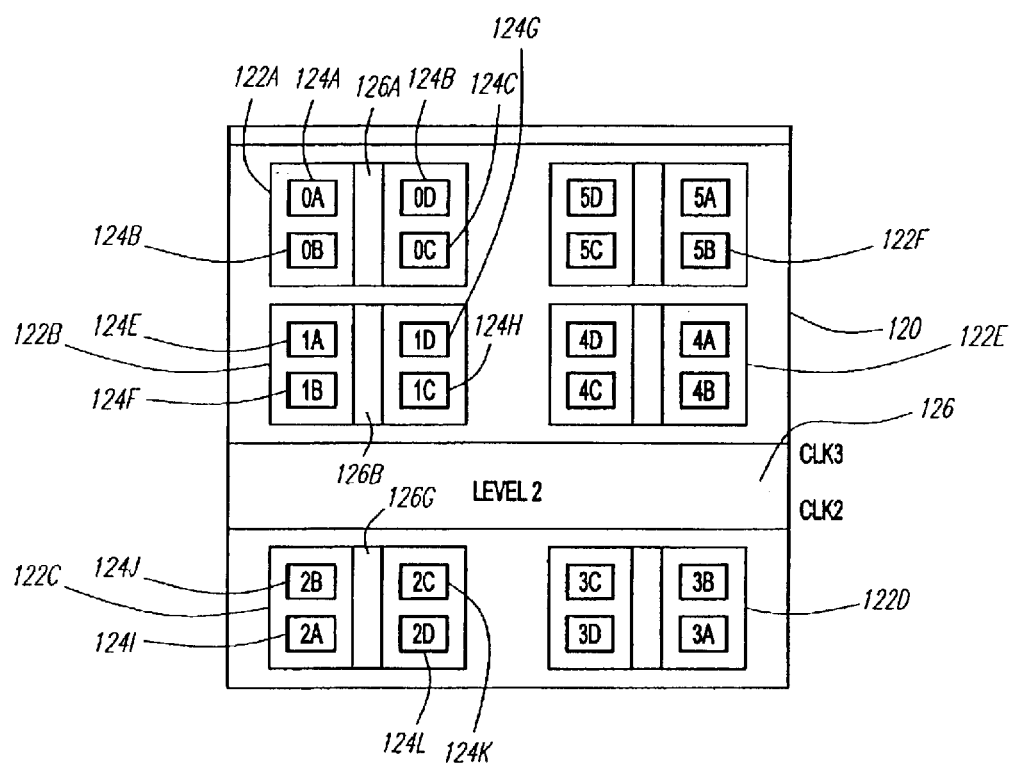
FIG. 1C illustrates one embodiment of a device with a plurality of GLBs and two-level routing.

FIG. 1C illustrates one embodiment of a device 120 with a plurality of GLBs 124 and two-level routing. A first level of routing (also called 'level one routing' or '1-level routing'), such as the first level routing 126A, couples four GLBs, such as the first four GLBs 124A–124D. Each group of four GLBs, such as the first four GLBs 124A–124D, may called a 'segment,' such as a first segment 122A. The first level of routing 126A may be called a segment routing pool (SRP). Segment routing saves general routing resources. The segments 122A–122F are coupled to each other via a second level of routing 126 (also called 'level two routing,' '2-level routing' or general routing).

High Performance 'Zero Power' Product Term Logic

A sense amplifier requires DC current to sense a memory cell. The more current provided to the sense amplifier, the faster the sense amplifier performs. Thus, there is a tradeoff between performance and power consumption. For example, a sense amp may be designed with a 1-ns product term delay and consumes 800 uA of current. Another sense amp can be designed with 5-ns product term delay at 300 uA.

In one example of a memory circuit, there are 164×16= 2,624 sense amplifiers. If a total $I_{CC}$ target is 1 Amp, an AC current target is 400 mA, a DC current target is 600 mA and substantially all DC current are from the sense amps, the circuit can only afford 285 uA per sense amp. This is based on only 80% of the sense amps being used in a customer application. The circuit may have a 5-ns propagation delay from the sense amps alone. This delay may be too long for some customer applications.

In order to make the circuit faster, the circuit may have a programmable option to turn on one or more sense amps at 1 ns, with a cost of 800 uA. Every sense amp programmed to such high performance takes current away from the $I_{CC}$ budget of 3 low current sense amps. A design software may have to calculate the total $I_{CC}$ DC current for each customer application.

The sense amp usage may vary in each customer application. Some applications use less PTs and some applications use more PTs. Customer applications that use less PTs can afford more high-performance, optioned sense amps. In a typical customer application, 50% of the PTs are used. This means all the PTs are slow, but only 10% of PTs are high speed for critical signals.

As described below, one embodiment of the GLB 102 in accordance with the present invention comprises CMOS circuits with zero DC current. Thus, the GLB 102 does not need to slow down performance to reduce current. Every product term is at 1-ns speed grade. A device with these GLBs 102 may simplify a customer's design process because the customer does not need to decide which signals are critical. Customers also do not need to accept slower PTs for most of their applications. The overall system performance is optimized. The advantages of a device with zero-DC-current CMOS circuits (described below) to generate product terms are more significant in a high density CPLD.

In one embodiment, the programmable devices 100 and 120 in FIGS. 1A–1C comprise logic that consumes or dissipates substantially zero direct current (DC) power. For example, each generic logic block 102 of the devices 100 and 120 in FIGS. 1A–1C may comprise a plurality of 'zero-power' product term circuits 208 (e.g., FIGS. 2A and 11B). The product term circuits 208 may be configured as non-volatile memory cells. Some examples of 'zero-power' memory cells are described in (1) U.S. patent application Ser. No. 09/704,487, entitled 'Wide Input Programmable Logic System And Method,' which was filed on Nov. 2, 2000 by the Assignee of the present Application, and (2) U.S. Pat. No. 6,067,252, entitled 'Electrically Erasable Non-Volatile Memory Cell With Virtually No Power Dissipation,' which was filed on May 26, 1999 by the Assignee of the present application. Both applications are hereby incorporated by reference in their entireties.

A 'zero-power' memory cell may have a configuration with transistors and a latch (or half-latch), along with certain signal timing and pre-charging methods, to prevent current from flowing through one or more transistors of the memory cell during normal operation and editing modes, such as programming or erasing.

In another embodiment, the programmable devices 100 and 120 of FIGS. 1A–1C are coupled to input/output cells which consume or dissipate substantially zero direct current (DC) power.

Logic/Arithmetic Mode

Figures 2, 2A:
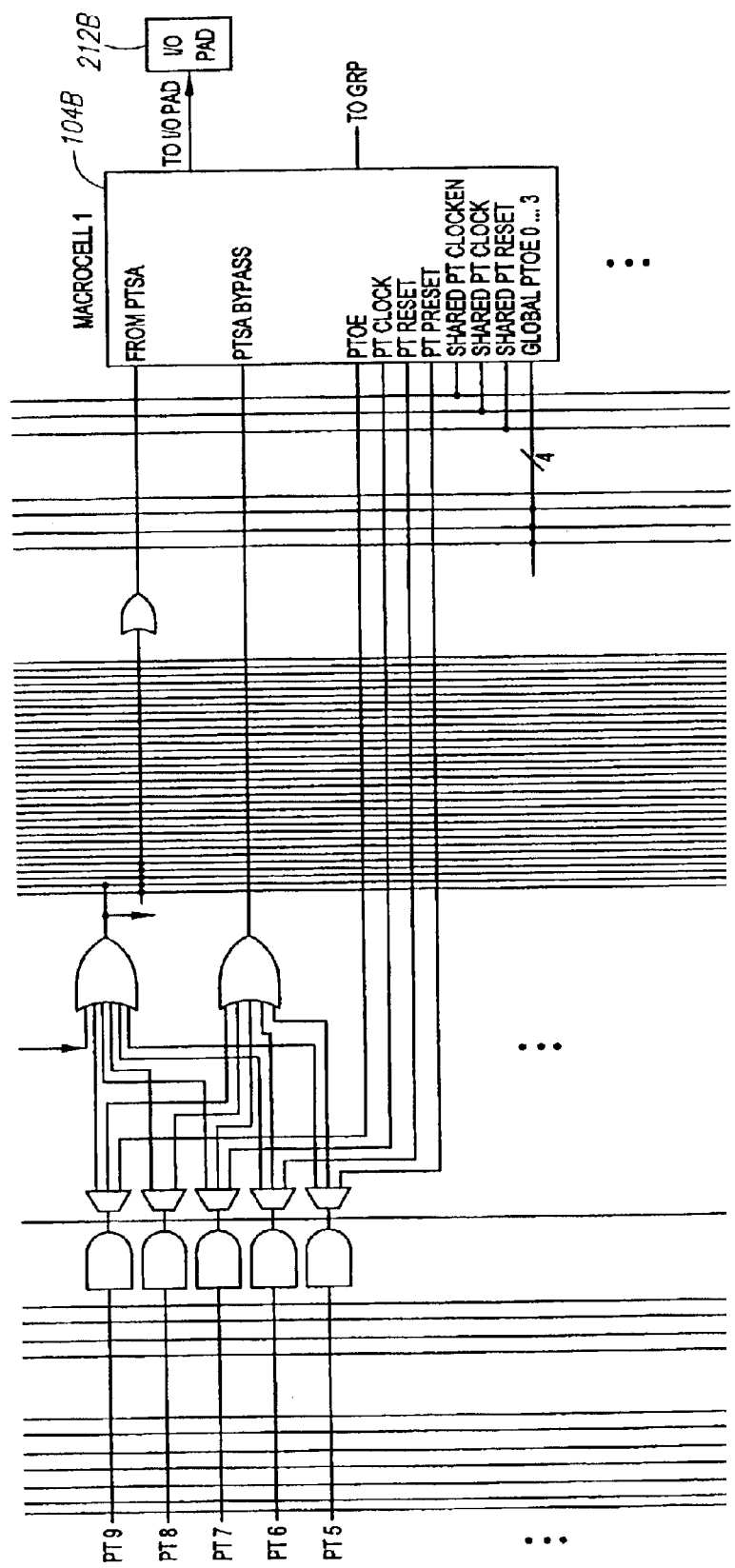

FIG. 2A illustrates one embodiment of a GLB 102 of FIG. 1A configured in a logic/arithmetic mode. The GLB 102 in FIG. 2A comprises 32 macrocells 104A–104Z (e.g., 32 macrocells), an AND array 200, a product term sharing array (PTSA) 202, a segment routing bus 204, a plurality of demultiplexers, such as a first demultiplexer 210A, a plurality of 6-input OR gates, such as a first 6-input OR gate 212A, a plurality of 5-input OR gates, such as a first 5-input OR gate 214A and a plurality of variable-input OR gates, such as the OR gate 216A. For the sake of simplicity, any reference number herein with the appended letter 'Z' may refer to any $n^{th}$ element and is not restricted to a twenty-sixth element. For example, 'macrocells 104A–104Z' may refer to 32 macrocells, where the 'macrocell 104Z' refers to a thirty-second macrocell.

The AND array 200 in FIG. 2A has 68 input lines and 164 product term output lines. In other embodiments, the AND array 200 may have any suitable number of input lines and product term lines. As described below, the AND array 200 may be configured to perform either product term logic or memory functions, such as SRAM, dual-port SRAM, ROM, FIFO, CAM and cross point switch, with input routing.

In FIG. 2A, the 164 product term lines comprise five product term lines per macrocell 104 multiplied by 32 macrocells 104A–104Z (5×32=160), plus four extra product term lines 160–163. The four extra product term lines 160–163 comprise a CLOCK ENABLE signal line 160, a CLOCK signal line 161, a RESET signal line 162 and a global product term output enable (global PTOE) bus signal line 163 that can be shared by the macrocells 104A–104Z. The AND array 200 comprises a plurality of inverted/non-inverted input ports, such as a first port 206A, and a plurality of product term circuits 208A–208Z.

Each product term circuit 208 sums one or more inverted and/or non-inverted input signals from the ports 206A–206Z according to a particular product term (PT). Each product term circuit 208 outputs a PT to a demultiplexer 210, which outputs the PT to a 6-input OR gate 212, a 5-input OR gate 214 and/or a macrocell 104.

Each macrocell 104 in FIG. 2A has a PTSA input line 218, a PTSA bypass line 220, a PT output enable (PTOE) line 222, a PT clock line 224, a PT reset line 226, a PT preset line 228, a shared PT clock enable line 230, a shared PT clock line 232, a shared PT reset line 234, a global PTOE line 236, a first output line 238 and a second output line 240.

RCSF Mode

Figures 2, 2A, 3:
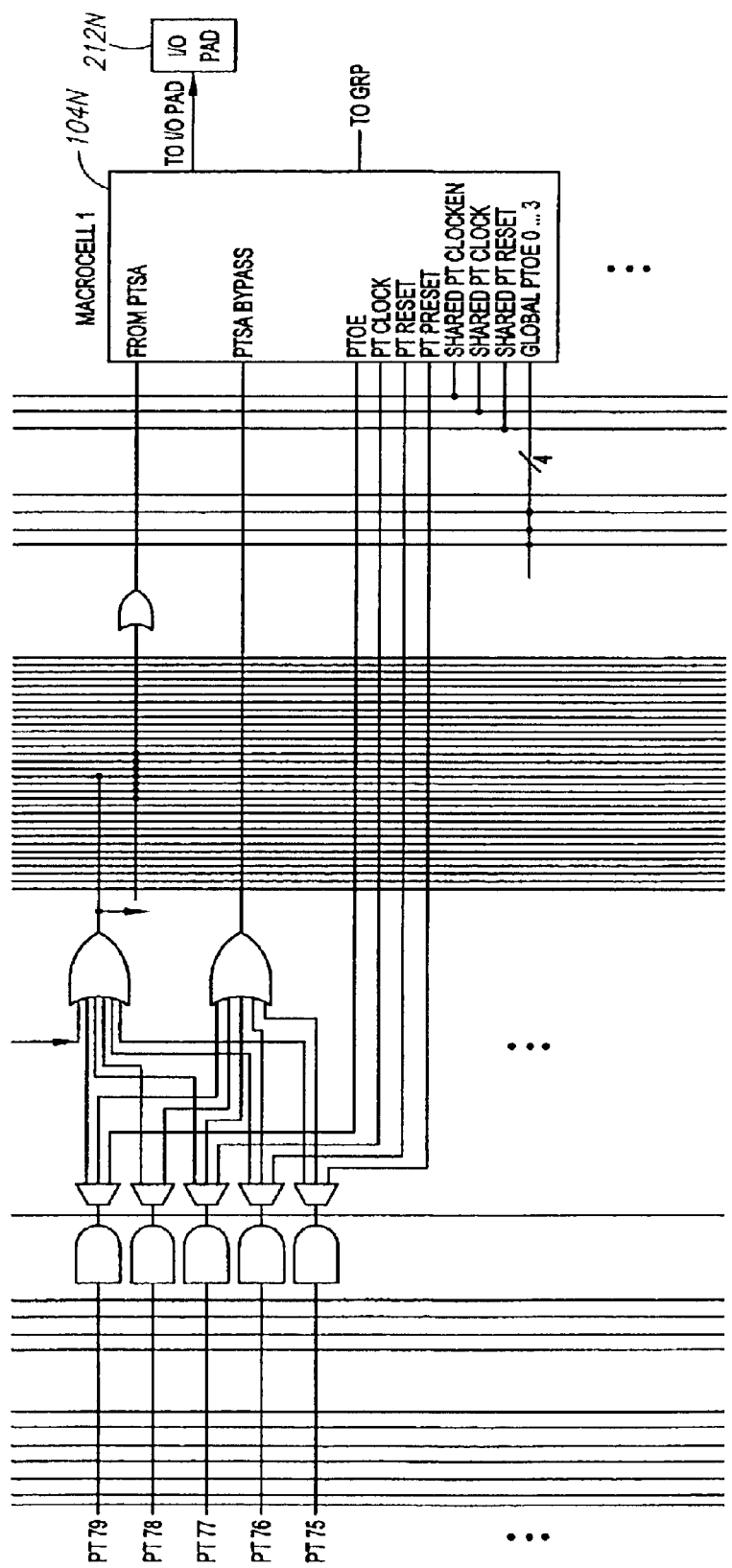
Figures 2, 2A, 3, 4:
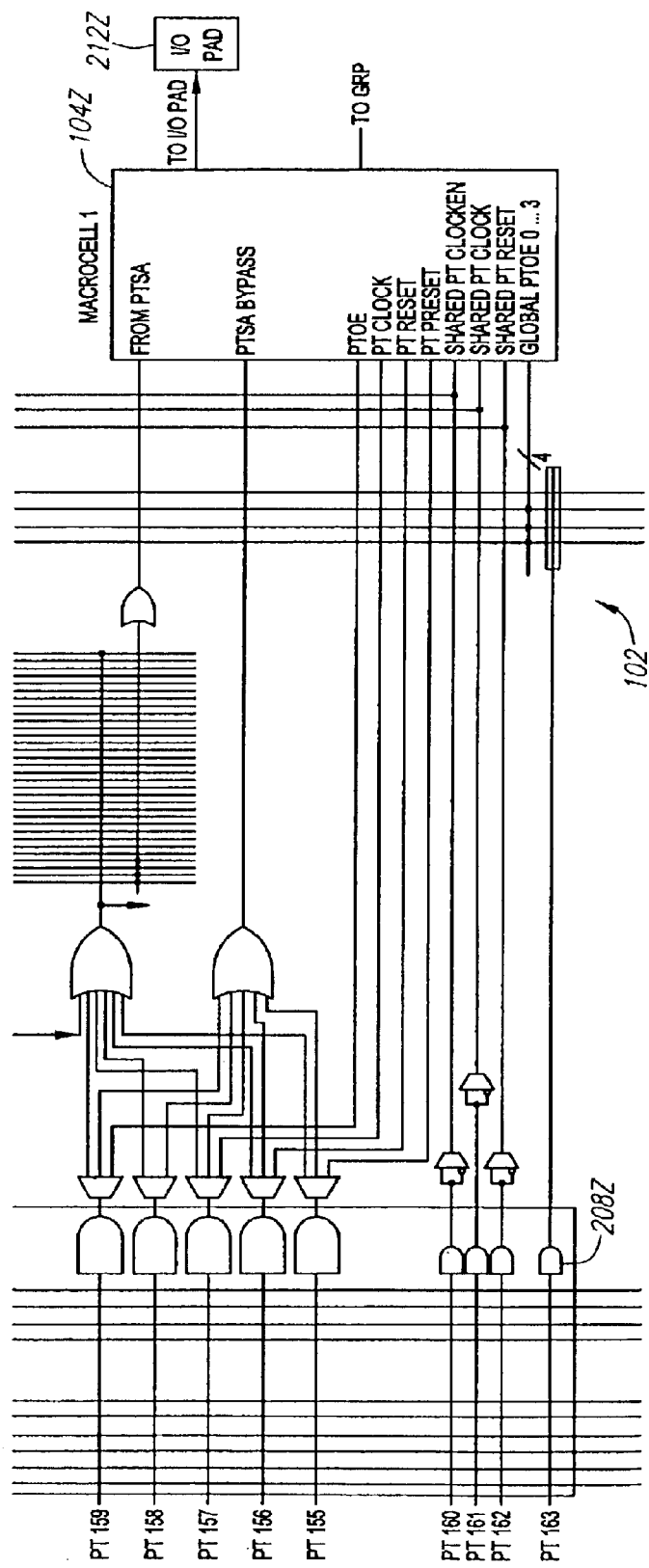
Figure 2B:
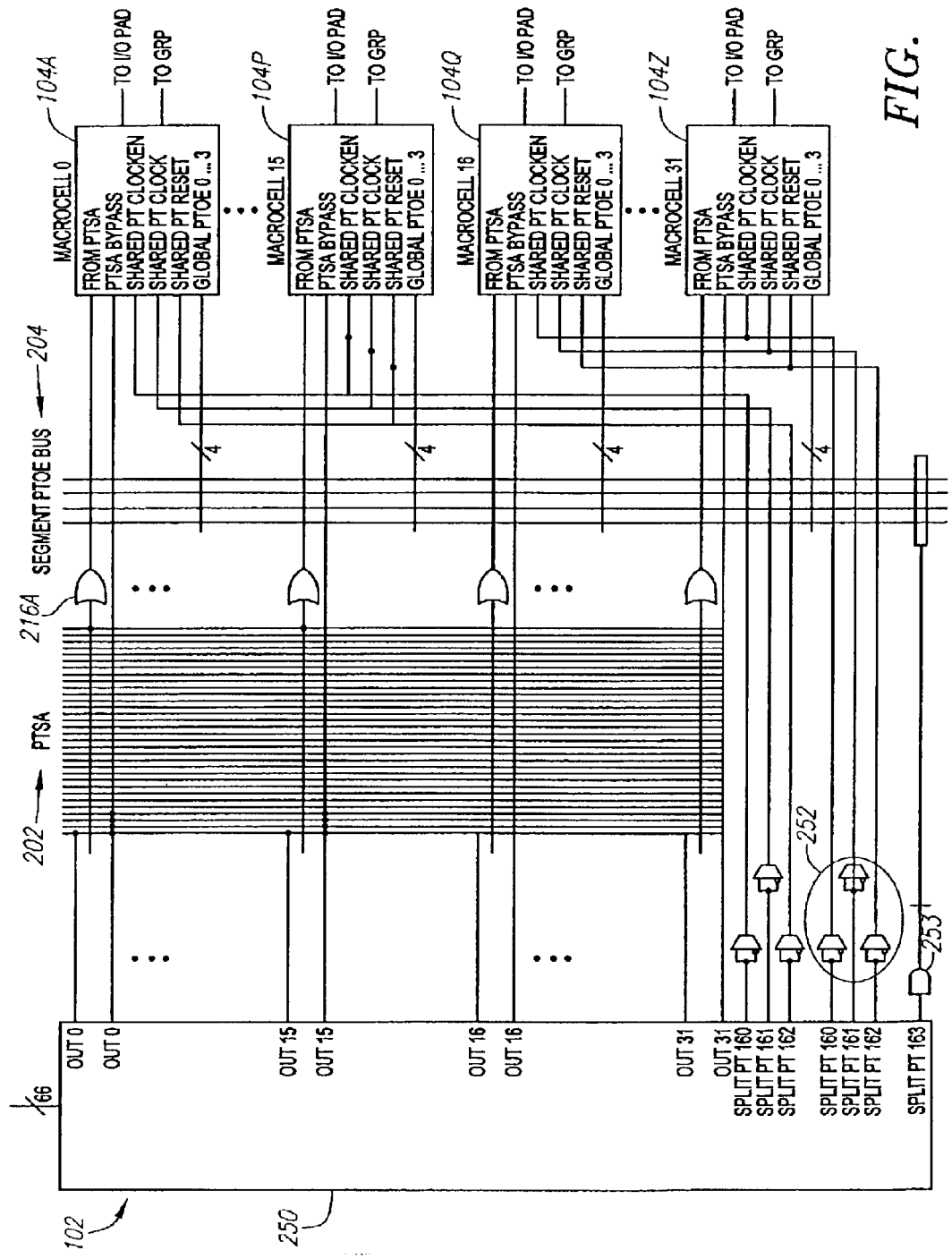
FIG. 2B illustrates one embodiment of a GLB of FIG. 1A configured in a RAM, ROM, CAM, switch and/or FIFO mode (collectively called a RCSF mode).

FIG. 2B illustrates one embodiment of a GLB 102 of FIG. 1A configured in a RAM, ROM, CAM, switch and/or FIFO mode (collectively called a RCSF mode). The GLB 102 in FIG. 2B comprises 32 macrocells 104A–104Z (for the sake of simplicity, 104A–104Z will refer to 32 macrocells), a RCSF AND array and control logic unit 250, a PTSA 202, a segment routing bus 204 and a plurality of variable-input OR gates, such as the OR gate 216A. The RCSF AND array and control logic unit 250 comprises the AND array 200 of FIG. 2A and RCSF control logic, which is described below with reference to FIGS. 12–18. The PTs 160–162 may be configured as AND PTs in single-port RAM, ROM, CAM, switch and FIFO modes.

Dual-Port RAM Mode

Figure 2C:
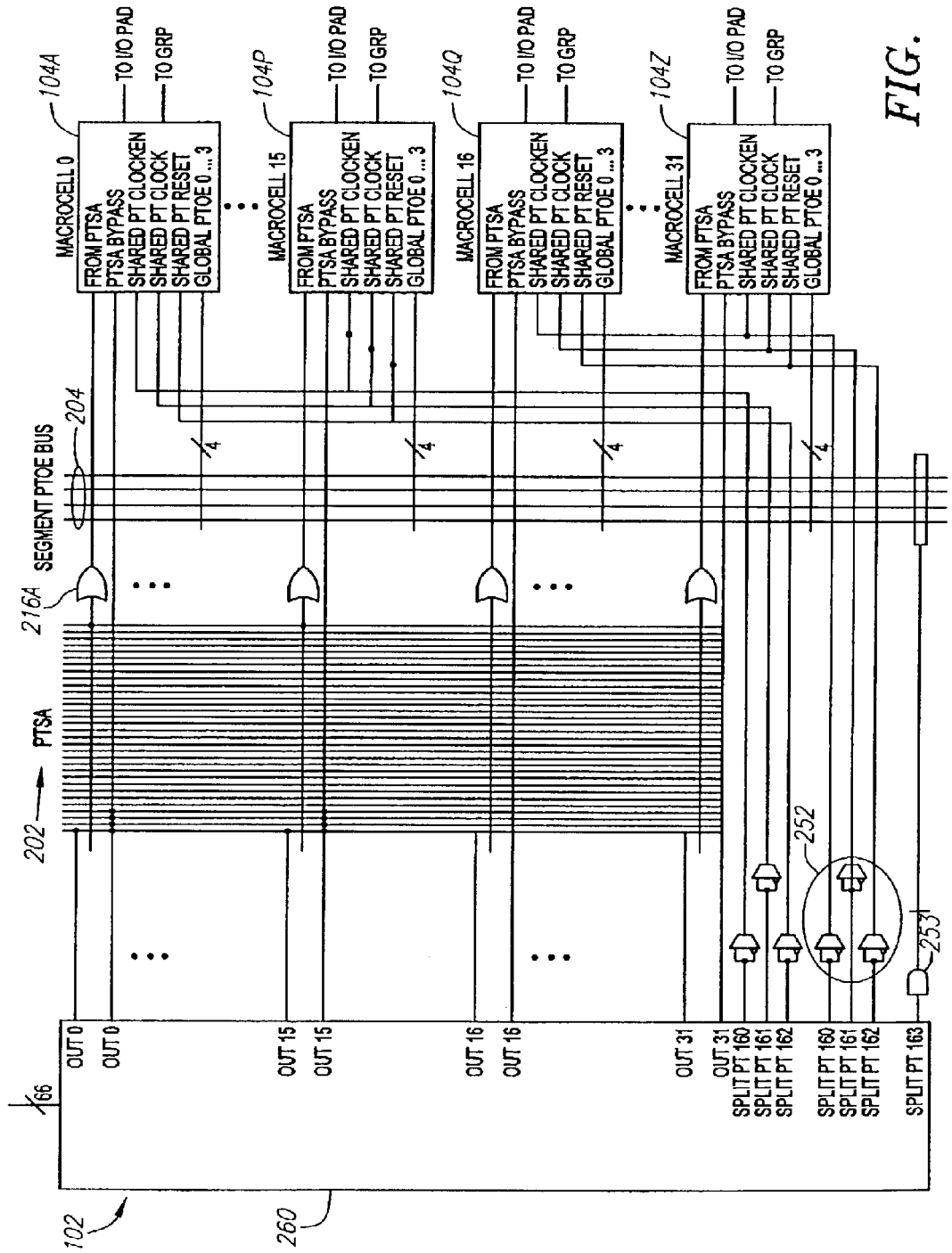
FIG. 2C illustrates one embodiment of a GLB of FIG. 1A configured in a dual-port memory mode.
Figure 3:
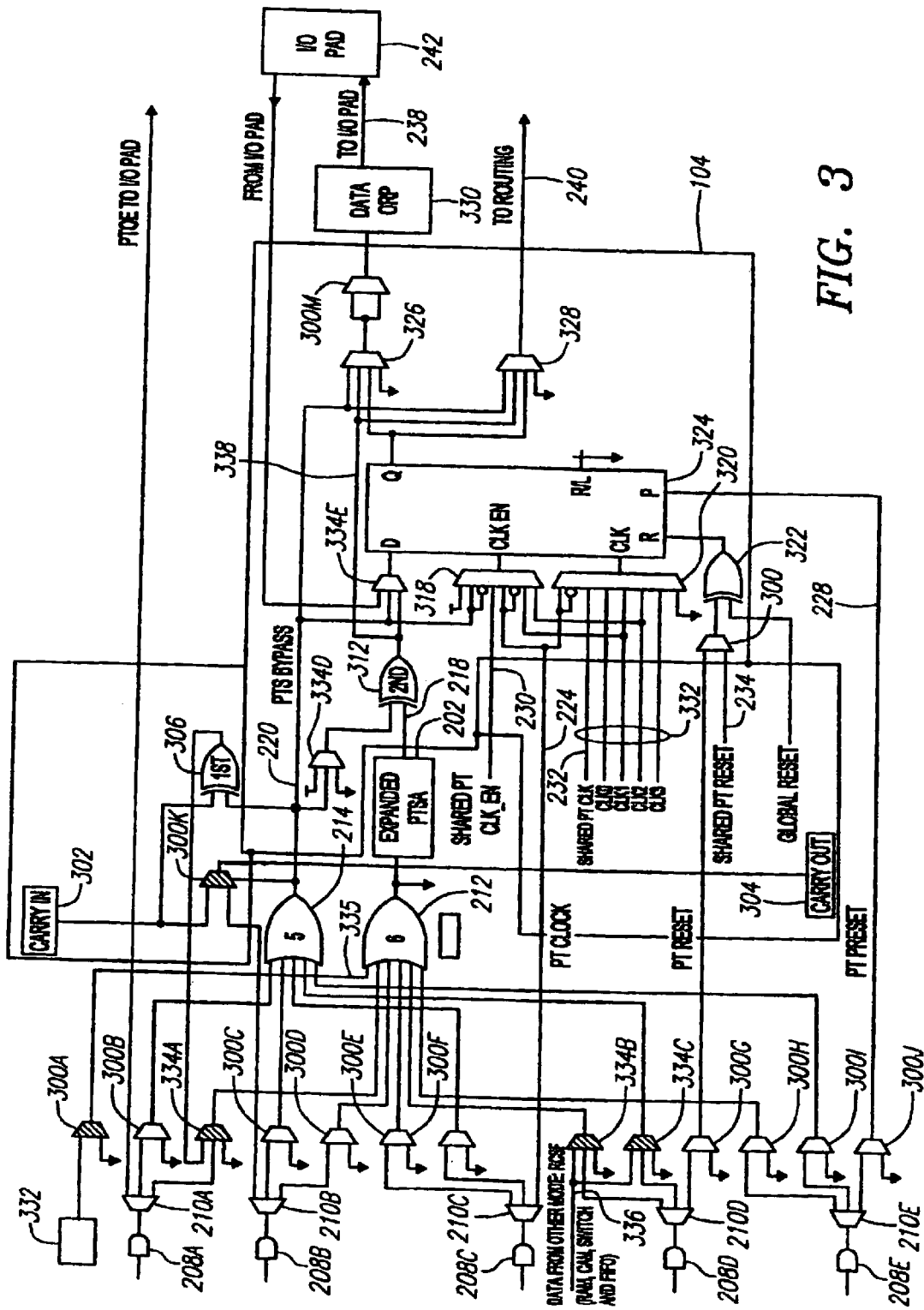

FIG. 2C illustrates one embodiment of a GLB 102 of FIG. 1A configured in a dual-port memory mode. The GLB 102 in FIG. 2C comprises 32 macrocells 104A–104Z (for the sake of simplicity, 104A–104Z will refer to 32 macrocells), a dual-port RAM AND array and control logic unit 260, a product term sharing array 202, a segment routing bus 204 and a plurality of variable-input OR gates, such as the OR gate 216A. The dual-port RAM AND array and control logic unit 260 comprises the AND array 200 of FIG. 2A and dual-port RAM control logic, which is described below with reference to FIGS. 12 and 14–16. The PTs 160–162 route inputs in dual-port SRAM (static random access memory) mode. In dual-port SRAM mode, the CLOCK, CLOCK ENABLE and reset PT lines are split into two lines with each set of lines driving 16 macrocells.

Macrocell

FIG. 3 illustrates one embodiment of a macrocell 104 of FIG. 1B and surrounding logic. A 'macrocell' 104 may comprise some or all of the components shown in FIG. 3. In one configuration, the macrocell 104 in FIG. 3 comprises a CARRY IN line 302, a CARRY OUT line 304, a XOR gate 306, 3-input MUXes 334A, 334D, an XOR gate 312, 2-input MUXes 300L, 300K a second 3-input MUX 334E, a first 8-input MUX 318, a second 8-input MUX 320, an OR gate 322, a D register/latch 324, a first 4-input MUX 326, a second 4-input MUX 328 and a second 2-input MUX 300M. One or more of these MUXes and XOR gates may be located outside of the 'macrocell.' The macrocell 104 is coupled to a data output routing pool (ORP) 330.

In one configuration, the surrounding logic in FIG. 3 comprises an input line 332 from other macrocells 104 (FIGS. 2A–2C), an array of product term circuits 208A–208E, demultiplexers 210A–210E, 2-input multiplexers (MUXes) 300A–300J, 3-input MUXes 334B–334C, a data input line 336, a 5-input OR gate 214, a 6-input OR gate 212, an expanded product term sharing array (PTSA) 202 and. In one configuration, the PTSA 202 includes an OR gate 216 of FIG. 2A.

In addition to the input lines shown in FIG. 2A and described above, the macrocell 104 of FIG. 3 has four clock lines 332 carrying CLK0, CLK1, CLK2, CLK3 signals respectively. In one embodiment, a CLK ENABLE signal may be generated from the CLK1 and CLK2 signals, while CLK0 and CLK3 signals could be phase-locked loop (PLL) clock signals.

The D register/latch 324 can be programmed to be a register or a latch. Outputs from the macrocell 104 are either registered (outputs from the D register 324) or combinatorial (outputs from the PTSA bypass line 220 or bypass line 338). The macrocell 104 of FIG. 3 has two independent output MUXes 326, 328. The first output MUX 326 drives an output side of an I/O buffer or pad 242 via output line 238. The second output MUX 328 drives the GRP 110 (FIG. 1A) via output line 240. Thus, the outputs on lines 238 and 240 may be different.

The macrocell 104 of FIG. 3 has its own set of five PTs from the five product term circuits 208A–208E, which drives the 5-input OR gate 214. The output of the 5-input OR gate 214 bypasses the PTSA 202 via line 220 and drives the macrocell 104. The five-input OR gate 214 may output a signal to the multiplexer 334D, which outputs a signal to the XOR gate 312 for complex logic functions. In one embodiment, four out of five PTs associated with each macrocell 104 are used for product term logic, product term control (clock, preset, reset, output enable) or both logic and control simultaneously. Each PT may be used for both logic and control simultaneously. The remaining PT out of the five PTs may be used for only logic.

Carry Generation and Carry Propagation

Any logic function may be represented by Boolean equations. A Boolean equation may be expressed as several product terms (PTs) OR'ed together. Many frequently-used functions are arithmetic in nature. The most significant bit (MSB) of an arithmetic output depends on the evaluation of the lower order bits. Implementing a MSB function in a conventional CPLD requires either wide-OR functions, or cascaded logic into multi-level logic units. A wide-OR function requires logic resources. Also, a conventional CPLD is not efficient with wide-OR functions because the CPLD has a limited total number of available product terms. Cascaded logic degrades performance (long process time because of multiple levels of logic).

According to the present invention, a flexible CPLD macrocell 104 (FIG. 3) has embedded (1) carry generation and propagation logic and (2) sum generation logic that are configured to implement functions that are not efficient for a conventional CPLD to implement. The flexible CPLD macrocell architecture greatly reduces the number of product terms required to implement many commonly used functions and enhances CPLD functionality and performance.

In FIG. 3, the macrocell 104 comprises programmable carry generation and propagation logic components, such as the CARRY IN line 302, MUX 300K, CARRY OUT line 304, OR gate 214, MUX 210B, and product term circuit 208B. The CARRY IN line 302 and CARRY OUT line 304 are coupled to other macrocells. The programmable carry generation and propagation logic components 208B, 210B, 214, 300K, 302, 304 provide a fast path for lower order bits to be evaluated. Therefore, the macrocell 104 does not require wide-OR functions or cascaded logic. The programmable carry generation and propagation logic components 208B, 210B, 214, 300K, 302, 304 can implement adder, subtractor, and comparator (greater, less, greater_or_equal, less_or_equal, or equal) functions.

The Carry In line/signal 302 and XOR gate 306, coupled with OR gate 214 and OR gate 212, of the macrocell 104 in FIG. 3 are configured to generate functions that utilize carry inputs, such as SUM bits for adder or subtractor functions.

Product Term Sharing

The expanded PTSA 202 in FIG. 3 represents the PTSA 202 and an OR gate 216 in FIG. 2. The expanded PTSA 202 in FIG. 3 allows each macrocell 104 to share PTs with other macrocells 104A–104Z (FIG. 2A). In one embodiment, the macrocell 104 of FIG. 3 may share up to 35 PTs with six other macrocells 104A–104Z (FIG. 2A). For example, PTs that are not used by a particular macrocell 104 may be combined by the 6-input OR gate 212 and routed via the PTSA 202 to neighboring macrocells 104. As another example, unused product terms associated with other macrocells 104 can be re-used by one macrocell 104 and expand the width of that macrocell's OR function.

For example, a macrocell 104D (not shown) may use its own five PTs, share 15 PTs from three macrocells 104A–104C (FIG. 2A) on one side of the macrocell 104D, and share 15 PTs from three macrocells 104E–104G (not shown) on another side of the macrocell 104D via the expanded PTSA 202. The PTSA 202 wraps around at the top and the bottom of the GLB 102 (FIG. 2A) such that the first macrocell 104A can share PTs with macrocells 104B–104D and macrocells 104X–104Z. In other embodiments, the macrocells 104 may be configured to share less than 35 or more than 35 PTs.

Each macrocell 104 does not have to share PTs from three macrocells 104 of each side. For example, each macrocell 104 may share PTs in patterns of every other macrocell 104 or a random pattern to maximize programmability.

Product Term Chaining

The 6-input OR gate 212 in FIG. 3 drives the expanded PTSA 202 and allows PTs to be expanded into a 'chain.' For example, the sixth input line 335 of the 6-input OR gate 212 'chains' PTs by receiving a sixth input 332 from an N-7 macrocell (skips 6 macrocells). The chaining may wrap around such that macrocell 104A (FIG. 2A) receives an input from macrocell 104Z.

The sixth input line 335 of the 6-input OR gate 212 does not have to be connected to an N-7 macrocell. The sixth input line 335 of the 6-input OR gate 212 may be connected to any FT that is not accessible to a macrocell 104 through the PTSA 202. For example, if the product term sharing array 202 is arranged to share product terms among every other macrocell 104, each macrocell 104 may be chained to one or more N-1 macrocells.

Cascading Product Terms

The device 100 in FIG. 1B can accommodate very wide input functions. Each GLB 102 in FIG. 1B can implement functions up to 68 inputs wide. By 'cascading' two adjacent GLBs, such as GLBs 102B and 102C, the input width of each PT can be doubled, and the two GLBs can implement functions up to 136 (68+68) inputs. FIG. 1B shows at least four GLBs, such as the GLBs 102A–102D, that can be cascaded. The number of GLBs that can be cascaded depends on the layout of the GLBs 102 in a device 100 and whether the device 100 has single level routing (e.g., device 100 in FIG. 1B) or double-level routing (e.g., device 120 in FIG. 1C). Double-level routing (two level routing) in FIG. 1C allows more GLBs to be cascaded in groups, such as the segments 122A–122F.

Figure 4A:
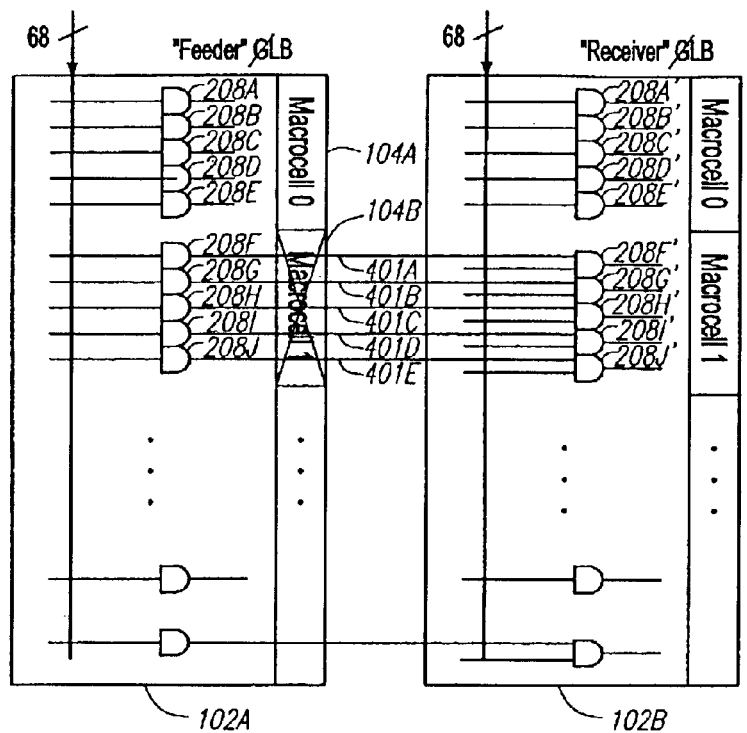
FIG. 4A illustrates one embodiment of cascading product terms (PTs) of two macrocells in two separate GLBs of FIG. 1B.

FIG. 4A illustrates one embodiment of cascading PTs of two macrocells 104B, 104B' in two separate GLBs, such as GLBs 102A and 102B of FIG. 1B. In FIG. 4A, macrocells 104A, 104A' each have its own set of 5 PTs and 68 inputs. The PTs of the second macrocell 104B in the first GLB 102A are cascaded with the PTs of the second macrocell 104B' in the second GLB 102B. Specifically, the PTs of the five product term circuits 208F–208J bypass the second macrocell 104B in the first GLB 102A and pass via lines 401A–401E into five product term circuits 208F'–208J' associated with the second macrocell 104B' in the second GLB 102B. The five product term circuits 208F'–208J' combine its own 68 inputs with the PTs from the five product term circuits 208F–208J.

The first GLB 102A (FIG. 4A) may be called a 'feeder,' and the second GLB 102B may be called a 'receiver.' The macrocell 104B does not receive its own five PTs. But the macrocell 104B can be used (1) for logic functions and borrow PTs from other macrocells through the PTSA 202 (FIG. 2A) or (2) as a input register coupled to an I/O pad 242 (FIG. 3).

The four control PTs (CLOCK, CLOCK ENABLE, RESET, GPTOE) in FIG. 2A may be cascaded individually for width expansion, where each control PT has 68 inputs, or be cascaded with the same control PT from another GLB 102.

Split AND Array w/Split Product Terms

Figure 4B:
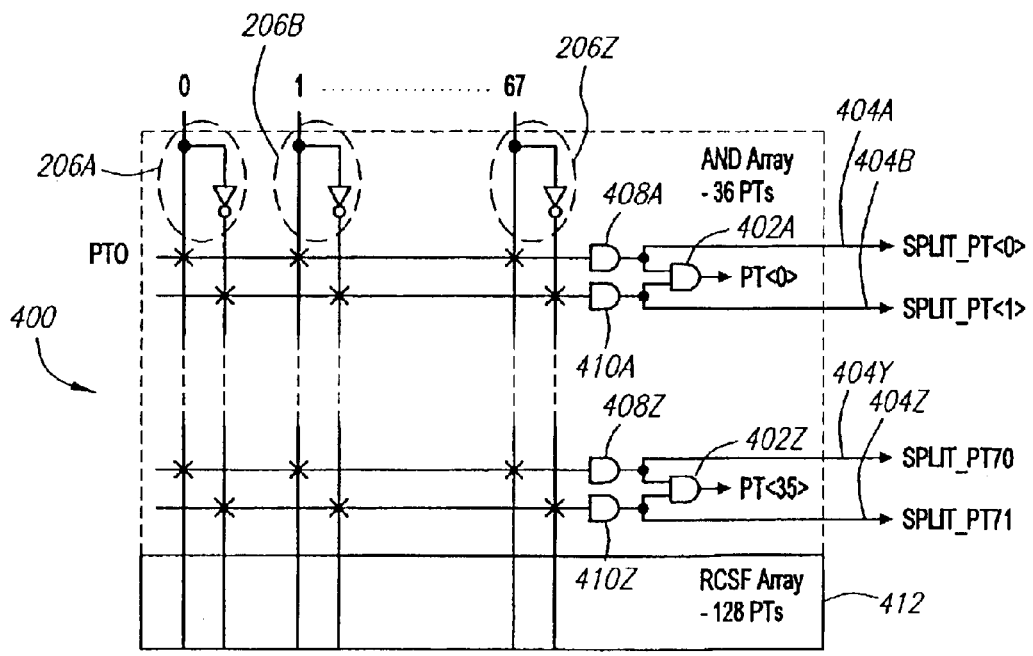
FIG. 4B illustrates one embodiment of a split-AND array in the GLB of FIG. 1A, which may be used in RCSF modes.

FIG. 4B illustrates one embodiment of a 'split-AND array' in the GLB 102 of FIG. 2B configured in RAM, ROM, CAM, switch or FIFO (RCSF) mode. The AND array 200 in FIG. 2A is 'split' in FIG. 4B into a top portion (AND array circuits 402A–402Z) and a bottom portion, which functions as a RCSF array 412. As described below, FIG. 6A and other figures also illustrate the 'split-AND array.'

In one embodiment of RCSF mode, each of the first 36 PTs (0 to 35) formed by AND array circuits 402A–402Z in FIG. 4B (same as AND array product term circuits 208 in FIG. 2A) may be 'split' by split product term circuits 408A–408Z, 410A–410Z to provide more AND array outputs 404A–404Z. For example, 2 split outputs per PT×36 PTs=72 'split outputs' or 'split product terms.'

Figure 6A:
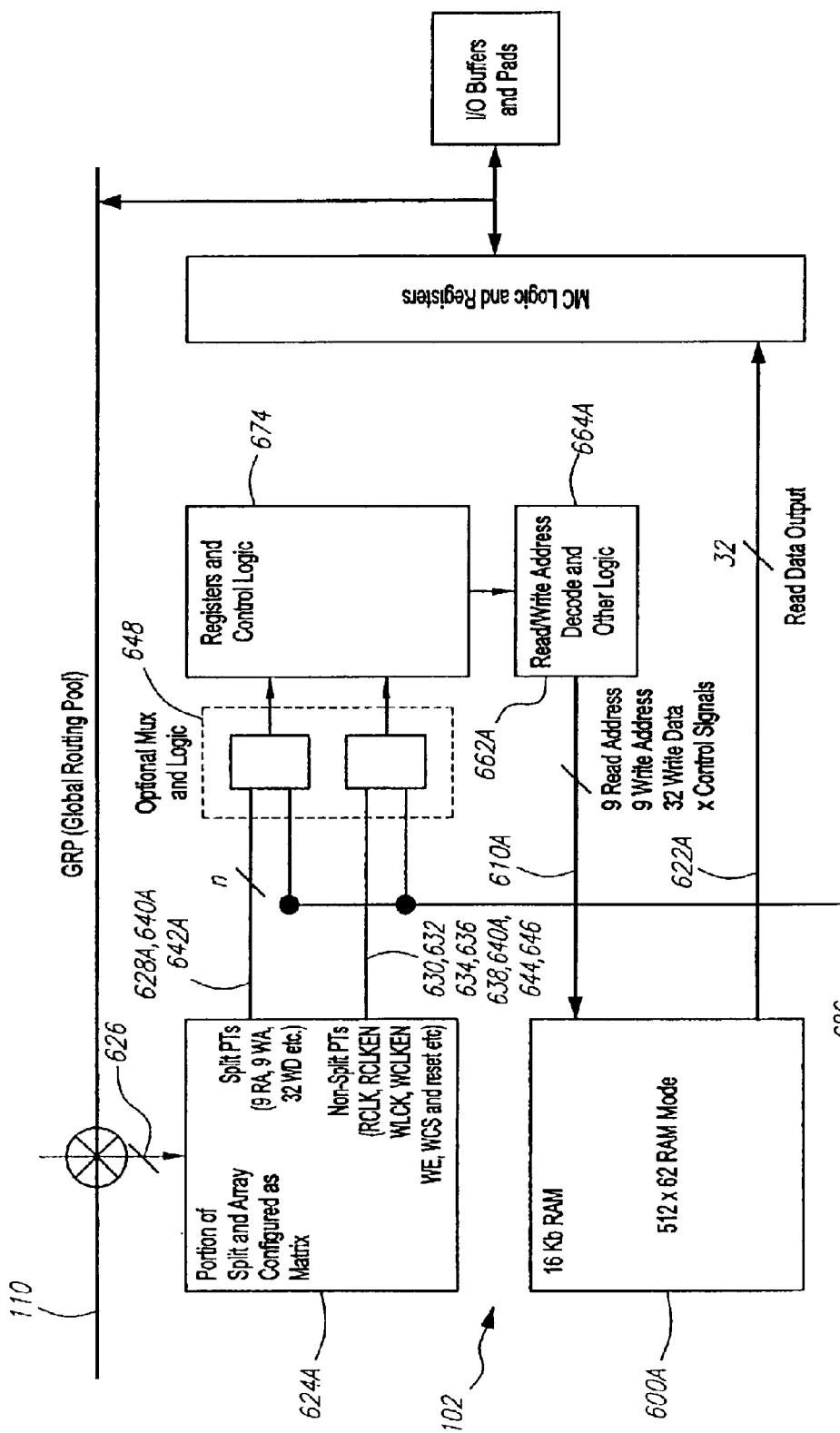
FIG. 6A illustrates one embodiment of a GLB of FIG. 1A in a RAM mode with a configurable 512×32 SRAM (static random access memory).

Splitting the AND array outputs to form 72 split outputs 404A–404Z in FIG. 4B may allow a smaller portion of the AND array 200 (FIG. 2A) to be allocated to a switch matrix 624A (i.e., input routing resource or input swapping space) in FIG. 6A and increase the number of PTs that are available for RCSF functions in the RCSF array 412 in FIG. 4B or in a RAM array 600A in FIG. 6A. Thus, the size of the RCSF array 412 (FIG. 4) and RAM array 600A (FIG. 6A) may be doubled to implement wider and deeper RCSF functions. In this embodiment, the resulting 72 split outputs 404A–404Z (FIG. 4B) used for input routing cannot act as regular AND PTs. The resulting 72 split outputs may route any 68–72 AND array inputs to RCSF control logic (e.g., multiplexers, registers and other logic in FIG. 6A or FIG. 12), as described below.

The split AND array 400 in FIG. 4B may also be used in a dual-port RAM (see FIGS. 7A, 14A, 15 and 16, which are described below), where the even split product term circuits 408A–408Z are used for port A, and the odd split product term circuits 410A–410Z are used for port B. The outputs of the odd split product term circuits 410A–410Z may be inverted to obtain functions of the 68 true (non-inverted) inputs.

Carry Ripple/Arithmetic Support

Each GLB 102 in FIG. 1A may have special support logic to support arithmetic (e.g., adder, subtractor) and comparator functions, such as implementing an n-bit adder in approximately n macrocells with a single-level general routing pool delay (plus a ripple delay through hardwired logic).

For example, the macrocell 104 in FIG. 3 and surrounding logic may implement a 1-bit adder, such as A+B+CARRYIN=SUM+CARRYOUT. The five product term circuits 208A–208E, the five DEMUXes 210A–210E, the MUXes 300B, 334A, 300F, 334C, 300I, the 5-input OR gate 214, the 6-input OR gate 212, the expanded PTSA 202, the XOR gate 306, the XOR gate 312, MUX 334A and the paths between these components may be active to implement the adder function. The second product term circuit 208B receives inputs A and B and outputs a product term of A AND B. Any of the remaining product term circuits 208A, 208C–208E may implement two product terms of ~AB and A(~B). The 5-input OR gate 214 may output P=A XOR B=~AB OR A(~B). The XOR gate 306 outputs a SUM (SUM=A XOR B XOR CIN) and may transfer the SUM to an input of the 6-input OR gate 212 via MUX 334A. The output of the 6-input OR gate 212 may be routed to the macrocell flip flop 324 or the PTSA 202.

The PTSA 202 may route SUM to flip flops 324 in different macrocells 102 (FIG. 2A) or other outputs. The CARRYOUT signal 304 (FIG. 3) is transferred to another macrocell 102 (FIG. 2A). The other macrocell 102 can transfer the CARRYOUT signal to routing pools and external logic via a line 240. The CARRYIN signal 302 (FIG. 3) comes from another macrocell 102 (FIG. 2A). Cascading between macrocells within a GLB 102 (FIG. 2A) is called 'intra-GLB carry cascading.'

A first CARRYIN signal for an adder/subtractor may be 0, 1 or an external signal. If a PT drives a CARRYIN input signal, then the CARRYIN input signal is routed through an extra macrocell 102 (FIG. 2A). The extra macrocell 102 will always 'generate' a carry equal to the CARRYIN input PT, e.g., with the output of the 5-input OR gate 214 (FIG. 3) fixed to 0. Thus, for a 16-bit adder, 16 macrocells may do the arithmetic, one macrocell may send the CARRYIN input signal, and one macrocell may route the CARRYOUT output signal to the GRP 110 (FIG. 1B).

A GLB 102 (FIG. 2A) may implement arithmetic elements of 32 bits. Multiple GLBs 102 may be cascaded together to build arithmetic elements larger than 32 bits. This is called 'inter-GLB carry cascading.' For example, a first four GLBs 102A–102D (FIG. 1B) may be cascaded to provide a first 128-bit cascade chain, and a second four GLBs 102E–102H may be cascaded to provide a second 128-bit cascade chain. The first macrocell 104A (FIG. 2A) in one GLB 102 (FIG. 1B) connects its CARRYIN input 302 (FIG. 3) to the CARRYOUT output 304 of the last macrocell 104Z (FIG. 2A) of another GLB 102 (FIG. 1B). A GLB 102 (FIG. 1B) may implement more than one carry chain at one time if an extra macrocell 104 (FIG. 2A) is used to set the carry at a designated first stage. In one configuration, the MUXes at the input and output of the GLB carry chain are combined such that the critical path passes through only one MUX.

If a macrocell 104 (FIG. 2A) is not cascaded, then the macrocell 104 may set its CARRYIN input 302 (FIG. 3) to 0 or 1. If a macrocell 104 (FIG. 2A) is not used in arithmetic mode, the CARRYIN input 302 (FIG. 3) may be fed directly into the CARRYOUT output 304 via the MUX 300K. Thus, an arithmetic chain may begin at any macrocell 104 (FIG. 2A) associated with a GLB 102.

For a device 120 (FIG. 1C) with two-level routing, a carry chain may be implemented within a segment of GLBs, such as the first segment 122A with four GLBs 124A–124D. A carry chain starts with a first GLB 124A and continues through GLBs 124B, 124C and 124D via the segment routing 126A. Alternatively, a carry chain starts with a first GLB 124A and continues through GLBs 124D, 124C and 124B via the segment routing 126A.

RAM Mode

A GLB 102 in FIG. 2B implements SRAM functions by configuring a part of the AND array 200 (FIG. 2A) as a SRAM array to store SRAM bits. The SRAM has various modes of operation, such as single I/O port SRAM (pseudo dual-port SRAM) mode with independent read and write ports, true dual-port SRAM mode with two read and write ports, and FIFO mode.

Figure 5A:
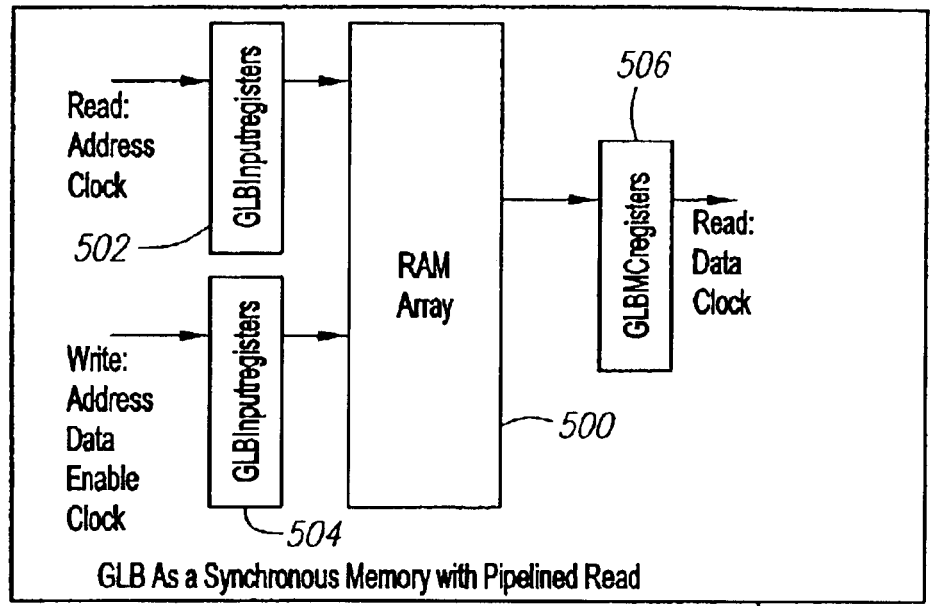
FIGS. 5A–5D illustrate embodiments of a GLB of FIG. 1A configured as a RAM.

FIGS. 5A–5D illustrate embodiments of a GLB 102 of FIG. 1A configured as a RAM. In FIG. 5A, the GLB 102 comprises an asynchronous RAM array 500, a set of GLB read address input registers 502, a set of GLB write address input registers 504 and a set of data output registers 506. In one embodiment, the inputs and outputs of the RAM array 500 are unidirectional, which provides better bandwidth for communication applications.

In one embodiment, the sets of input registers 502 and 504 comprise special registers that are not available for general logic use, while the set of output registers 506 comprises general macrocell registers that are available for general logic use. The first set of input registers 502 receives addresses and outputs the addresses to the RAM array 500 for data to be read according to a read address and read clock signals. The second set of input registers 504 receives data from an external source and outputs data to be written in the RAM array 500 according to a write address, data, write enable, and write clock signals. The set of output registers 506 receives data from the RAM array 500 and outputs the data according to a read clock signal. The first set of input registers 502 and the set of output registers 506 may used to synchronously read data from the RAM array 500. The GLB 102 in FIG. 5A has a 'pipelined' read configuration.

Figure 5B:
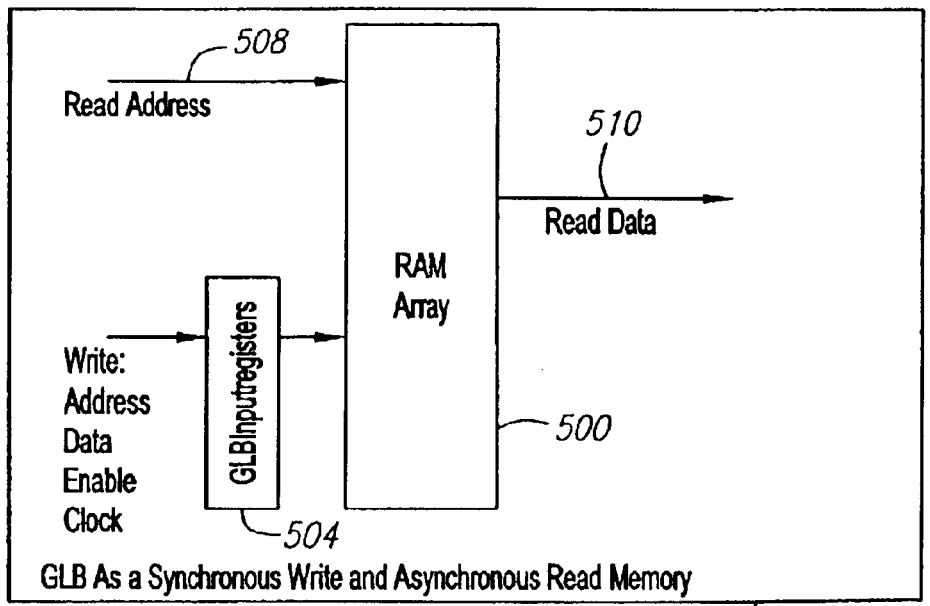
Figure 5C:
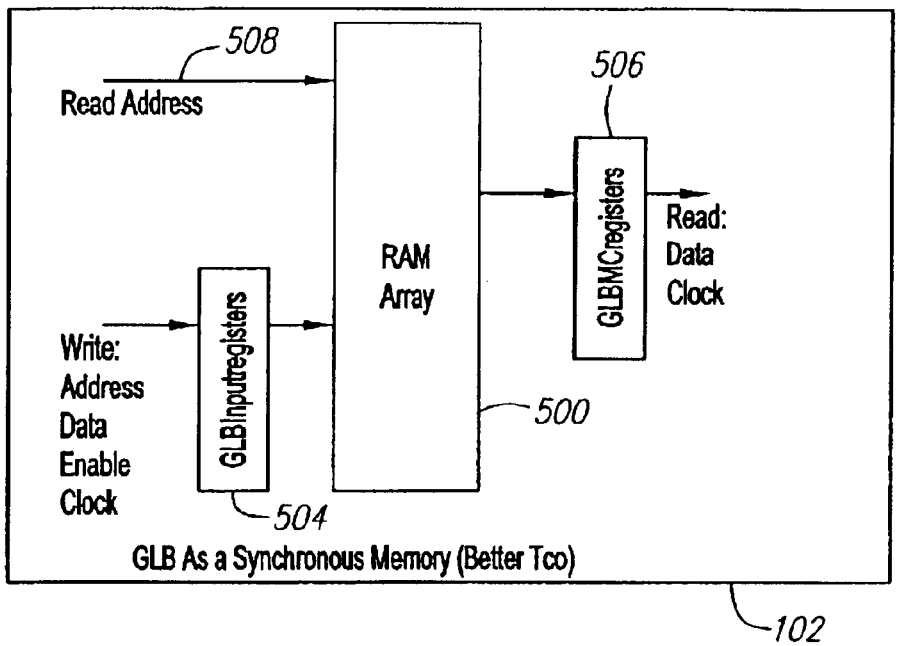
Figure 5D:
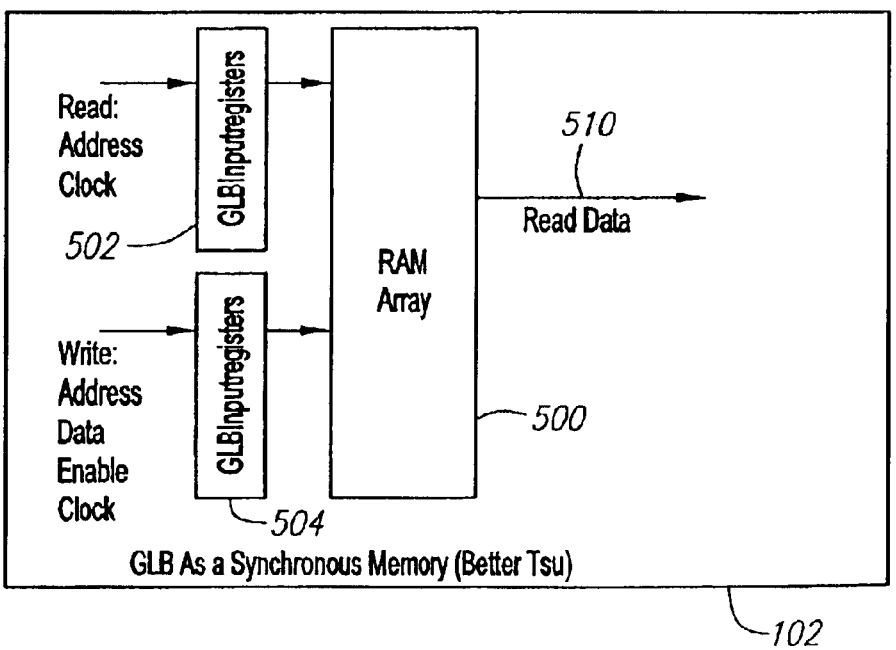

In FIG. 5B, the GLB 102 comprises an asynchronous RAM array 500 and a set of GLB write address input registers 504. In FIG. 5B, the RAM array 500 has synchronous write and asynchronous read. In FIG. 5C, the GLB 102 comprises an asynchronous RAM array 500, a set of GLB write address input registers 504 and a set of data output registers 506. In FIG. 5D, the GLB 102 comprises an asynchronous RAM array 500, a set of GLB read address input registers 502 and a set of GLB write address input registers 504. The GLB 102 in FIGS. 5C and 5D are configured for synchronous read and write. The GLB 102 in FIG. 5C is faster in read clock to output timing, while the GLB in FIG. 5D is faster in read address to read clock setup timing.

Split AND Array for Memory and Input Routing

When the GLB 102 described herein is configured to perform memory functions, the GLB 102 uses a part of the AND array 200 in FIG. 2A for signal swapping (also called input routing or switching) and another part for memory. In contrast, when the GLB 102 is configured to perform logic, the entire AND array 200 may be utilized to generate product terms. Thus, the configurable AND array 200 meets the input routing requirements of a memory, avoids increasing routing overheads when the GLB 102 is configured to perform logic, and reduces the die size of the programmable device because global routing resources may be reduced.

FIG. 6A illustrates one embodiment of a GLB 102 of FIG. 1A in a RAM mode with a configurable 512×32 SRAM 600A. The GLB 102 of FIG. 6A comprises a portion of a split AND array configured as a switch matrix 624A, a write address decoder logic 662A, a 512×32 SRAM 600A, a read address decoder logic 664A, a plurality of optional MUXes and logic 648, such as AND gates and OR gates, and a plurality of D flip flops/registers and control logic 674.

The portion of the split AND array configured as a switch matrix 624A in FIG. 6A comprises the split product term circuits 408A–408Z, 410A–410Z and product term circuits 402A–402Z discussed above with reference to FIG. 4B. The split AND array switch matrix 624A may also comprise additional logic. The split AND array switch matrix 624A receives input signals from the GRP 110 via a 68-bit input line 626 and routes signals to the other components in FIG. 6A. The split AND array switch matrix 624A may change the order of signals to a predetermined sequence before the signals are used by the decoder logic 662A, 664A and memory array 600A. In one embodiment, the split AND array switch matrix 624A routes signals according to a pre-determined configuration in software.

In FIG. 6A, the entire AND array circuit 200 (FIG. 2A) is split with some AND product term circuits 208 used for the switch matrix 624A (also called a input routing resource, an input swapping space or a local routing pool (LRP)), and other AND product term circuits 208 used for the memory array 600A. In one embodiment, the ratio of AND product term circuits 208 used for the memory array 600A compared to the AND product term circuits 208 used for the switch matrix 624A is about 3 to 1 or 4 to 1. In one embodiment, the memory array 600A comprises 128 AND product term circuits 208, and the switch matrix 624A comprises 32–36 AND product term circuits 208.

The split AND array switch matrix 624A has a read address (RA) output port 628A, a read clock (RCLK) output port 630, a read clock enable (RCLKEN) output port 632, a reset output port 634, a write clock enable (WCLKEN) output port 636, a write clock (WCLK) output port 638, a write address (WA) output port 640A, a write data (WD) output port 642A, a write enable (WE) output port 644 and a write chip select (WCS) output port 646. In one embodiment, product terms 160–163 are not split product terms and are used to implement regular AND product terms.

In another embodiment, the GLB 102 does not have a split AND array switch matrix 624A. Instead, an enhanced GRP 110 delivers input signals in proper sequence and order to the other components in FIG. 6A. In this embodiment, the memory 600A may he larger and comprise all of the product term circuits 208A–208Z in FIG. 2A.

The optional MUXes and logic 648 may provide a selection between inverted control signals and non-inverted control signals. The optional MUXes and logic 648 may provide a selection between clock signals generated by the split AND array switch matrix 624A and a global clock signal GCLK on line 686. The optional logic 648 may comprise AND gates and OR gates, for example, to perform a logical AND operation between signals WE and WCS or perform a logical OR operation between signals RESET and global reset.

The D flip flops/registers 674 may buffer some of the output signals of the split AND array switch matrix 624A. The write address decoder logic 662A passes WA, WE, WCS signals to the SRAM 600A. The read decoder logic 664A passes RA signals to the SRAM 600A. The SRAM 600A receives write data via an input line 610A from the split AND array switch matrix 624A and outputs read data via an output line 622A to a destination, such as macrocells, or an external source, such as a local routing pool or the GRP 110 (FIG. 1A).

Figure 6B:
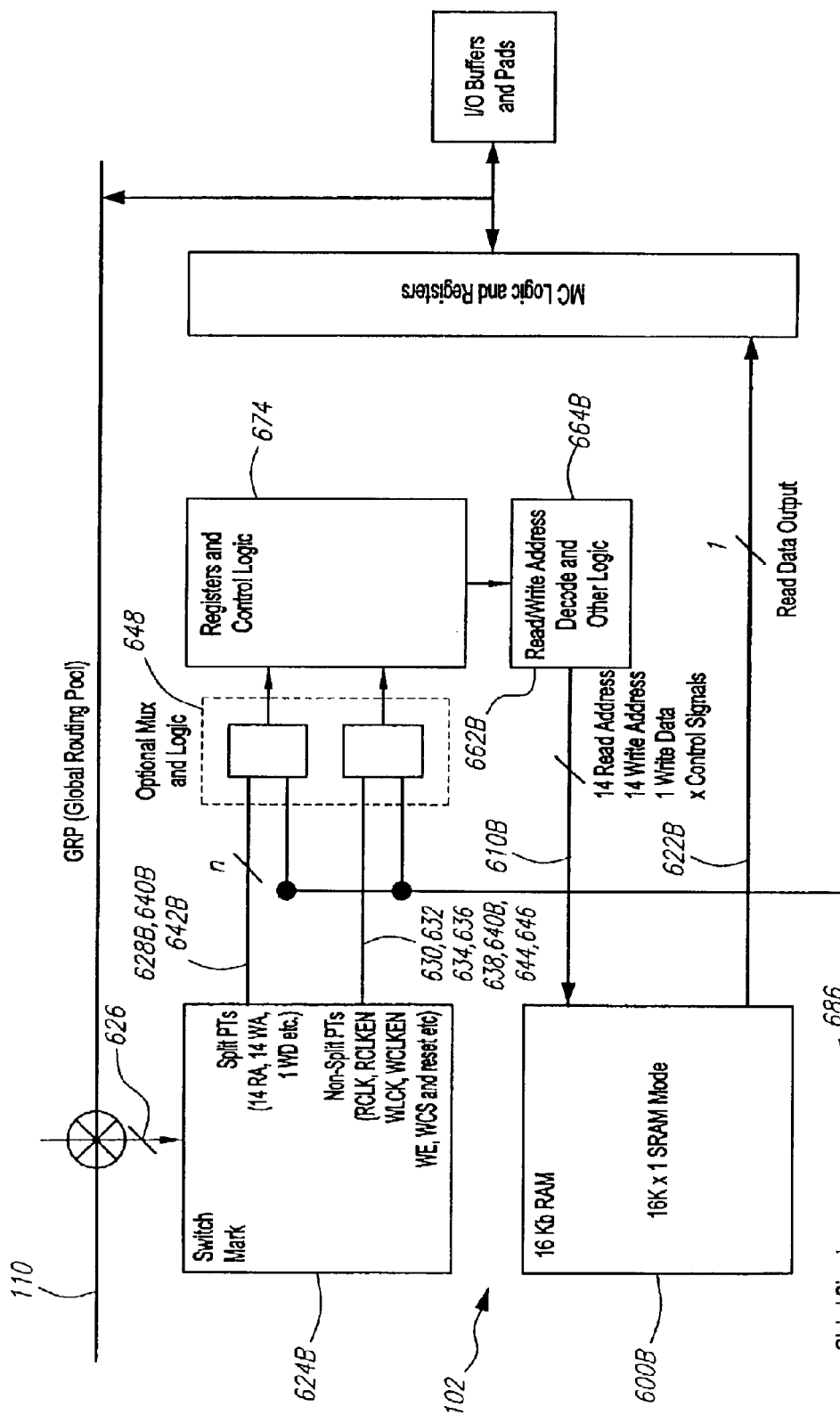
FIG. 6B illustrates one embodiment of a GLB of FIG. 1A in a RAM mode with a configurable 16384×1 SRAM.

FIG. 6B illustrates one embodiment of a GLB 102 of FIG. 1A in a RAM mode with a configurablec 16384×1 SRAM 600B. The GLB 102 of FIG. 6B comprises a portion of a split AND array configured as a switch matrix 624B, a write address decoder logic 662B, a 16384×1 SRAM 600B, a read address decoder logic 664B, a plurality of optional MUXes and logic 648, such as AND gates and OR gates, and a plurality of D flip flops and control logic 674.

The split AND array switch matrix 624B comprises the split product term circuits 408A–408Z, 410A–410Z and product term circuits 402A–402Z discussed above with reference to FIG. 4B and may comprise additional logic. The split AND array switch matrix 624B receives signals from the GRP 110 via a 68-bit input line 626. The split AND array switch matrix 624B has a read address (RA) output port 628B, a read clock (RCLK) output port 630, a read clock enable (RCLKEN) output port 632, a reset output port 634, a write clock enable (WCLKEN) output port 636, a write clock (WCLK) output port 638, a write address (WA) output port 640B, a write data (WD) output port 642B, a write enable (WE) output port 644 and a write chip select (WCS) output port 646. Product terms 160–163 are not split product terms and are used to implement regular AND product terms.

The optional MUXes and logic 648 may provide a selection between inverted control signals and non-inverted control signals. The optional MUXes and logic 648 may provide a selection between clock signals generated by the split AND array switch matrix 624B and a global clock signal GCLK on line 686. The D flip flops/registers 674 may buffer some of the output signals of the split AND array switch matrix 624B. The write address decoder logic 662B passes WA, WE and WCS signals to the SRAM 600B. The read decoder logic 664B passes RA signals to the SRAM 600B. The SRAM 600B receives write data via an input line 610B from the split AND array switch matrix 624B and outputs read data via an output line 622B to a destination, such as macrocells, or an external source, such as a local routing pool or the GRP 110 (FIG. 1A).

Figures 6C, 7C:
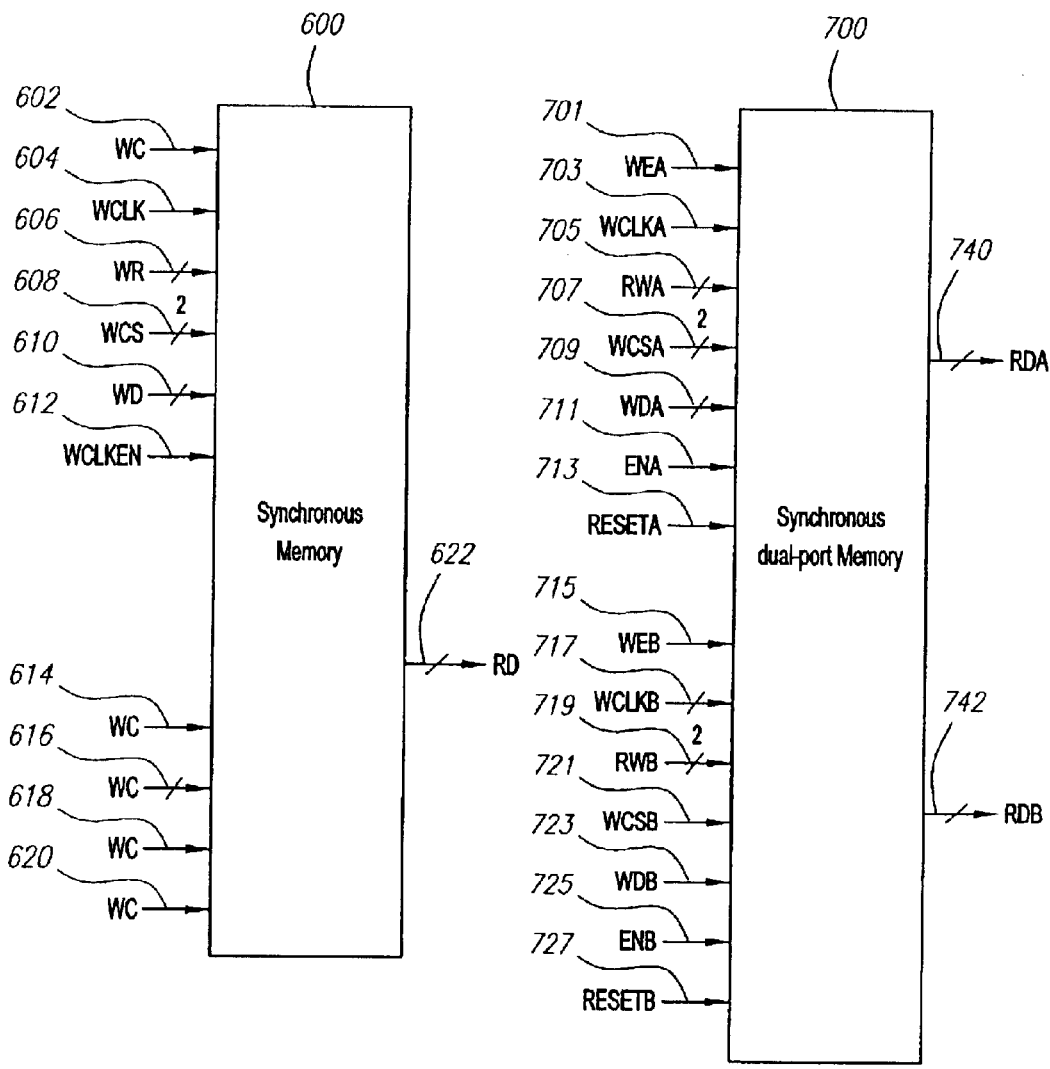
FIG. 6C illustrates one embodiment of a synchronous single-port RAM implemented in the GLB of FIGS. 6A and 6B.
FIG. 7C illustrates one embodiment of a synchronous dual-port RAM implemented in the GLB of FIGS. 7A and 7B.

FIG. 6C illustrates one embodiment of a synchronous single-port RAM 600 implemented in the GLB 102 of FIGS. 6A and 6B. The RAM 600 has a write enable (WE) input port 602, a write clock (WCLK) input port 604, a write address (WA) input port 606, a write chip select (WCS) input pot 608, a write data (WD) input port 610, a write clock enable (WCLKEN) input port 612, a read clock (RCLK) input port 614, a read address (RA) input port 616, a read clock enable (RCLKEN) input port 618, a reset input port 620 and a read data (RD) output port 622. As shown in FIG. 6C, the 'single-port' RAM 600 has independent read and write ports.

FIG. 6D illustrates six exemplifying memory configurations for the single-port RAM 600 of FIG. 6C. FIG. 6D illustrates the widths of the input and output ports 602–622 (FIG. 6C) for each memory configuration. For example, the 512×32 memory configuration has a 9-bit write address input port, a 9-bit read address input port, a 32-bit write data input port, control signal input ports, 58 total input bits and a 32-bit read data input port. Each of the control signal ports are 1-bit wide, except the write chip select, which is two bits wide to provide depth cascading.

The six memory configurations in FIG. 6D are only examples. The RAM 600 of FIG. 6C may have other depth and width configurations. For example, the 512×32 memory configuration may be configured as a 256×32 memory with 8-bit address input ports by tying one bit of the address input ports to a constant 1 or 0.

Dual-Port RAM Mode

Figure 7A:
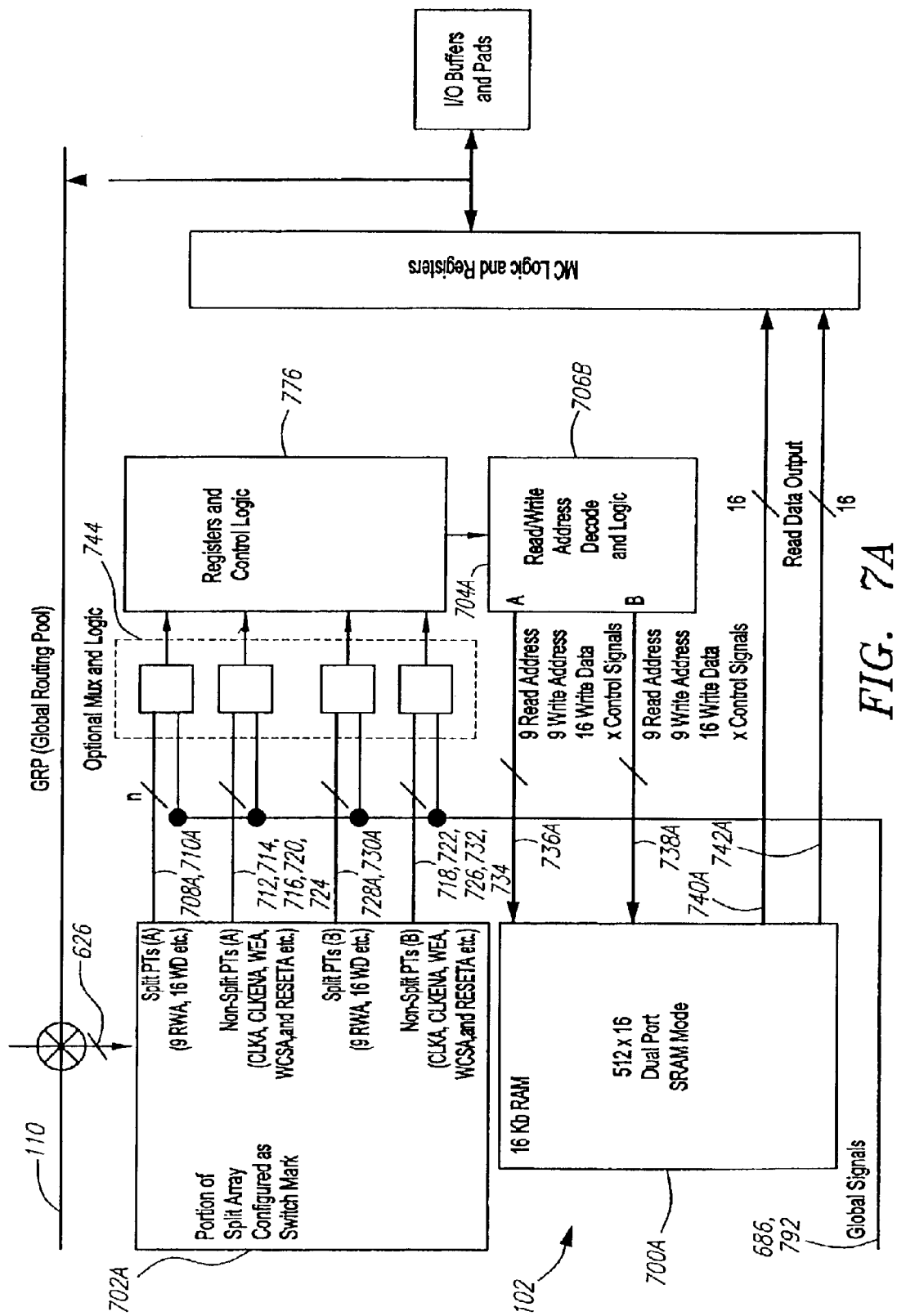
FIG. 7A illustrates one embodiment of a GLB of FIG. 1A in a dual-port RAM mode with a configurable 512×16 SRAM.

FIG. 7A illustrates one embodiment of a GLB 102 of FIG. 1A in a dual-port RAM mode with a configurable 512×16 SRAM 700A. The GLB 102 of FIG. 7A comprises a portion of a split AND array configured as a switch matrix 702A, a write address decoder logic 704A, a 512×16 SRAM 700A, a read address decoder logic 706A, a plurality of optional MUXes and logic 744, such as AND gates and OR gates, and a plurality of D flip flops/registers and control logic 776.

The split AND array switch matrix 702A in FIG. 7A comprises the split product term circuits 408A–408Z, 410A–410Z and product term circuits 402A–402Z discussed above with reference to FIG. 4B and may comprise additional logic. The split AND array switch matrix 702A receives signals from the GRP 110 via a 68-bit input line 626. The split AND array switch matrix 702A has a first read/write address (RWA) output port 708A, a first write data (WDA) output port 710A, a first write enable (WEA) output port 712, a first write chip select (WCSA) 714, a first clock CLKA output port 716, a second clock CLKB output port 718, a first enable (ENA) output port 720, a second enable (ENB) output port 722, a first output register reset RESETA output port 724, a second output register reset RESETB output port 726, a second read/write address (RWB) output port 728A, a second write data (WDA) output port 730A, a second write enable (WE) output port 732 and a second write chip select (WCS) 734. Product terms 160–162 are split to implement enable, clock and reset signals.

The optional MUXes and logic 744 may provide a selection between inverted control signals and non-inverted control signals. The optional MUXes and logic 744 may provide a selection between clock signals generated by the split AND array switch matrix 702A and a global clock signal GCLK on line 686. The optional logic 744 may comprise AND gates and OR gates, for example, to perform a logical AND operation between signals WE and WCS or perform a logical OR operation between signals RESET and global reset.

The D flip flops/registers 776 may buffer for some of the output signals of the split AND array switch matrix 702A. The D flip flops/registers 776 may be reset by a global reset signal on line 792. The write address decoder logic 704A passes control and address signals to the SRAM 700A. The read decoder logic 706A passes control and address to the SRAM 700A.

The SRAM 700A receives write data via two input lines 736A, 738A, from the split AND array switch matrix 702A and outputs read data via two output lines 740A, 742A to a destination, such as macrocells, or an external source, such as macrocell registers, a local routing pool or the GRP 110 (FIG. 1A).

FIG. 7B illustrates one embodiment of a GLB 102 of FIG. 1A in a dual-port RAM mode with a configurable 512×16 SRAM 700A. The GLB 102 of FIG. 7A comprises a portion of a split AND array configured as a switch matrix 702B, a write address decoder logic 704B, a 512×16 SRAM 700B, a read address decoder logic 706B, a plurality of optional MUXes and logic 744, such as AND gates and OR gates, and a plurality of D flip flops and control logic 776.

The split AND array switch matrix 702B in FIG. 7B comprises the split product term circuits 408A–408Z, 410A–410Z and product term circuits 402A–402Z discussed above with reference to FIG. 4B and may comprise additional logic. The split AND array switch matrix 702B receives signals from the GRP 110 via a 68-bit input line 626. The split AND array switch matrix 702B has a first read/write address (RWA) output port 708B, a first write data (WDA) output port 710B, a first write enable (WEA) output port 712, a first write chip select (WCSA) 714, a first clock CLKA output port 716, a second clock CLKB output port 718, a first enable (ENA) output port 720, a second enable (ENB) output port 722, a first output register reset RESETA output port 724, a second output register reset RESETB output port 726, a second read/write address (RWB) output port 728B, a second write data (WDB) output port 730B, a second write enable (WEB) output port 732 and a second write chip select (WCSB) 734. Product terms 160–162 are split to implement enable, clock and reset signals.

The optional MUXes and logic 744 may provide a selection between inverted control signals and non-inverted control signals. The optional MUXes and logic 774 may provide a selection between clock signals generated by the split AND array switch matrix 702A and a global clock signal GCLK on line 686. The D flip flops/registers 776 may buffer some of the output signals of the split AND array 702A. The D flip flops 776, 778, 780, 786, 788, 790 may be reset by a global reset signal on line 792. The write address decoder logic 704B passes control and address signals to the SRAM 700B. The read decoder logic 706B passes control and address signals to the SRAM 700B.

The SRAM 700B receives write data via two input lines 736B, 738B, from the split AND array switch matrix 702B and outputs read data via two output lines 740B, 742B to a destination, such as macrocells, or an external source, such as macrocell registers, a local routing pool or the GRP 110 (FIG. 1A).

Data and Address Ports with Configurable Widths

The widths of the data and address ports of the RAM arrays 600A, 600B, 700A, 700B in FIGS. 6A, 6B, 7A and 7B, or AND array portions configured as ROM, CAM, FIFO or switch as described below, may be independently configured. For example, the width of the data input port (write port) 610A of the single-port RAM array 600A in FIG. 6A may be configured independently of the width of the data output port (read port) 622A. Thus, the data input port 610A may be wider or narrower than the data output port 622A.

As another example, the RAM array 700A in FIG. 7A has two I/O ports, 'port A' and 'port B.' 'Port A' receives WDA and RWA signals and outputs RDA signals. Port B receives WDB and RWB signals and outputs RDB signals. The width of the WDA and WDB signals may be different (i.e., different bus widths). The width of the RWA and RWB signals may be different. The width of the RDA and RDB signals may be different. The read and write buses for each I/O port may have the same width because each I/O port's read and write buses share the same address lines.

If the data bus width of a read port and a write port (in either a single port RAM 600A (FIG. 6A) or a dual-port RAM 700A (FIG. 7A)) are different, each word written by a wider port (e.g., 32 bits) can be read as successive multiple words by a narrower port (e.g., 8 bits). Thus, the addressing should ensure that the RAM address locations follow a certain logical order. For example, a 32-bit word written by a 32-bit port (port A) may be read by an 8-bit port (port B) as four consecutive words. Appropriate addressing may be achieved if each port's addressed word (from most significant bit (MSB) to least significant bit (LSB)) maps to the physical RAM bits (assuming the physical RAM bits are ordered linearly from 0 to 16,383 for example) according to the following equations:

$$MSB = (\text{current\_address} + 1) \times \text{port\_width} - 1$$

$$LSB = \text{current\_address} \times \text{port\_width}$$

Using the example above, if port A (total addresses: 0 to 511) writes a 32-bit word at an arbitrary address location 88, then the MSB of that word goes to the physical RAM bit location (88+1)×32=2847, while the LSB of the word goes to location 88×32=2816. The bits between the MSB and LSB go between locations 2816 and 2847. Port B (total addresses: 0 to 2047) would read four consecutive 8-bit words from locations 88×4+0=352, 88×4+1=353, 88×4+2=353, 88×4+3=354, 88×4+4=355, and receive the same data as written by port A. The least significant 8 bits of port A map to the 8-bit word at location 88×4=352, while the most significant 8-bits map to the 8-bit word at 88×4+3=355. The logical to physical conversion equation above shows that these four words fall on appropriate physical RAM bit locations. For example, port B's location 352's MSB is at physical RAM bit location (352+1)×8=2824, while LSB is at location 2816. These locations represent the least significant 8-bits of port A's 32-bit word at location 88. For a dual-port RAM mode, the total SRAM capacity is cut in half, and there are half as many words for each data bus width.

FIG. 7C illustrates one embodiment of synchronous dual-port RAM 700 implemented in the GLB 102 of FIGS. 7A and 7B. The RAM 700 has a first set of ports for I/O port 'A' and a second set of ports for I/O port 'B.' The first set comprises a write enable (WEA) input port 701, a write clock (WCLKA) input port 703, a read/write address (RWA) input port 705, a write chip select (WCSA) input pot 707, a write data (WDA) input port 709, an enable input port (ENA) 711 and a reset A input port 713.

The second set of ports comprises a write enable (WEB) input port 715, a write clock (WCLKAB) input port 717, a read/write address (RWB) input port 719, a write chip select (WCSB) input pot 721, a write data (WDB) input port 723, an enable input port (ENB) 725 and a reset B input port 727. As shown in FIG. 7C, the 'dual-port' RAM 700 has a first set of independent read and write ports and a second set of independent read and write ports.

FIG. 7D illustrates five exemplifying memory configurations for the dual-port RAM 700 of FIG. 7C. The five memory configurations in FIG. 7D are only examples. The RAM 700 of FIG. 7C may have other depth and width configurations.

FIGS. 7E–7L illustrate exemplifying signal timing diagrams and timing parameters for the dual-port RAM 700 of FIG. 7C.

ROM Mode

The GLB 102 described herein may be configured as a read only memory (ROM) by implementing a lock-in bit to prevent write access. The GLB 102 acting as a ROM may be loaded with initial configuration data upon start-up, which cannot be altered later.

CAM Mode

As described above, a GLB 102 of FIG. 1A may be configured as a CAM. In general, a content addressable memory (CAM) receives input data and outputs one or more addresses of location(s) that match the input data. The CAM has various operations, such as write and read. A write operation may also be called an update. A read operation may also be called a compare.

Figure 8A:
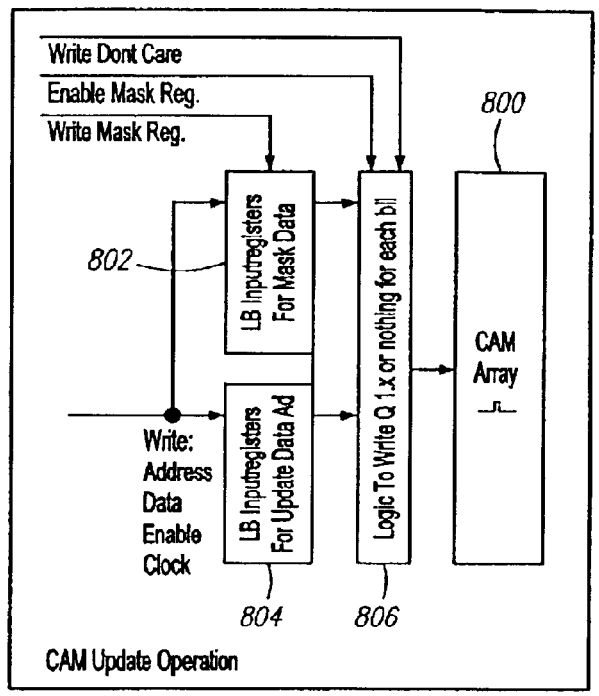
FIG. 8A illustrates one embodiment of a CAM array, two sets of input registers and control logic within the GLB of FIG. 1A in an update mode.

FIG. 8A illustrates one embodiment of a CAM array 800, two sets of input registers 802, 804 and control logic 806 within the GLB 102 of FIG. 1A in an update mode. The two sets of input registers 802, 804 receive address, data, enable and clock signals from an external source. The first set of input registers 802 stores mask data when the first set of registers 802 receives a write mask register signal. The second set of input registers 804 stores data and addresses. The control logic 806 receives a WRITE DON'T CARE signal and an ENABLE MASK REGISTER signal from external logic.

The control logic 806 in FIG. 8A writes a 1, 0, 'DON'T CARE' (symbolized as 'X') or 'DON'T WRITE' for each bit into the CAM array 800, as specified by the addresses stored in the second set of input registers 804. For each bit, a data input bit from the second set of register 804 and a mask register bit from the first set of registers 802 together determine the data to be written into the CAM array 800.

Figure 8C:
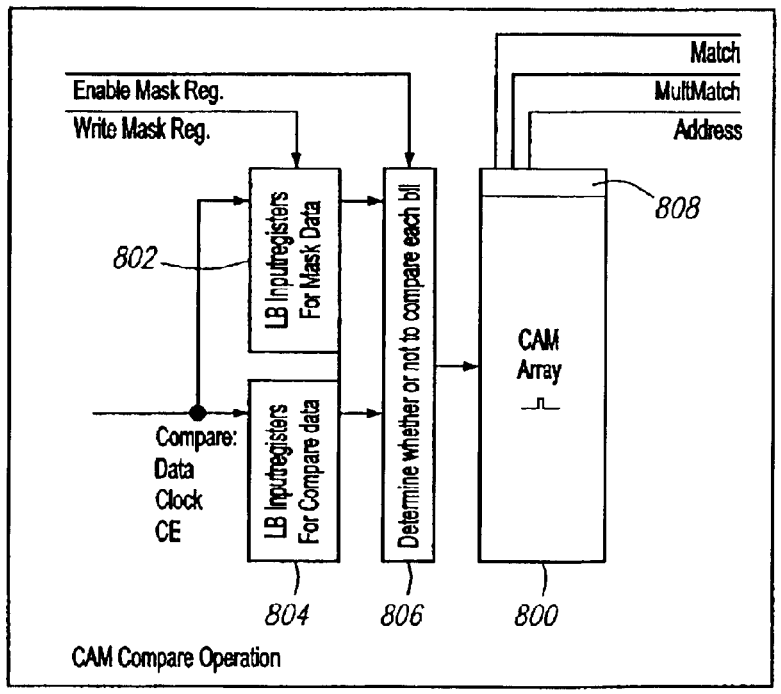
FIG. 8C illustrates one embodiment of a CAM array with a priority encoder, two sets of input registers and control logic within the GLB of FIG. 1A in a compare mode.
Figures 8B, 8D, 8G:
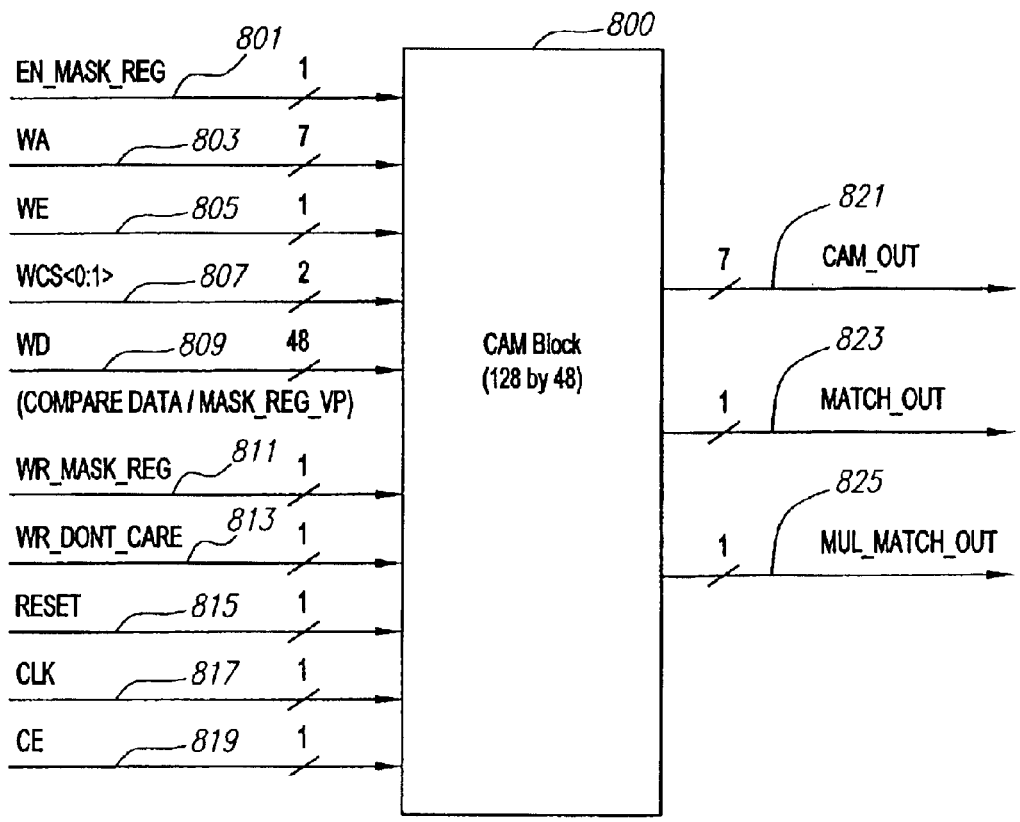
FIG. 8B illustrates exemplifying signal values for the CAM array and corresponding logic of FIG. 8A in an update mode.
FIG. 8D illustrates exemplifying signal values for the CAM array and corresponding logic of FIG. 8C in a read/compare mode.
FIG. 8G illustrates one embodiment of a CAM array implemented in the GLB of FIG. 8F.

FIG. 8B illustrates exemplifying signal values for the CAM array 800 and corresponding logic 802, 804, 806 of FIG. 8A in an update mode. In FIG. 8B, if an enable mask register EN_MASK_REG signal is 0, the control logic 806 (FIG. 8A) writes data from the second set of input registers 804 to the CAM array 800. If the EN_MASK_REG signal is 1 and the mask register is 0, the control logic 806 (FIG. 8A) writes data from the second set of input registers 804 to the CAM array 800. If the EN_MASK_REG signal is 1, the write DON'T CARE (WR_DONT_CARE) signal is 0, and the mask register is 1, the control logic 806 (FIG. 8A) does not write or keeps the previously stored bit. If the EN_MASK_REG signal is 1, the write DON'T CARE (WR_DONT_CARE) signal is 1, and the mask register is 1, the control logic 806 (FIG. 8A) writes a 'DON'T CARE.' In one embodiment, the write operation is synchronous to a clock signal.

FIG. 8C illustrates one embodiment of a CAM array 800 with a priority encoder 808, two sets of input registers 802, 804 and control logic 806 within the GLB 102 of FIG. 1A in a compare mode. The two sets of input registers 802, 804 receive data, clock and clock enable signals from an external source. The first set of input registers 802 stores mask data when the first set of registers 802 receives a write mask register signal. The second set of input registers 804 stores data and addresses. The control logic 806 receives an enable mask register signal from external logic. The control logic 806 determines whether or not to compare each bit. In read/compare mode, the control logic 806 inputs data into the CAM array 800, and the CAM array 800 outputs priority encoded address bits, a match bit and a multi-match bit.

FIG. 8D illustrates exemplifying signal values for the CAM array 800 and corresponding logic 802, 804, 806 of FIG. 8C in a read/compare mode. If the EN_MASK_REG signal is 0, the compared value is a CAM data bit from the CAM array 800 (FIG. 8C). If the EN_MASK_REG signal is 1 and the mask register is 0, then the compared value is a CAM data bit from the CAM array 800 (FIG. 8C). If the EN_MASK_REG signal is 1 and the mask register is 1, then the compared value is a DON'T CARE.

Figure 8E:
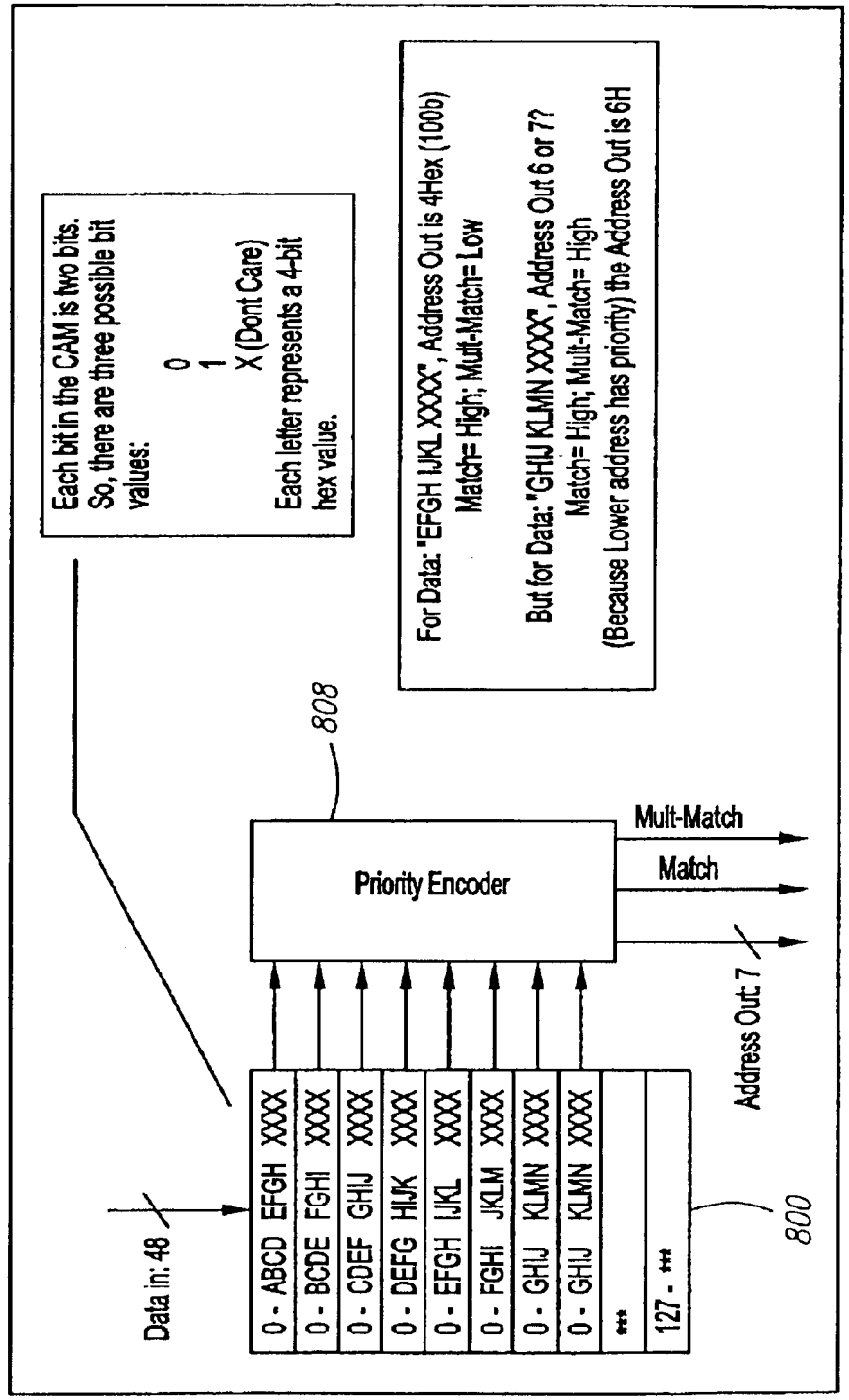
FIG. 8E illustrates an example of a compare operation performed by the CAM array with a priority encoder and corresponding logic of FIG. 8A.

FIG. 8E illustrates an example of a compare operation performed by the CAM array 800 with a priority encoder 808 and corresponding logic 802, 804, 806 of FIG. 8A. In FIG. 8E, each bit stored in the CAM 800 actually has two bits to represent one of three values: 1, 0 or X (DON'T CARE). Each letter in FIG. 8E represents a 4-bit hexadecimal value. If the control logic 806 (FIG. 8C) inputs data 'EFGH IJKL XXXX' into the CAM 800, the priority encoder 808 (FIG. 8E) outputs an address of 4Hex (100b), a MATCH bit of 1 and a MUL_MATCH bit of 0. If the control logic 806 (FIG. 8C) inputs data 'GHIJ KLMN XXXX' into the CAM 800, there are two entries (6 and 7) with that data. Because lower addresses have higher priority, the priority encoder 808 (FIG. 8E) outputs an address of 6Hex, a MATCH bit of 1 and a MUL_MATCH bit of 1.

Figure 8F:
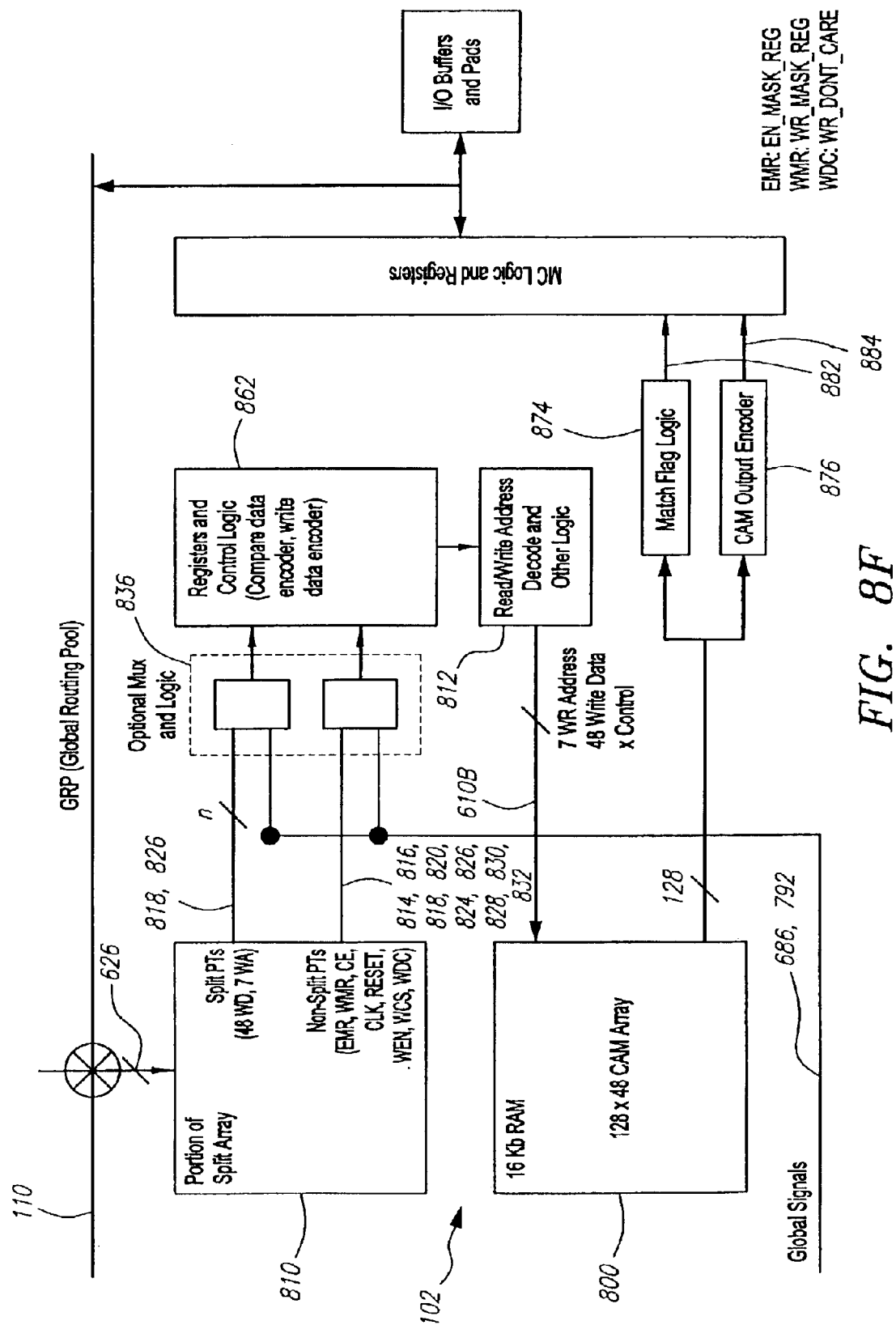
FIG. 8F illustrates one embodiment of a GLB of FIG. 1A in a CAM mode with a configurable 128×48 CAM array.
Figure 8J:
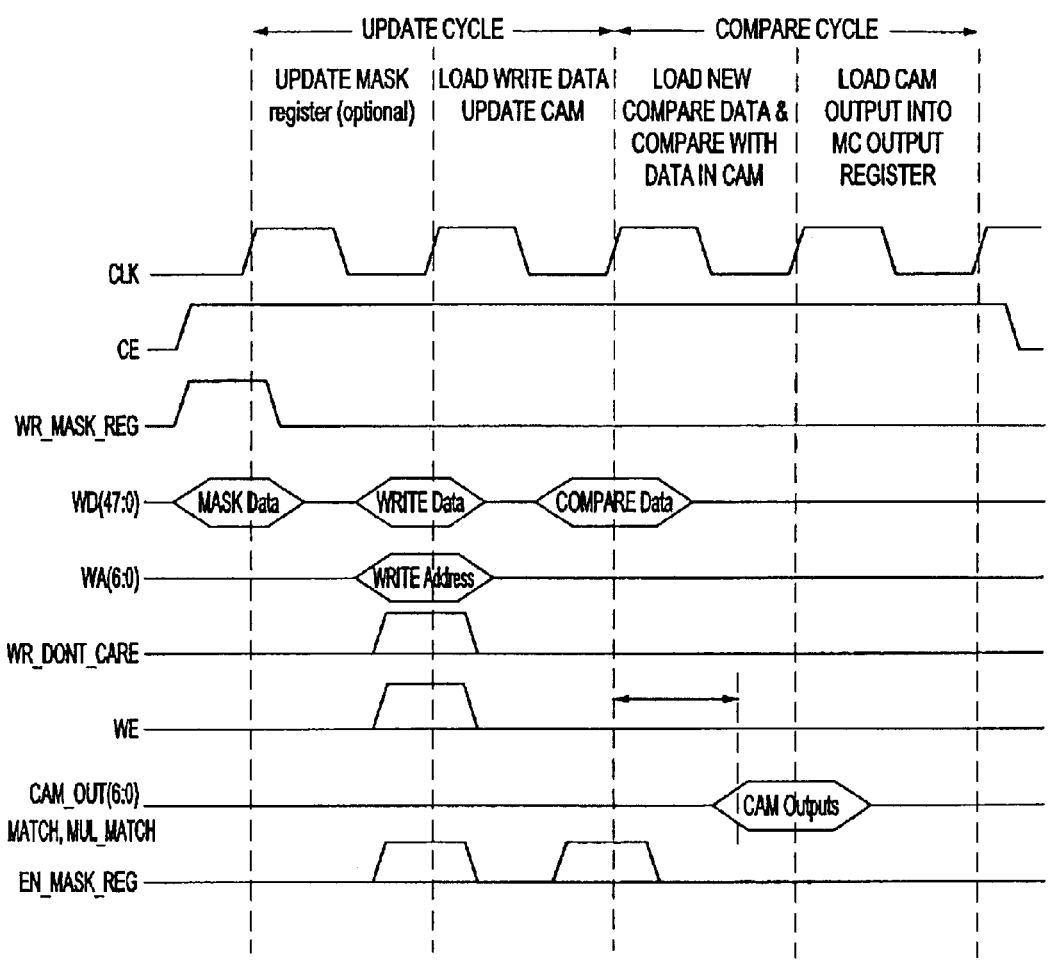
FIG. 8J illustrates exemplifying signal timing diagrams for the CAM of FIG. 8G.

FIG. 8F illustrates one embodiment of a GLB 102 of FIG. 1A in a CAM mode with a configurable 128×48 CAM array 800. The GLB 102 of FIG. 8F comprises a portion of a split AND array configured as a switch matrix 810, a read/write address decoder logic 812, which may include a compare data encoder and a write data encoder, a 128×48 CAM array 800, a plurality of optional MUXes and logic 836, such as AND gates and OR gates, a plurality of D flip flops/registers and control logic 862, a match flag logic 874, and a CAM output encoder 876.

The portion of the split AND array configured as a switch matrix 810 in FIG. 8F comprises the product term circuits 408A–408Z, 410A–410Z and product term circuits 402A–402Z discussed above with reference to FIG. 4B and may comprise additional logic. The split AND array switch matrix 810 receives signals from the GRP 110 via a 68-bit input line 626. The split AND array switch matrix 810 has an EN_MASK_REG output port 814, a write mask register (WR_MASK_REG) output port 816, a write data (WD) output port 818, a clock enable (CE) output port 820, a CLK output port 822, a reset output port 824, a write address (WA) output port 826, a write enable (WE) output port 828, a write chip select (WCS) output port 830, and a write DON'T CARE (WR_DON'T_CARE) output port 832. Product terms 160–162 are used to implement enable, clock and reset signals.

The optional MUXes and logic 836 may provide a selection between inverted control signals and non-inverted control signals. The optional MUXes and logic 836 may provide a selection between signals generated by the split AND array switch matrix 810 and a global clock signal GCLK on line 686. The optional logic 836 may comprise AND gates and OR gates, for example, to perform a logical AND operation between signals WE and WCS or perform a logical OR operation between signals RESET and global reset.

The D flip flops/registers 862 buffer some of the output signals of the split AND array 810. The D flip flops 862 may be reset by a global reset signal on line 792. The read/write address decoder logic 812 passes control signals, such as clock signals, and address bits for data to be read or written to the CAM array 800.

The compare data encoder in the logic 812 encodes registered CAM compare data into 3 states (0, 1 or DON'T CARE) depending on the mask register bits from the register 864. The write data encoder in the logic 812 encodes registered CAM update data into 3 states (0, 1 or DON'T CARE) depending on the mask register bits from the register 864 and the WR_DON'T_CARE signal.

The CAM array 800 receives compare data and write data from the compare data encoder and the write data encoder of the logic 812. The data stored in the CAM array 800 may include data and any user-defined validity bits or data classes.

The CAM array 800 outputs up to 128 bits of unencoded data to the match flag logic 874 and the CAM output encoder 876. The match flag logic 874 determines the number of matching entries in the CAM array 800 and outputs a MATCH_OUT signal and a MUL_MATCH_OUT signal to a destination, such as macrocells, or an external source, such as macrocell registers, a local routing pool or the GRP 110 (FIG. 1A). The CAM output encoder 876 priority encodes addresses of any entries in the CAM array 800 that match data from the compare data encoder of the logic 812. The CAM output encoder 876 outputs the 7-bit address of the entry with the highest priority (entry 0 is the lowest address and has the highest priority).

FIG. 8G illustrates one embodiment of a CAM array 800 implemented in the GLB 102 of FIG. 8F. The CAM array 800 in FIG. 8G has an EN_MASK_REG input port 801, a write address (WA) input port 803, a write enable (WE) input port 805, write chip select (WCS) input port 807, write data (WD) input port 809, a write mask register (WR_MASK_REG) input port 811, a write DON'T CARE (WR_DON'T_CARE) input port 813, a reset input port 815, a CLK input port 817, a CE input port 819, a CAM_OUT output port 821, a MATCH_OUT output port 823, a MUL_MATCH_OUT output port 825. The WR_DON'T_CARE input port 813 writes DON'T CAREs into CAM locations as specified by the write address registers 868 (FIG. 8F).

FIG. 8H illustrates exemplifying power-on reset conditions of the CAM 800 in FIG. 8F. A power-on reset signal loads the CAM array 800 with initialization data specified by the user. FIG. 8I illustrates exemplifying normal user mode conditions of the CAM 800 in FIG. 8F. N is a number between 1 and 47. As shown in FIG. 8H, if no initialization data is specified by the user at power-on reset, the CAM 800 is loaded with hardware defaults. The unused portion of the 48-bit CAM word <47:N> has no effect during compare operations because bits <47:N> are set to 1 in the data/compare register 866. During update operations, all 1s are written into the DON'T CARE portion <47:N> of the CAM word.

In one configuration, a reset signal resets the output registers but does not affect the CAM array 800. The clock enable (CE) signal disables the clock inputs to all registers 862–872. The write enable (WEN) signal in conjunction with any depth cascading chip selects (CS) enables writing into the CAM array 800.

FIG. 8I illustrates exemplifying signal timing diagrams for the CAM 800 of FIG. 8O.

Figure 8K:
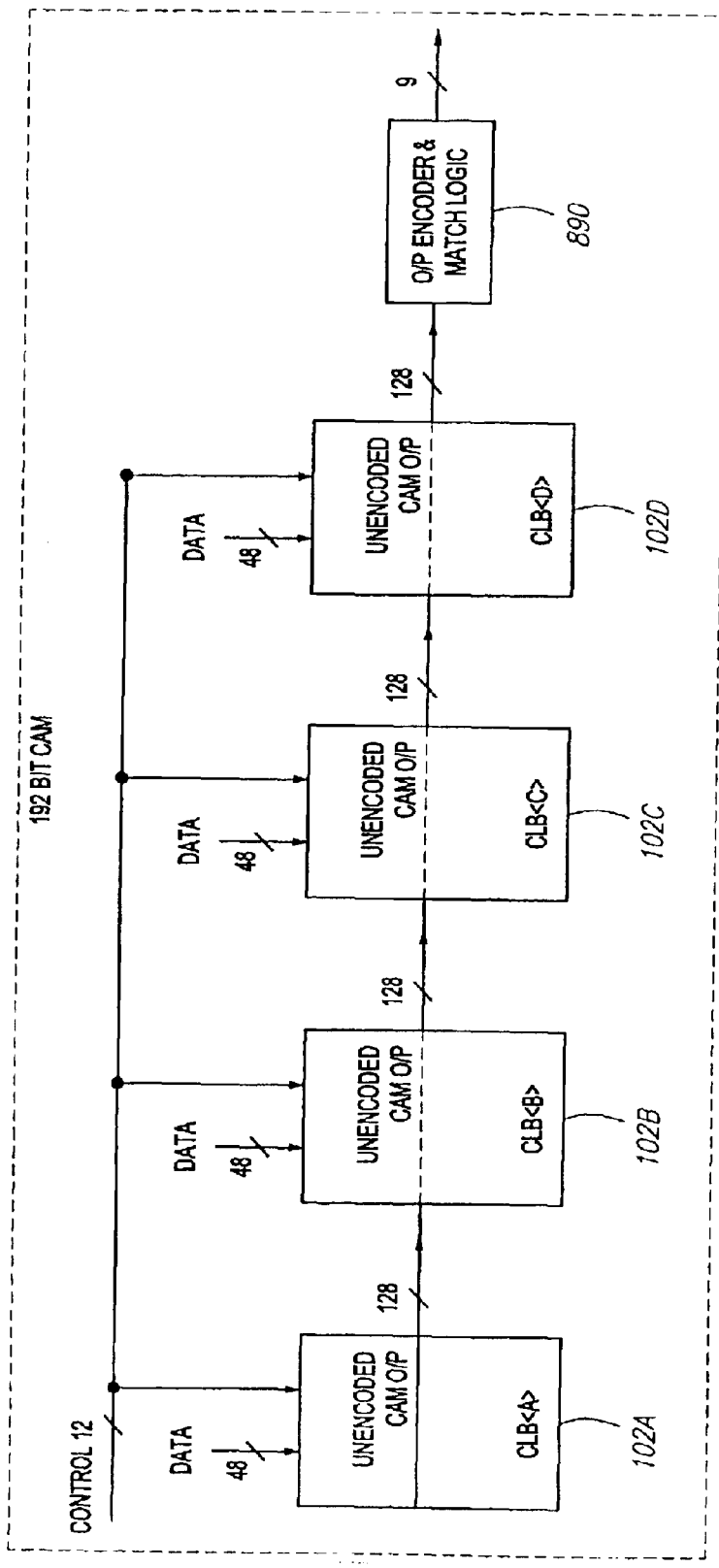
FIG. 8K illustrates one embodiment of cascaded GLBs in CAM mode.

FIG. 8K illustrates one embodiment of cascaded GLBs 102A–102D in CAM mode. A device with multiple GLBs may have dedicated support logic, such as an output encoder and match logic 890 shown in FIG. 8K, for cascading the GLBs in CAM mode. Multiple GLBs 102A–102D in CAM mode in a device with 1-level routing or 2-level routing may be cascaded to provide wider CAM words. For example, the cascaded GLBs 102A–102D in FIG. 8K may provide a 145-bit to 196-bit CAM (4×48=196).

FIFO Mode

Figures 1, 9A:
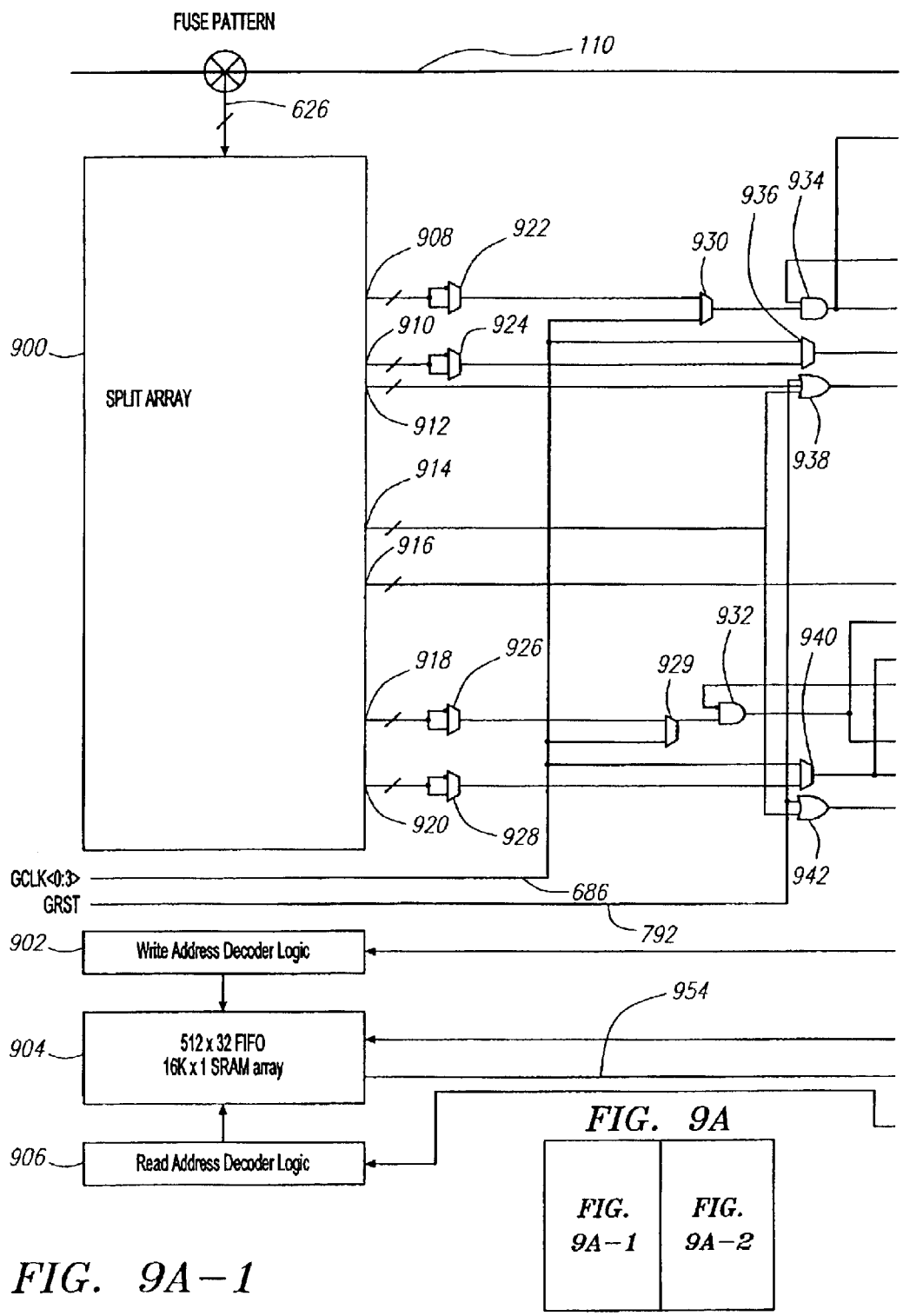
Figures 2, 9A:
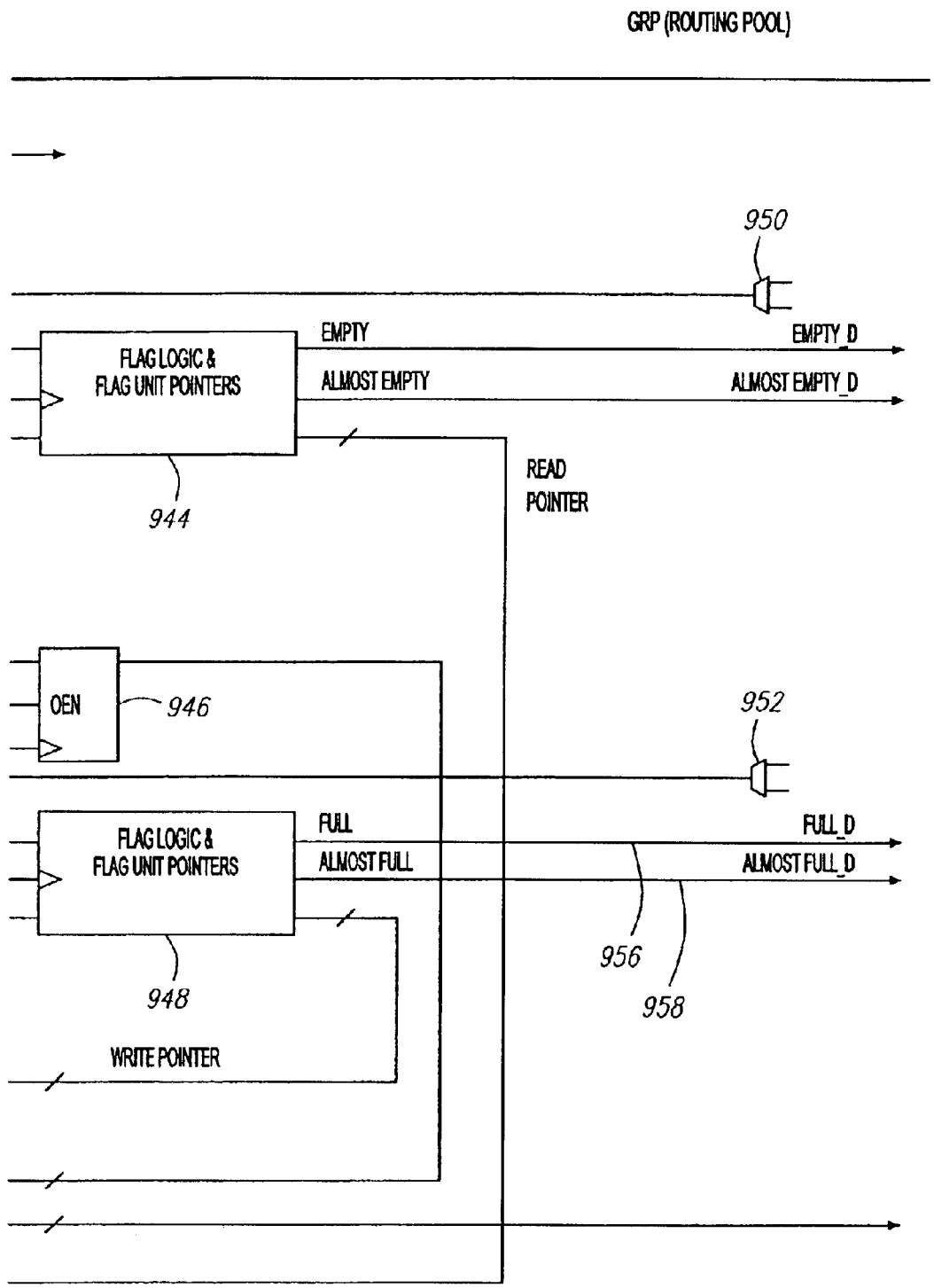

FIG. 9A illustrates one embodiment of a GLB 102 of FIG. 1A in a FIFO mode with a configurable 512×32 FIFO 904. The GLB 102 of FIG. 9A comprises a split AND array switch matrix 900, a write address decoder logic 902, a 512×32 FIFO 904, a read address decoder logic 906, a plurality of MUXes 922, 924, 926, 928, 929, 930, 936, 940, 950, 952, two AND gates 932, 934, two OR gates 938, 942, a D flip flop 946, a first flag logic circuit (for read) 944 with flag unit pointers and a second flag logic circuit (for write) 948 with flag unit pointers. In one embodiment, each GLB 102 in FIG. 1A further comprises additional built-in FIFO control logic.

The split AND array switch matrix 900 in FIG. 9A comprises the split AND array 400 discussed above with reference to FIG. 4B and may comprise additional logic. The split AND array switch matrix 900 receives signals from the GRP 110 via a 68-bit input line 626. The split AND array switch matrix 900 has a read enable (RE) output port 908, a read clock (RCLK) output port 910, a reset read pointer (reset_RP) output port 912, a reset output port 914, write data (WD) output port 916, a write enable (WE) output port 918 and a write clock (WCLK) output port 920. Product terms 160–162 are used to implement enable, clock and reset signals.

A first set of the MUXes 922–928 provide a selection between inverted control signals and non-inverted control signals. A second set of MUXes 929, 930, 936, 940 provide a selection between signals generated by the split AND array switch matrix 900 and a global clock signal GCLK on line 686. A third set of MUXes 950, 952 provide flag values from macrocells 104 (FIG. 2B). The D flip flop 946 provides a register or buffer for write data from the split AND array switch matrix 900.

The first and second flag logic circuits 944, 948 may be implemented as separate units or as a single unit. The first and second flag logic circuits 944, 948 may be reset by a global reset signal on line 792 or a block-level reset on line 914. The first flag logic circuit 944 outputs two programmable flags, ALMOST EMPTY (Y) and EMPTY, to external logic, such as the macrocells 104 (FIG. 2B). In one embodiment, the first flag logic circuit 944 (FIG. 9A) outputs the ALMOST EMPTY (Y) flag to the $20^{th}$ and $21^{st}$ macrocells (FIG. 2B) and outputs the EMPTY flag to the $28^{th}$ and $29^{th}$ macrocells. Thus, each flag is available at two macrocells. The first flag logic circuit 944 also outputs a read pointer to the read address decoder logic 906.

The second flag logic circuit 948 outputs programmable FULL (also called TC for terminal count) and ALMOST FULL (X) flags to external logic, such as macrocells 104 (FIG. 2B). In one embodiment, the second flag logic circuit 948 (FIG. 9A) outputs the FULL flag to the $12^{th}$ and $13^{th}$ macrocells (FIG. 2B) and outputs the ALMOST FULL (X) flag to the $4^{th}$ and $5^{th}$ macrocells. Thus, each flag is available at two macrocells. The second flag logic circuit 948 also outputs a write pointer to the write address decoder logic 902.

The FULL flag is programmable from 1 to a maximum number locations in the FIFO 900. The ALMOST FULL and ALMOST EMPTY flags are programmable from 1 to FULL−1. If a user tries to write to the FIFO 904 after a FULL flag is active, or tries to read from the FIFO 904 after an EMPTY flag is active, then the internal pointers of the FIFO 904 are frozen at their last active value, and no read or write operation is performed.

The read and write address decoder logic 902, 906 passes control signals, such as clock signals, and address bits for data to be read from or written to the FIFO 904. The FIFO 904 receives data to be written from the second flag logic circuit 948. The FIFO 904 outputs up to 32 bits of data to an external source, such as macrocell registers, a local routing pool or the GRP 110 (FIG. 1A).

The FIFO 904 may have differently-configured data bus widths on the FIFO's read and write ports. For example, in one embodiment, the FIFO 904 has a 32-bit write port and an 8-bit read port. In this embodiment, the FULL and ALMOST FULL flags refer to 32-bit words being written, and the EMPTY and ALMOST EMPTY flags refer to 8-bit words being read. For example, assuming the EMPTY and ALMOST EMPTY flags are programmed to be 2, a first 32-bit write will clear the EMPTY and ALMOST EMPTY flags because the FIFO 904 has 4 words to be read. But the ALMOST FULL flag will not be asserted because there is only one written word in the FIFO 904. Assuming a second 32-bit write sets the ALMOST FULL flag, the FIFO 904 now has 8 words to be read. Reading 6 words would set the ALMOST EMPTY flag, and reading 8 words would set the EMPTY flag.

The order of the 8-bit words read from the FIFO 904 may be changed by software, hardware or both. For example, either software or hardware may change the order of data received by input data pins of the FIFO 904 or the order of data sent by output data pins of the FIFO 904.

FIG. 9B illustrates exemplifying FIFO configurations for the FIFO 904 of FIG. 9A. In one embodiment, a GLB (e.g., GLB 102A in FIG. 1A) is configured as a 512×32 FIFO with 32 outputs for reading data, and flag logic circuitry from a second GLB (e.g., GLB 102B in FIG. 1A) is used for four flags associated with the first GLB 102A. The second GLB 102B has six inputs to duplicate the flag logic (6 control signals) in the first GLB 102A and four outputs for flags. The second GLB 102B may still function as a CPLD with 62 inputs and 28 outputs. In other embodiments, FIFOs with widths larger or smaller than the configuration shown in FIG. 9B may be implemented. FIFOs with smaller widths may be implemented by ignoring certain input and output data bits (e.g., with software).

Figure 9C:
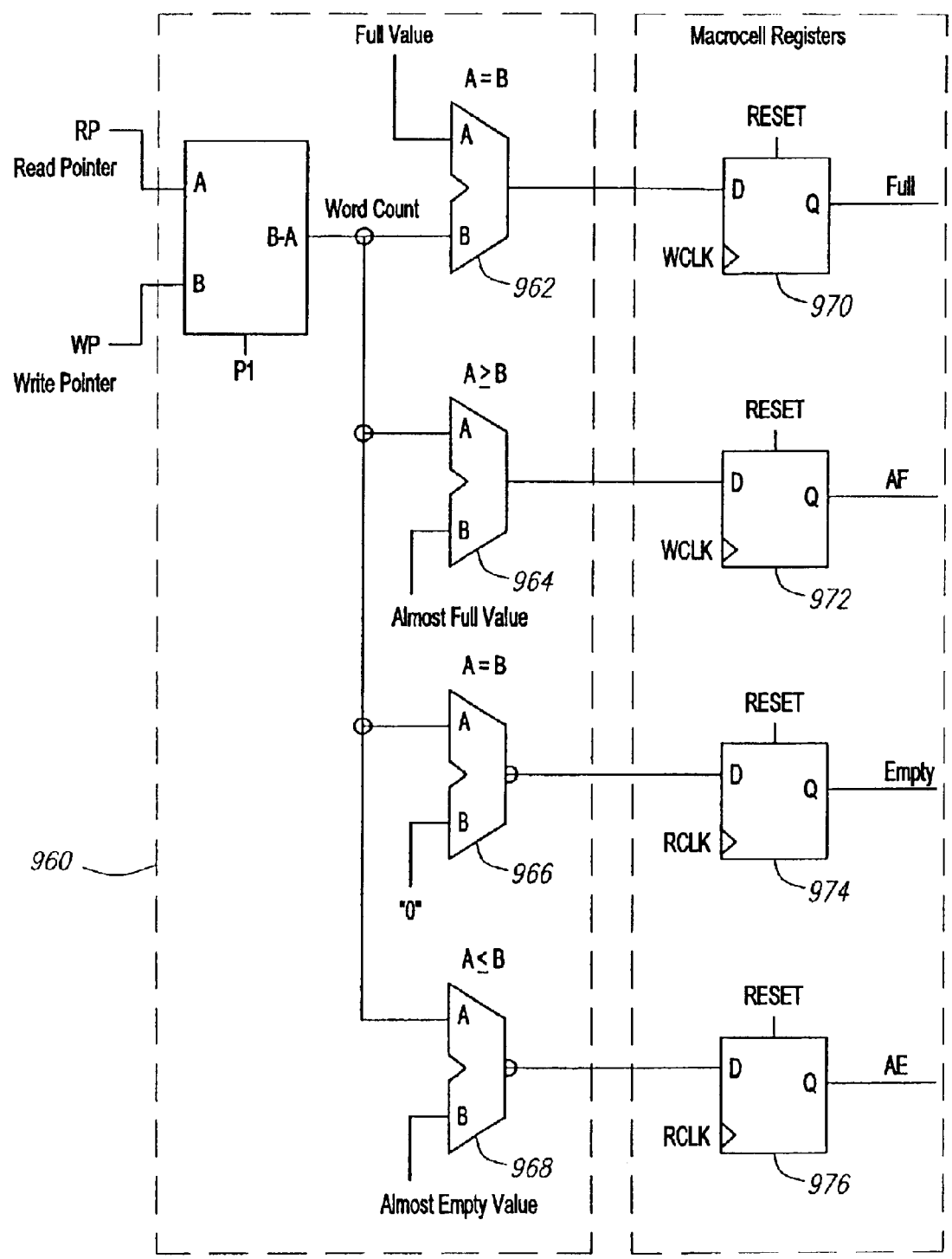
FIG. 9C illustrates one embodiment of flag control logic within the GLB of FIG. 9A.

FIG. 9C illustrates one embodiment of the flag control logic 960 within the GLB 102 of FIG. 9A. FIG. 9C also illustrates D flip-flops as registers 970–976 within a plurality of macrocells, such as the macrocell 104 in FIG. 3. The flag control logic 960 comprises a subtractor P1 and four comparators 962–968, which output flag values to the four D flip-flops 970–976.

When the first and second flag logic circuits 944, 948 (FIG. 9A), respectively, receive a reset signal (either a block-level reset via line 914 or a global reset via line 792), the read and write pointers (RP and WP) in the first and second flag logic circuits 944, 948 are reset to "0," the first location in the FIFO 904. In one embodiment, the read and write pointers may vary in width from 9 to 14 bits. At a first valid RCLK/WCLK clock edge from output ports 910, 920 (FIG. 9A), the read and/or write pointers are advanced to location "1" to point to the next location in the FIFO 904.

The subtractor P1 in FIG. 9C subtracts the write pointer (WP) from the read pointer (RP) and outputs the number of words stored in the FIFO 904 (word count) to the comparators 962–968. The comparators 962–968 compare the word count to a Full value, an Almost Full value, "0," and an Almost Empty value to generate a Full Flag, an Almost Full Flag, an Empty Flag and an Almost Empty Flag, respectively. The Full, Almost Full and Almost Empty values are all programmable. All four flags may be stored in macrocell registers 970–976.

When a reset signal is sent to the macrocell registers 970–976 that store the flags, the FULL and ALMOST FULL flags are de-asserted (set to 0), and the EMPTY and ALMOST EMPTY flags are asserted (set to 1). In other words, the inverse of the EMPTY and ALMOST EMPTY flags (!EMPTY and !ALMOST_EMPTY are set to 0. The third and fourth comparators 966, 968 have inverters at their output ports.

The first flag logic circuit 944 in FIG. 9A may reset the read pointer to provide a function called 're-transmit' in packetized communication applications. In this application, a user may keep track of when a packet is written or read to or from the FIFO 904. For example, starting from a reset condition, a user writes a packet of information into the FIFO 904. A subsequent read operation reads data from the FIFO 904 until the EMPTY flag is asserted. If the user wants to re-transmit the same packet, the user resets the read pointer and starts the read operation again. When the read pointer is reset, the EMPTY and ALMOST EMPTY flags are not de-asserted until one read clock cycle after the reset ends or is de-asserted. This is a condition known as boundary cycle latency.

Some of the macrocells 104 (FIG. 2B) may be modified to accommodate a GLB 102 in FIFO mode (FIG. 9A) where both read and write clocks (RCLK and WCLK) are generated inside the GLB 102 (or device 100 in FIG. 1A) instead of from the global clock GCLK signal line 686. In one embodiment, the $4^{th}$, $5^{th}$, $12^{th}$ and $13^{th}$ macrocells that store the FULL and ALMOST_FULL flags are modified to receive a WCLK signal.

Figure 9D:
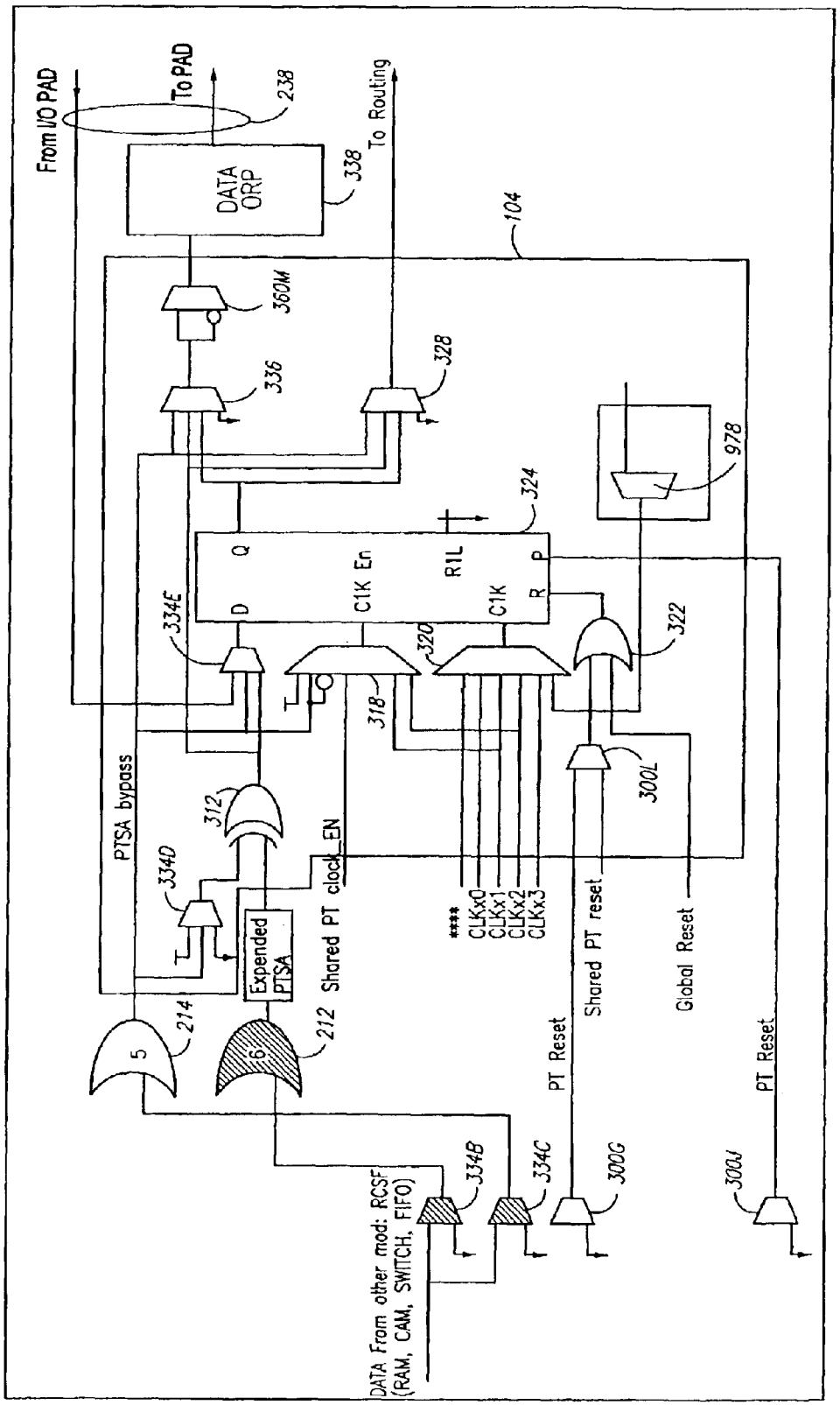
FIG. 9D illustrates one embodiment of a modified macrocell and surrounding logic that may be used by the GLB of FIG. 9A in FIFO mode.

FIG. 9D illustrates one embodiment of a modified macrocell 104' and surrounding logic that may be used by the GLB 102 of FIG. 9A in FIFO mode. In one embodiment, the modified macrocell 104' in FIG. 9D represents the $4^{th}$, $5^{th}$, $12^{th}$ and $13^{th}$ macrocells associated with the GLB 102 of FIG. 9A in FIFO mode. The modified macrocell 104' in FIG. 9D comprises all of the components of the macrocell 104 in FIG. 3, plus an additional MUX 978, which receives a WCLK signal from the split product term 161 of the split array switch matrix 900. The additional MUX 978 allows the macrocell 104' to be clocked by the WCLK signal.

Figure 9E:
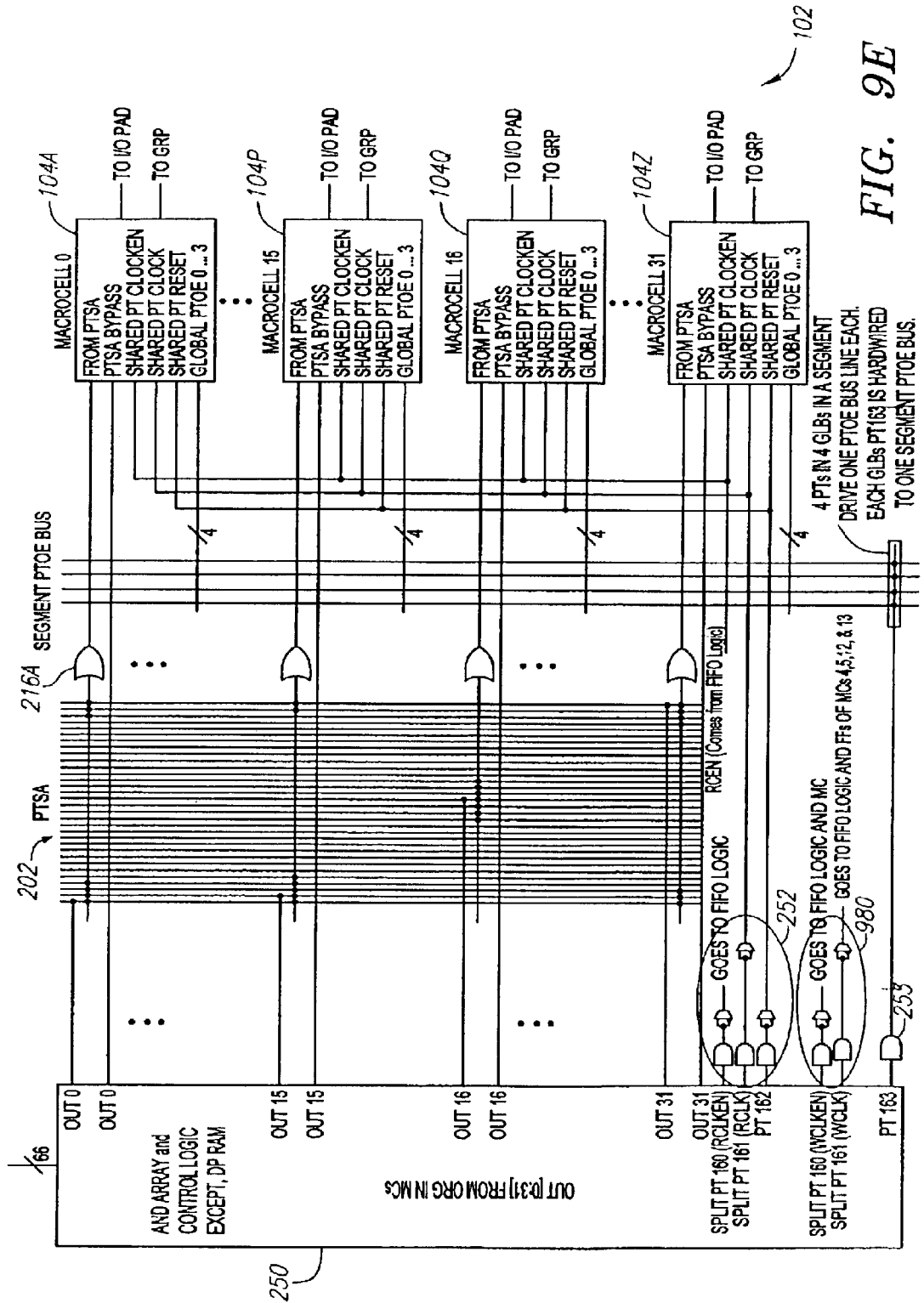
FIG. 9E illustrates one embodiment of the GLB and macrocells of FIG. 2B configured in FIFO mode.
Figure 9F:
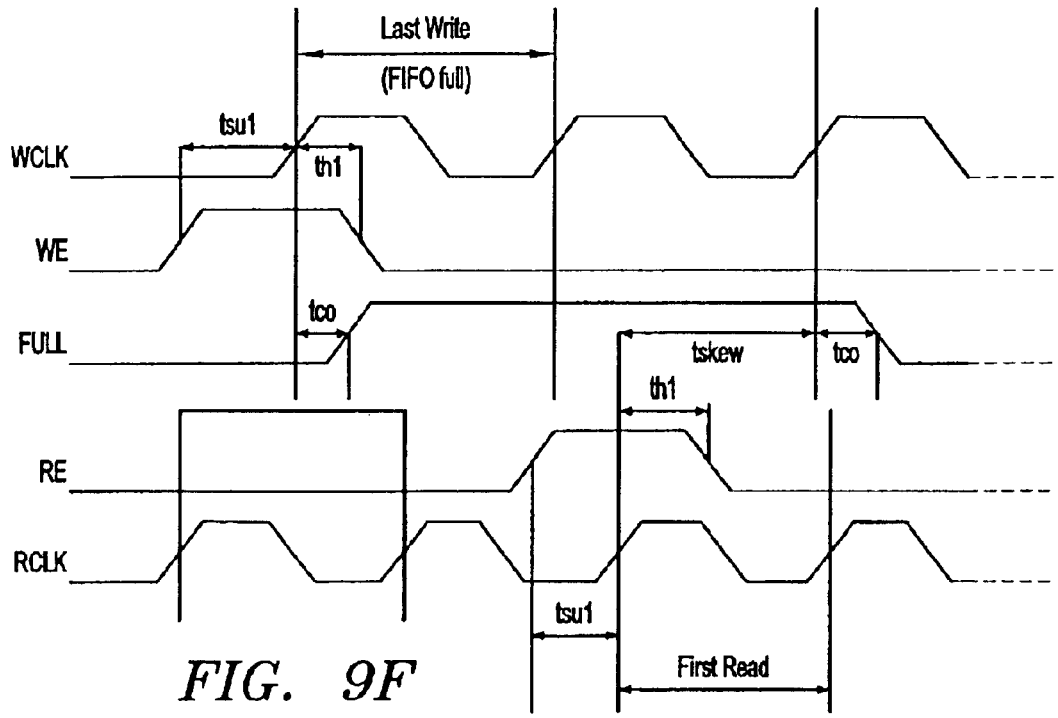
Figure 9G:
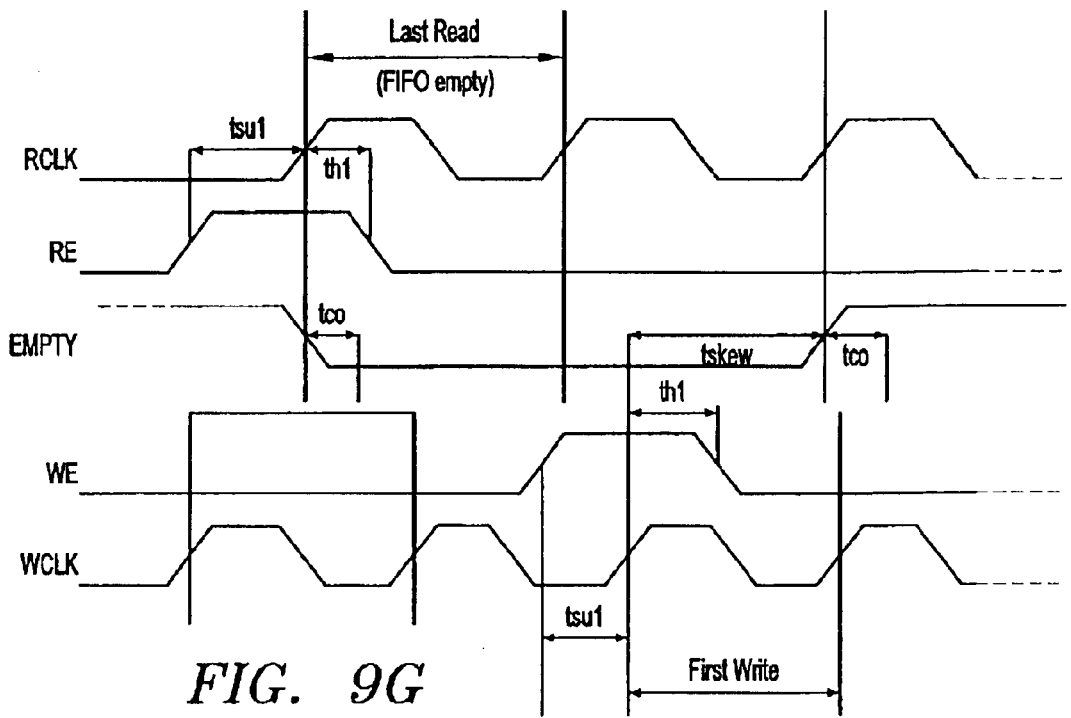

FIG. 9E illustrates one embodiment of the GLB 102 and macrocells 104A–104Z of FIG. 2B configured in FIFO mode. FIG. 9E illustrates AND gates and MUXes 252, 980 that pass read and write clock enable signals, read and write clock signals and reset signals from the AND array and RCSF control logic 250 to the macrocells 104A–104Z. In FIG. 9E, FIFO control logic drives the shared PT clock enable (CLKEN) signal for the GLB 102, which is also the clock enable (RCLKEN) for one or more macrocell output registers that generate a read data output. The macrocell registers that carry the flag outputs may be programmed to ignore all clock enable signals because these registers do not need any clock enable signals. The flags should be updated and synchronized as soon as any clock edge arrives.

FIGS. 9F–9I illustrate exemplifying signal timing diagrams and parameters for the GLB 120 of FIG. 9A in FIFO mode.

Programmable Width Modulation

As described above, the GLB 102 may be configured as an SRAM, a dual-port SRAM, a CAM, a switch or a FIFO with programmable width modulation. For example, a traditional FIFO has a read port and a write port with essentially the same data width. 'FIFO depth' is defined as a number of words that the FIFO can store before a FULL flag is asserted. An EMPTY flag is asserted if there are more words read then written in the FIFO.

A FIFO with programmable width modulation in accordance with one aspect of the invention has a read port data width that is independent of a write port data width. For example, if the write port is narrower than the read port, the FIFO control logic packs written data before the data is read. If the write port is wider than the read port, the FIFO control logic unpacks written data before the data is read. The FIFO may also compare read word count and write word count to determine FULL and EMPTY flag statuses.

Switch Mode

Figure 10A:
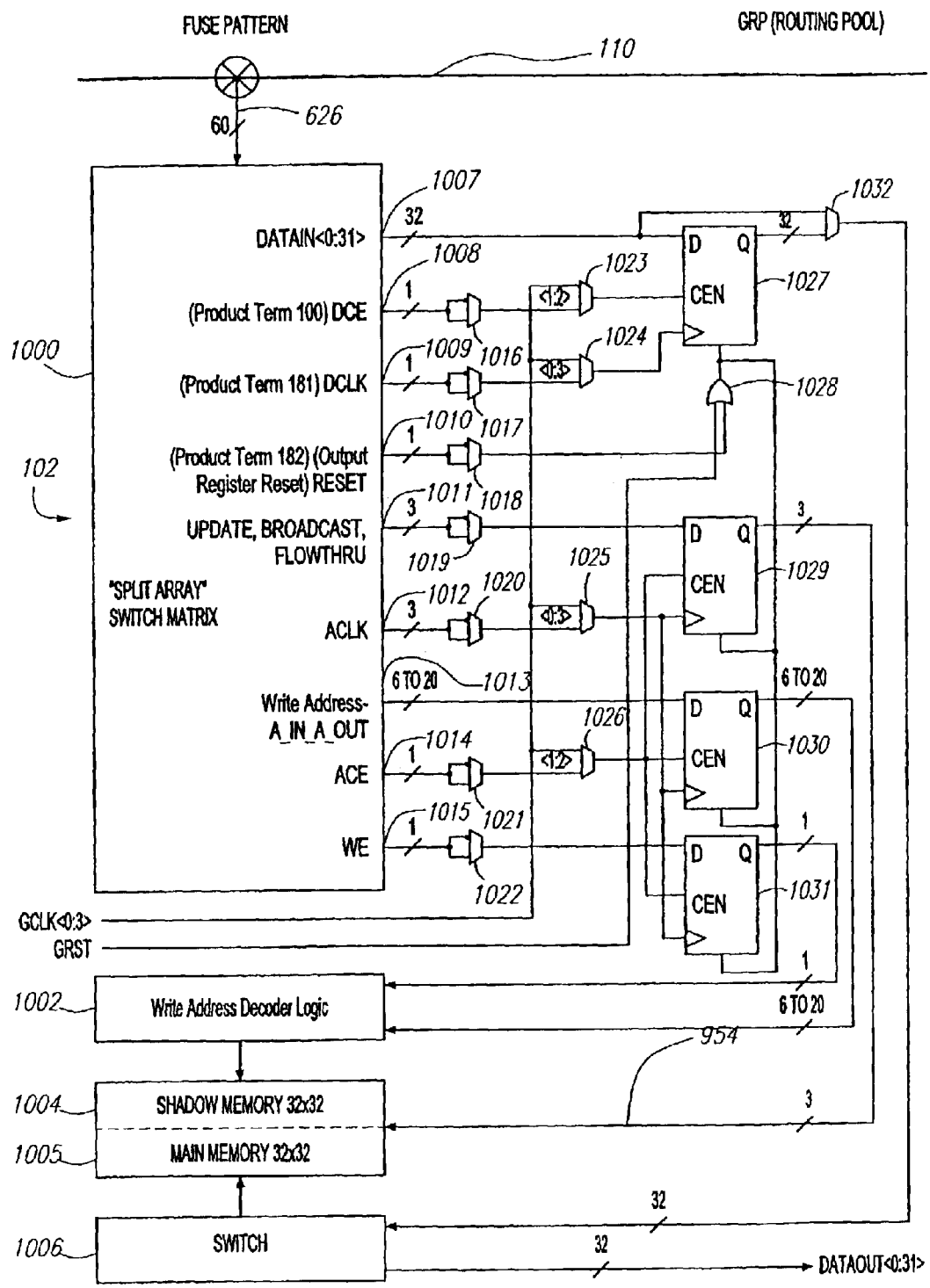
FIG. 10A illustrates one embodiment of a GLB of FIG. 1A in a switch mode with a main memory and a shadow memory.

FIG. 10A illustrates one embodiment of a GLB 102 of FIG. 1A in a switch mode with a main memory 1004 and a shadow memory 1005. The GLB 102 of FIG. 10A comprises a split AND array switch matrix 1000, a write address decoder logic 1002, a main memory 1004, a shadow memory 1005, a switch block 1006, a plurality of MUXes 1016–1026, 1032, an OR gate 1028 and a plurality of D flip flops 1027–1031.

The split AND array switch matrix 1000 in FIG. 10A comprises the split AND array 400 discussed above with reference to FIG. 4B and may comprise additional logic. The split AND array switch matrix 1000 receives signals from the GRP 110 via a 68-bit input line 626. The split AND array switch matrix 1000 has a DATAIN output port 1007, a data clock enable (DCE) output port 1008, a data clock (DCLK) output port 1009, a reset output port 1010, an UPDATE/BROADCAST/FLOWTHROUGH output port 1011, an address clock (ACLK) output port 1012, a write address (A_IN, A_OUT) output port 1013, an address clock enable (ACE) output port 1014 and a write enable (WE) output port 1015. Product terms 160–162 of the split AND array switch matrix 1000 are used to implement clock enable, clock and reset signals.

A first set of the MUXes 1016–1022 provide a selection between inverted control signals and non-inverted control signals. A second set of MUXes 1023–1026 provide a selection between signals generated by the split AND array switch matrix 1000 and a global clock signal GCLK on line 686. The D flip flops 1027–1031 provide registers or buffers for signals from the split AND array switch matrix 1000 to the shadow memory 1004 and the switch block 1006. The data inputs and outputs may be registered or unregistered.

The write address decoder logic 1002 passes WE, A_IN and A_OUT to the shadow memory 1004 and the main memory 1005. The A_IN signal selects one or more input bits of DATAIN for the switch 1006 to route. The A_OUT signal specifies a routing configuration that determines an output routed by the switch 1006. The shadow memory 1004 and the main memory 1005 store routing configurations (A_OUT). The DATAIN register 1027 is controlled by the DCLK and DCE signals. The address register 1030 for A_IN and A_OUT is controlled by the ACLK and ACE signals. In one embodiment, the DCLK, DCE, WE, UPDATE and ACE inputs are not used. The WE, UPDATE and ACE input ports may be tied to 1 if they are unused.

The switch block 1006 outputs up to 32 bits of data, according to a routing configuration, to an external source, such as macrocell registers, a local routing pool or the GRP 110 (FIG. 1A).

Figures 10B, 10C, 10D:
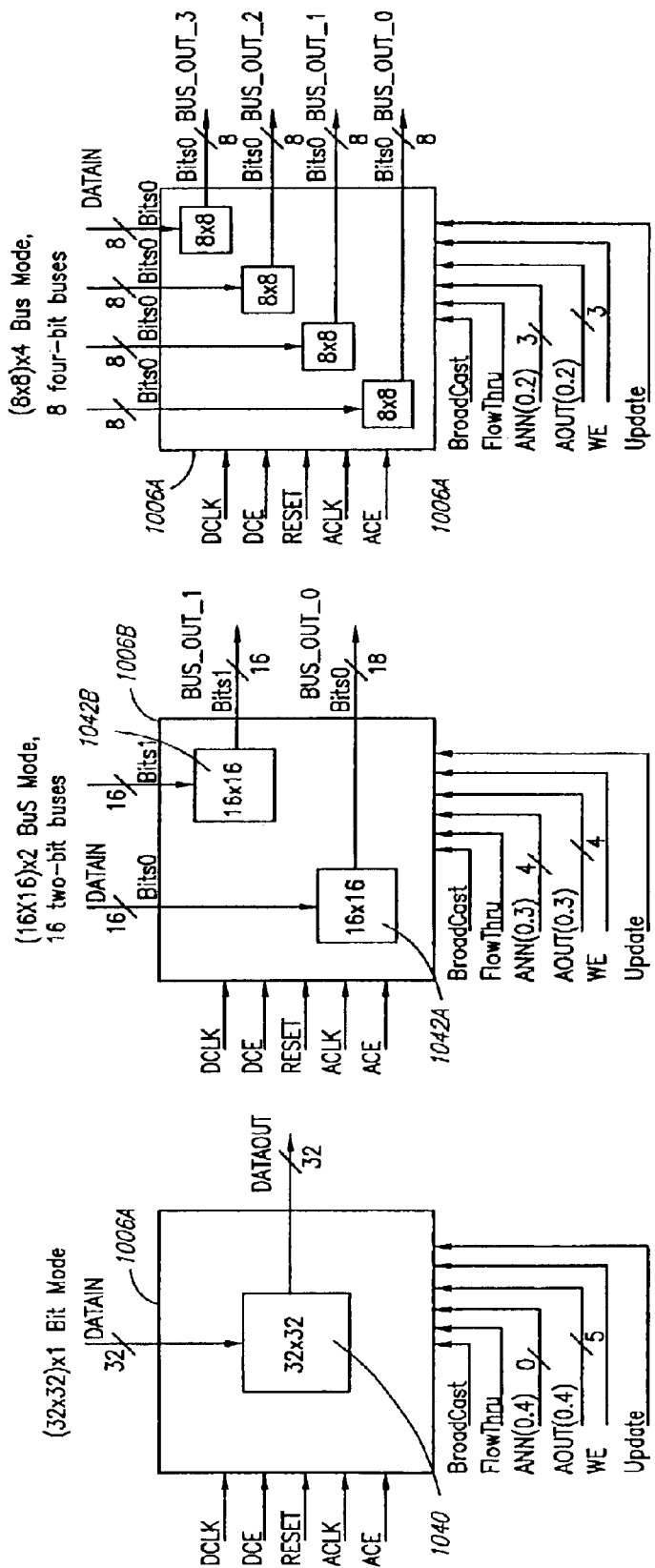
FIG. 10B illustrates one embodiment of a switch block within the GLB of FIG. 10A.
FIG. 10C illustrates another embodiment of a switch block within the GLB of FIG. 10A.
FIG. 10D illustrates another embodiment of a switch block within the GLB of FIG. 10A.

FIG. 10B illustrates one embodiment of a switch block 1006A within the GLB 102 of FIG. 10A. The switch block 1006A is in bit mode and comprises a 32×32×1 switch 1040. The switch block 1006A in FIG. 10B has one connection per cycle for all modes. When the switch block 1006A receives an asserted BROADCAST signal, the switch block 1006A routes a 1-bit input selected by A_IN[0:4] (in the shadow and main memories 1004, 1005 in FIG. 10A) to each of the 32 1-bit output pins/lines.

When the switch block 1006A receives an asserted FLOWTHROUGH signal, each 1-bit input pin outputs its value (either 0 or 1) to a corresponding 1-bit output pin. For example, input pin 0 outputs its value to output pin 0, input pin 1 outputs its value to output pin 1, etc.

FIG. 10C illustrates another embodiment of a switch block 1006B within the GLB 102 of FIG. 10A. The switch block 1006B is in bus mode and comprises two 16×16 switches 1042A, 1042B and 16 2-bit output buses (or two sets of sixteen 1-bit output lines/pins). Both switches 1042A, 1042B may be updated at the same time with the same connections. Because there is a one-bit-to-one-bit association between a set of 16 1-bit DATAIN input lines and a set of 16 1-bit BUS_OUT output lines, the switch block 1006B in FIG. 10C may use smaller address inputs. In other words, the AIN and AOUT inputs for the switch block 1006B in FIG. 10C may be four bits wide instead of 5 bits wide (as in the switch block 1006A of FIG. 10B).

FIG. 10D illustrates another embodiment of a switch block 1006C within the GLB 102 of FIG. 10A. The switch block 1006C is in bus mode and comprises four 8×8 switches 1044A–1044D and eight 4-bit output buses (or four sets of eight 1-bit output lines/pins). All four switches 1044A–1044D may be updated at the same time with the same connections. The AIN and AOUT inputs for the switch block 1006C in FIG. 10D may be three bits wide.

In a MULTICYCLE MULTICAST mode, the switch blocks 1006A–1006C (FIGS. 10B–10D) route (multicast) a 1-bit input to multiple 1-bit outputs. Multiple clock cycles are used to load a routing configuration (A_OUT) into the shadow memory 1004 (FIG. 10A). The output address bits A_OUT may be referred to as 'encoded.' In a SINGLE CYCLE MULTICAST mode, a single clock cycle is used to load a routing configuration into the shadow memory 1004 (FIG. 10A). The output address bits A_OUT may be referred to as 'un-encoded.'

Figures 10E, 10F:
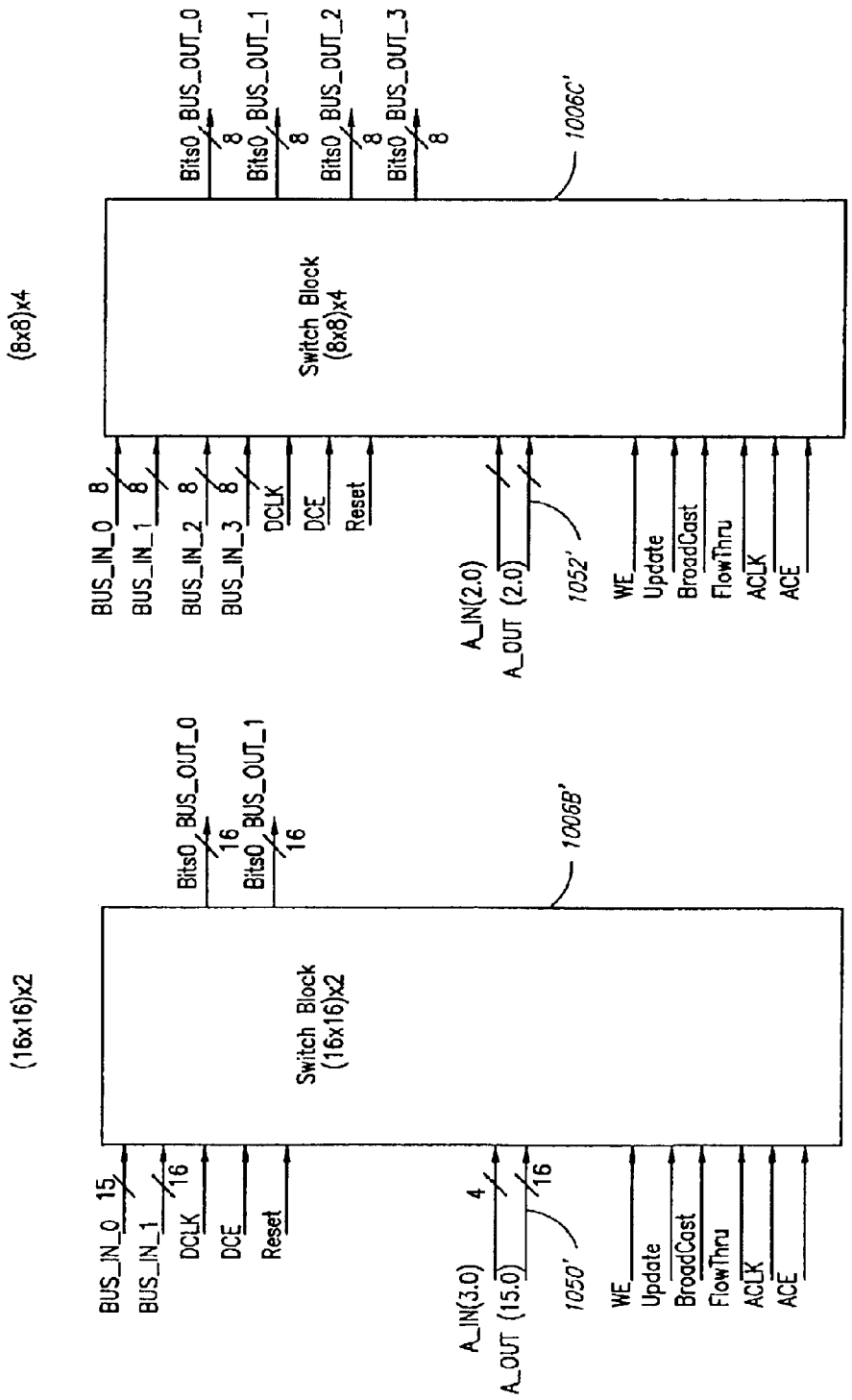
FIG. 10E illustrates one embodiment of a 16×16×2 switch block in a SINGLE CYCLE MULTICAST mode with a 1-bit wide A_OUT output bus.
FIG. 10F illustrates one embodiment of an 8×8×4 switch block in a DUAL CYCLE MULTICAST mode with an 8-bit wide bus A_OUT.

FIG. 10E illustrates one embodiment of a 16×16×2 switch block 1006B' in a SINGLE CYCLE MULTICAST mode with a 16-bit wide A_OUT output bus 1050. FIG. 10F illustrates one embodiment of an 8×8×4 switch block 1006C' in a DUAL CYCLE MULTICAST mode with an 8-bit wide bus A_OUT 1052.

In one embodiment, an update of WE, A_IN and A_OUT from the shadow memory 1004 to the main memory 1005 uses one clock cycle, and the switch 1006 may be configured while the main memory 1005 is operating the connections.

Figures 10G, 10H:
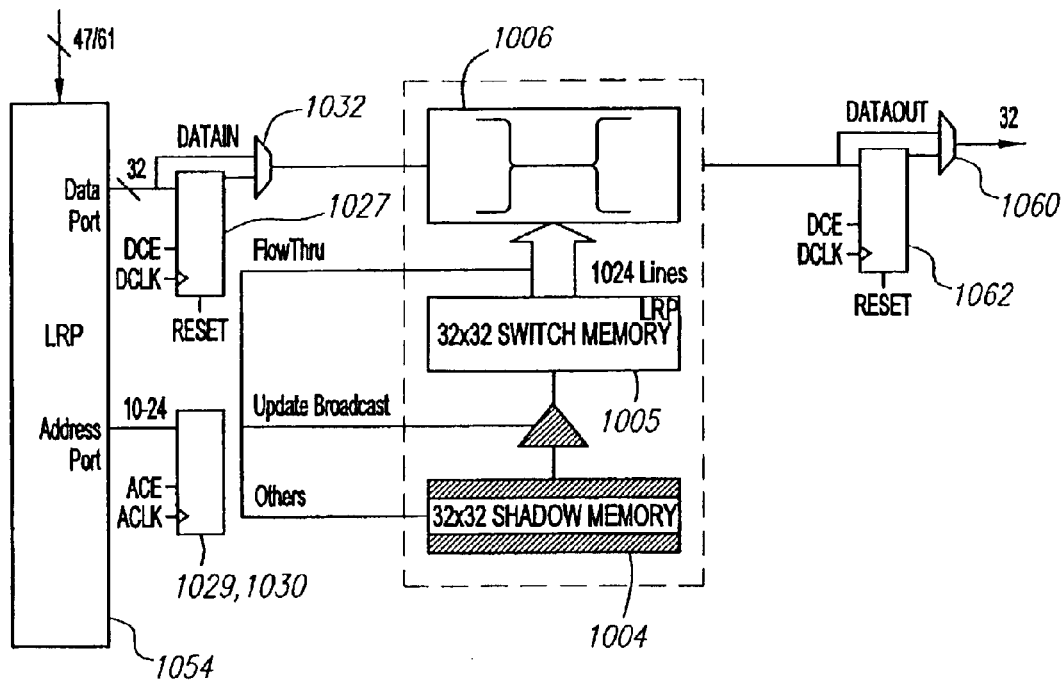
FIG. 10G illustrates one embodiment of the switch and other components in the GLB of FIG. 10A.
FIG. 10H illustrates a plurality of switch timing parameters for the GLB of FIG. 10A.
Figure 10:
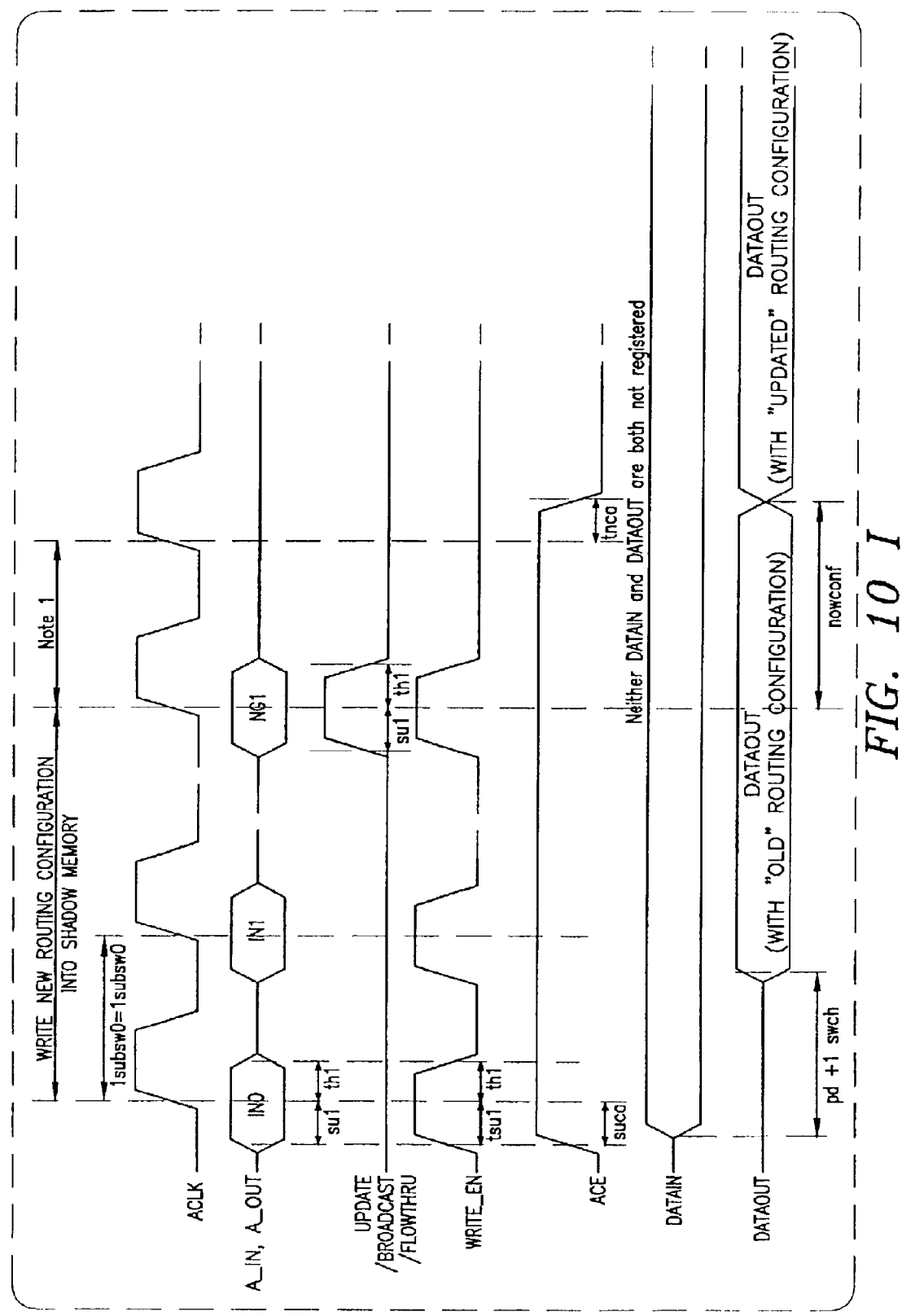
FIGS. 10I–10L illustrate exemplifying timing diagrams for the GLB of FIG. 10A.
Figure 10:
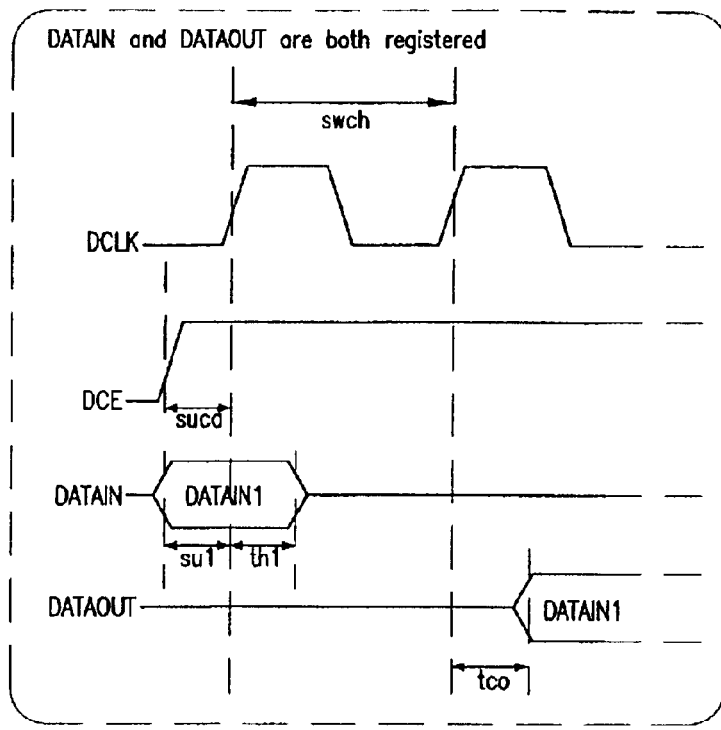
Figure 10:
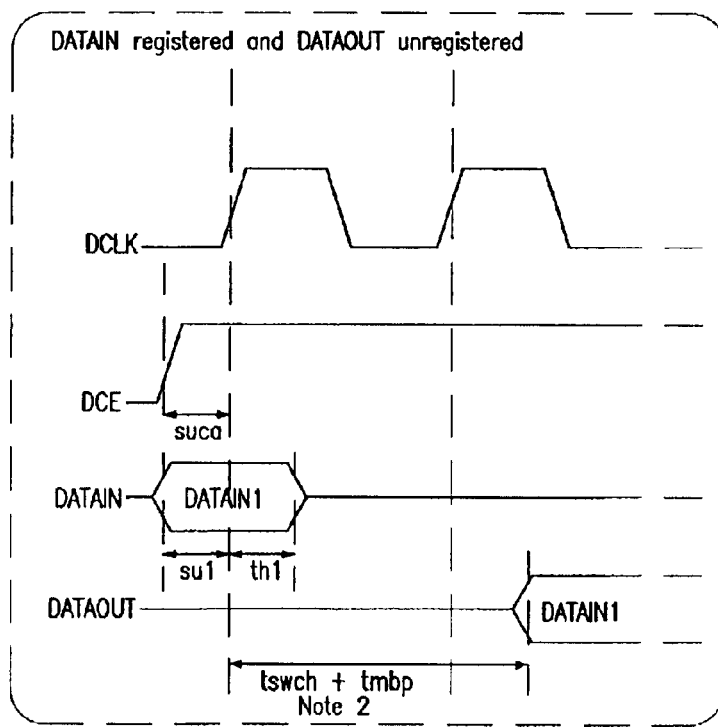
Figure 10L:
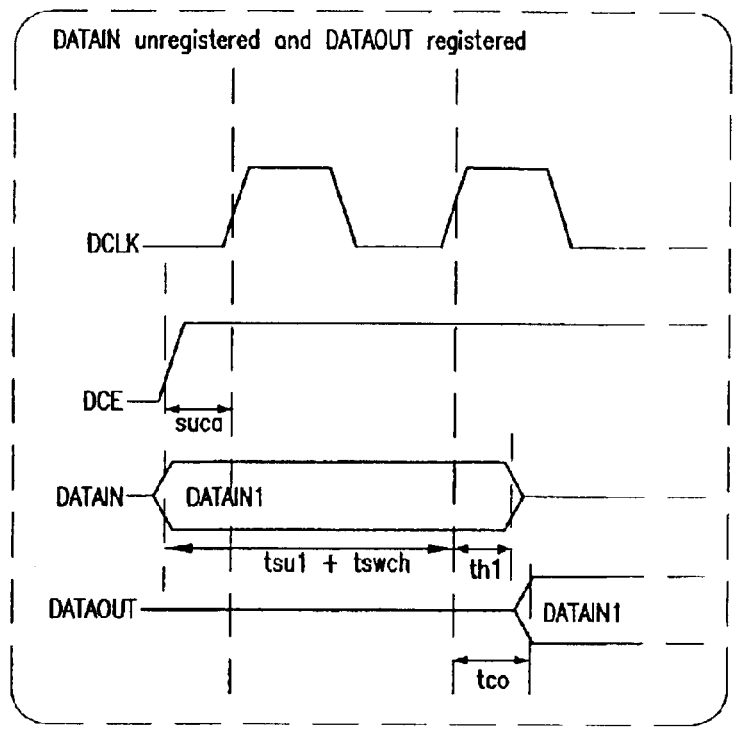

FIG. 10G illustrates one embodiment of the switch 1006 and other components in the GLB 102 of FIG. 10A. FIG. 10G illustrates a local routing pool (LRP) 1054, a data port register 1027, an address port register 1030, a MUX 1032, the switch 1006, the shadow memory 1004, the switch memory 1005, a DATAOUT register 1062 and a DATAOUT MUX 1060.

The LRP 1054 in FIG. 10G may enhance switch functionality by loading a routing configuration (A_OUT) to the shadow memory 1004, while the switch 1006 (FIG. 10G) is transferring data from DATAIN to DATAOUT. The LRP 1054 then asserts the UPDATE signal, which loads the routing configuration from the shadow memory 1004 to the main memory 1005 in a single cycle.

In FLOWTHROUGH mode, the memories 1004, 1005 do not have to be updated. Thus, the switch 1006 conforms to the FLOWTHROUGH mode as long as the FLOWTHROUGH signal is asserted. When the FLOWTHROUGH signal is de-asserted, the switch 1006 reverts back to the routing configuration stored in the main memory 1005.

FIG. 10H illustrates a plurality of switch timing parameters for the GLB 102 of FIG. 10A. FIGS. 10I–10L illustrate exemplifying timing diagrams for the GLB 102 of FIG. 10A.

Product Term Circuit in the AND Array

Figure 11B:
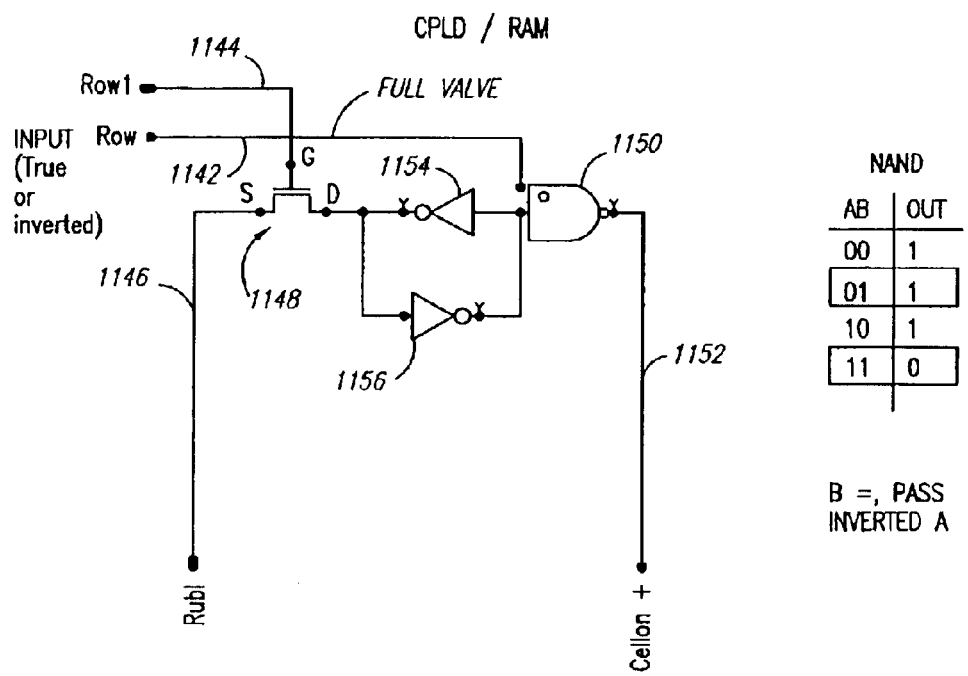
FIG. 11B illustrates one embodiment of a CMOS circuit that may be used in the product term circuit shown in FIG. 11A.
Figures 1, 11A:
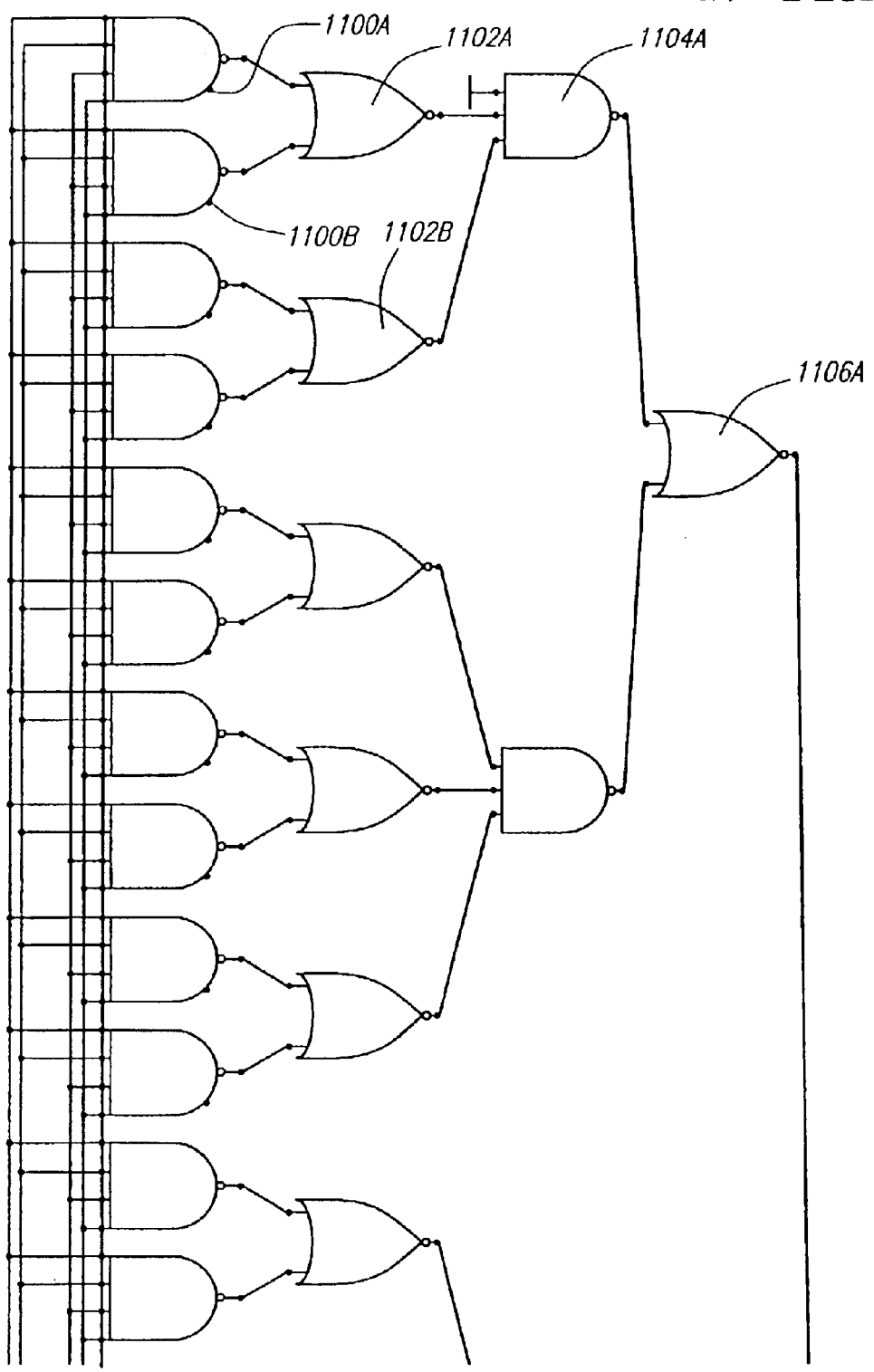
Figures 2, 11A:
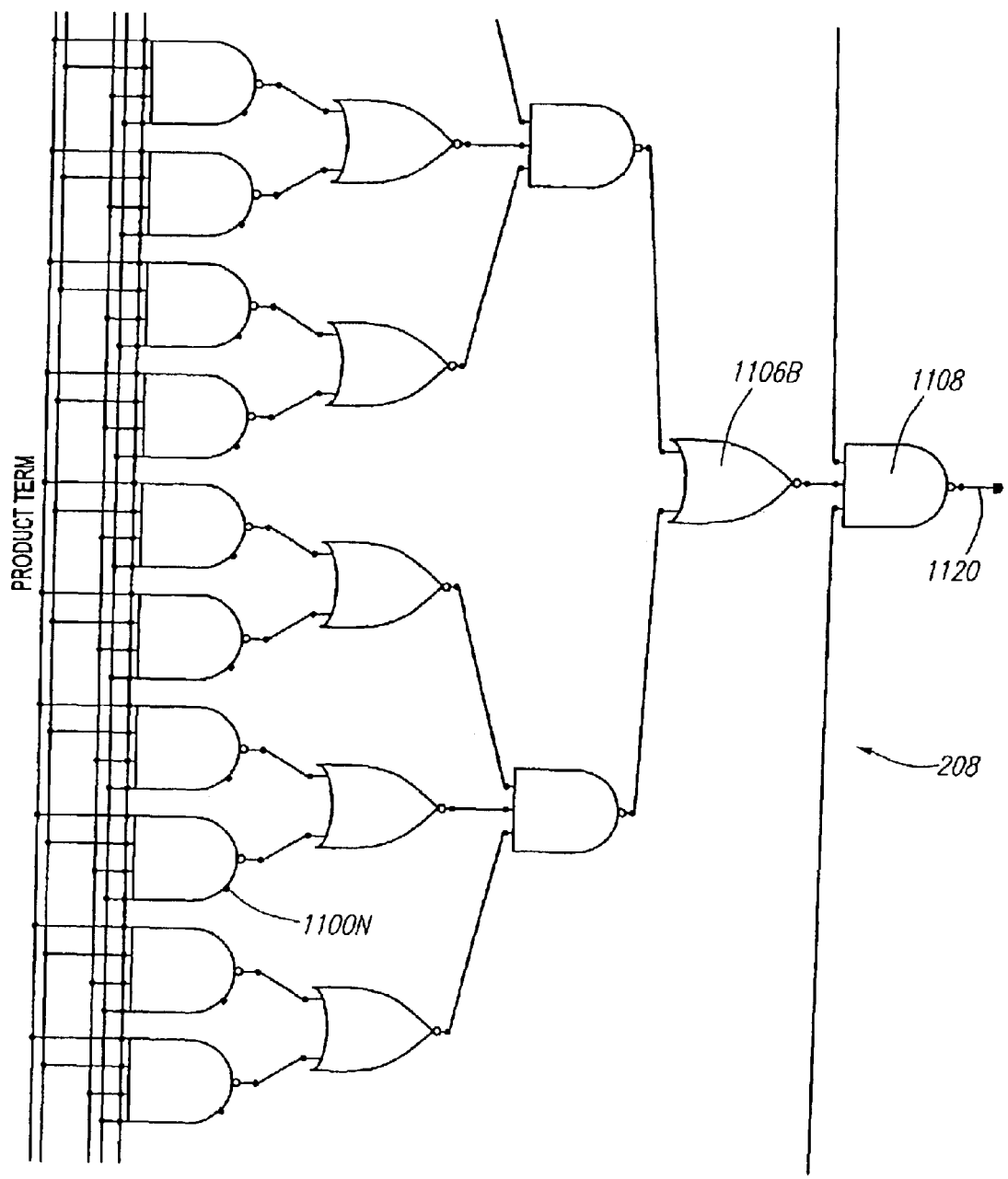
Figures 3, 11A:
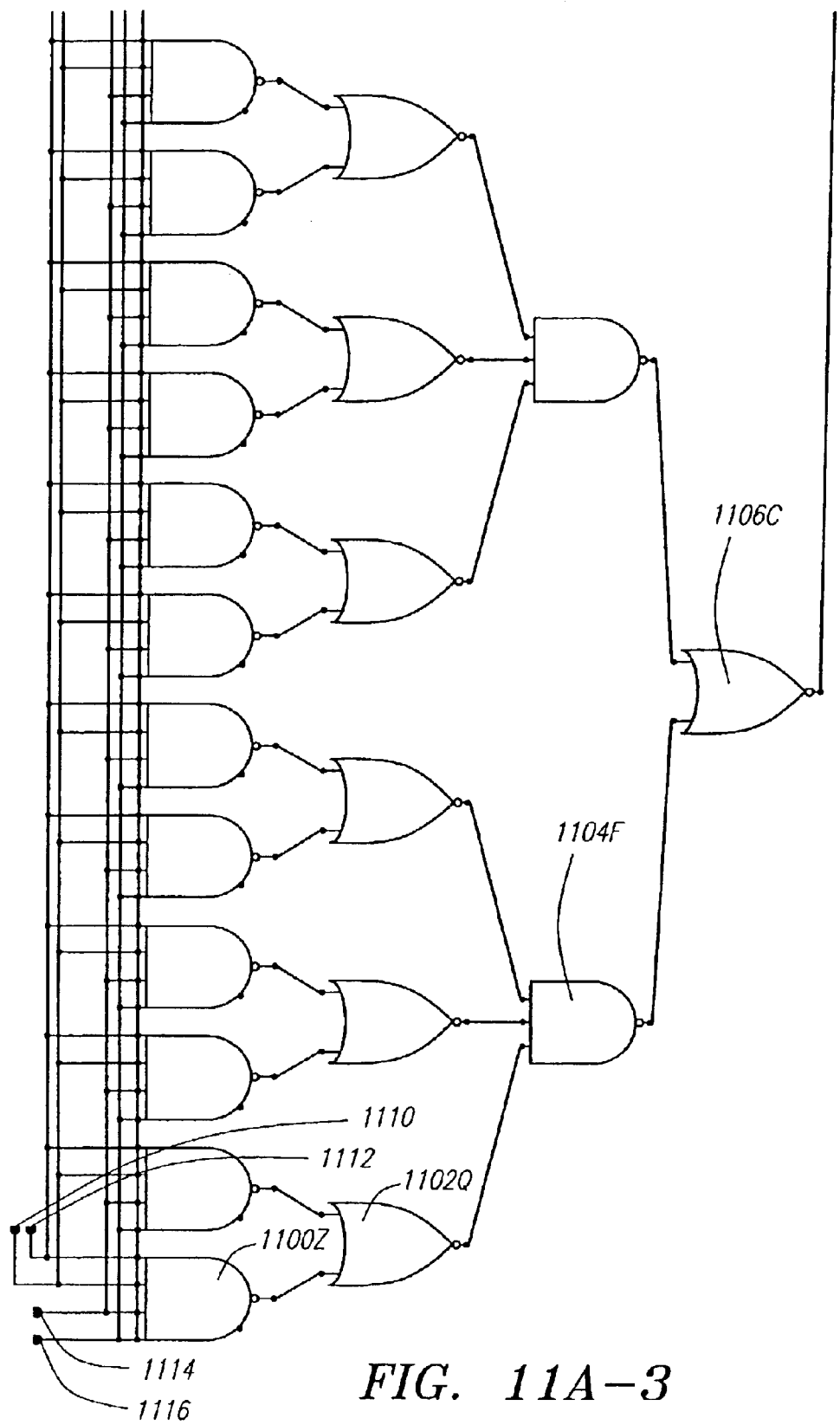

FIG. 11A illustrates one embodiment of one product term circuit 208 in FIG. 2A. The product term circuit 208 in FIG. 11A comprises a plurality of NAND gates 1100A–1100Z, 1104A–1104F, 1108 and NOR gates 1102A–1102Q, 1106A–1106C arranged in various stages as shown in FIG. 11A. Each product term circuit 208 may receive a multiple-bit input, such as a 68-bit input or a 136-bit input, via a write word line (WWL) 1110 and/or a row input line 1112. Lines 1114 and 1116 may receive control signals or additional input signals. The product term circuit 208 is configured to generate a product term output signal from the NAND gate 1108 via line 1120.

In other embodiments, the product term circuit 208 may comprise less or more gates than those shown in FIG. 11A. For example, although 34 NAND gates 1100A–1100Z are shown in a first stage of the product term circuit 208 in FIG. 11A, other configurations of the product term circuit 208 may have less than or more than 34 NAND gates in the first stage.

In one embodiment, each NAND gate 1100 in the first stage of the product term circuit 208 in FIG. 11A comprises a plurality of CMOS circuits. For example, each NAND gate 1100 in the first stage in FIG. 11A may comprise four CMOS circuits, such as the CMOS circuit 1140 in FIG. 11B, the CMOS circuit 1400 in FIG. 14A, the CMOS circuit 1440 in FIG. 14B or the CMOS circuit 1500 in FIG. 15.

Figure 14A:
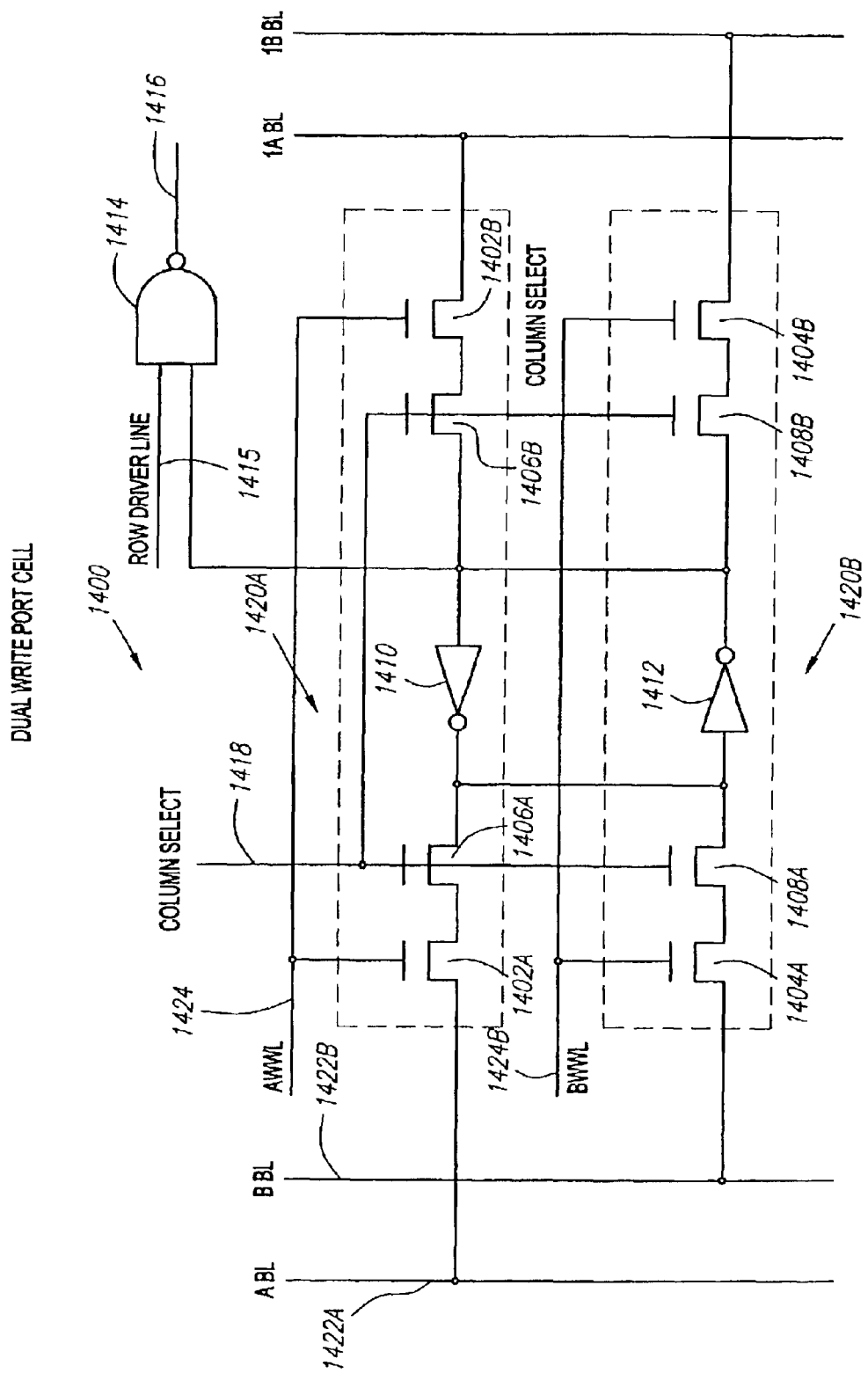
FIG. 14A illustrates one embodiment of a SRAM cell, which is an enhanced version of the SRAM cell in FIG. 11B.
Figure 14B:
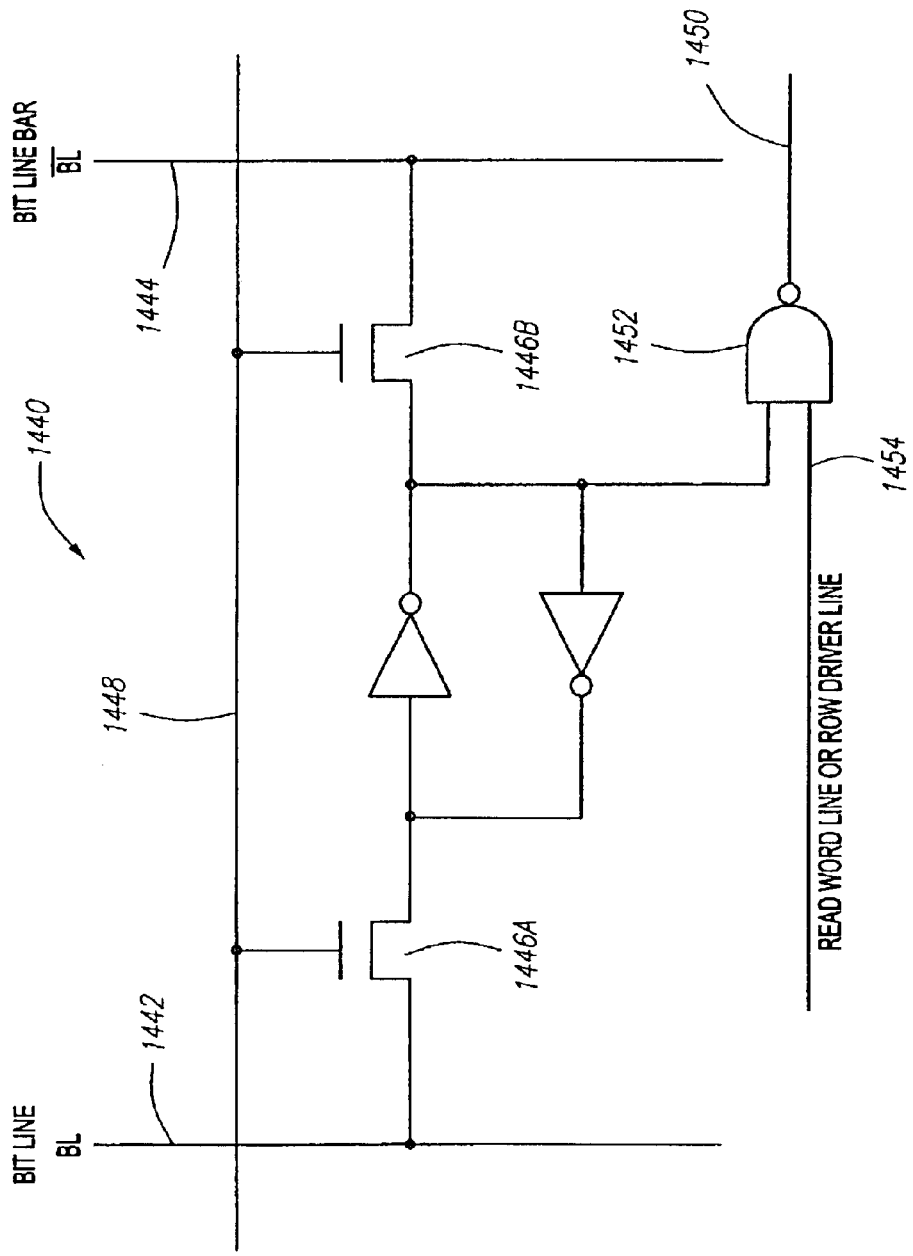
FIG. 14B illustrates another embodiment of a SRAM cell that may be used in the product term circuit in FIG. 11A.
Figure 15:
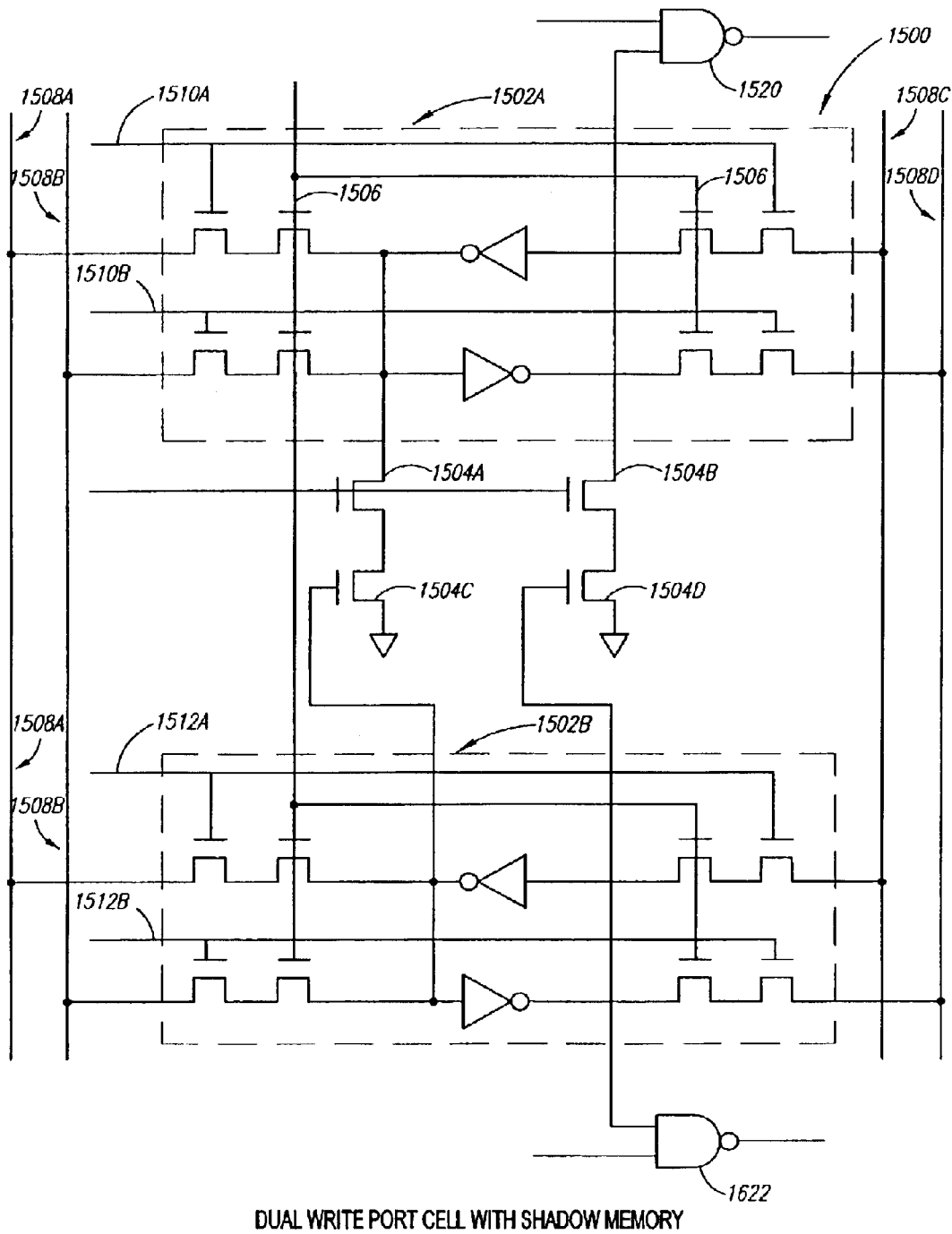
FIG. 15 illustrates one embodiment of a dual write port cell with shadow memory, which can be used in the GLB of FIG. 1A to implement a switch.

In one embodiment, out of 164 product term circuits 208, 36 product term circuits 208 (configured for input routing or product term logic) comprise CMOS circuits, such as the CMOS circuit 1440 in FIG. 14B, and 128 product term circuits 208 (configured for memory or product term logic) comprise CMOS circuits, such as the CMOS circuit 1400 in FIG. 14A or the CMOS circuit 1500 in FIG. 15. In one configuration, out of the 128 product term circuits 208 configured for memory or product term logic, 64 product term circuits 208 comprise CMOS circuits, such as the CMOS circuit 1400 in FIG. 14A, and 64 product term circuits 208 comprise CMOS circuits, such as or the CMOS circuit 1500 in FIG. 15.

In one embodiment, the second, third, fourth and fifth stages of NOR gates 1102A–1102Q, 1106A–1106C, and NAND gates 1104A–1104F, 1108 are standard NOR and NAND gates.

In another embodiment, each product term circuit 208 in FIG. 2A comprises one or more sense amplifiers instead of the structure shown in FIG. 11A.

A CMOS Circuit

FIG. 11B illustrates one embodiment of a CMOS circuit 1140 that may be used in the product term circuit 208 shown in FIG. 11A. The CMOS circuit 1140 in FIG. 11B may also be called an 'SRAM cell,' a 'CMOS cell,' a 5-transistor cell, a 5-T cell or a 'configuration cell.' The CMOS circuit 1140 comprises a row write word line (RWWL) 1144, a row input line 1142, a row write bit line (RWBL) 1146, an n-channel metal oxide semiconductor (NMOS) gate 1148, an inverter 1154, an inverter 1156 (each inverter comprising two transistors), a NAND gate 1150 and an output line (cellout) 1152.

The row write word line 1144 and the row write bit line 1146 in FIG. 11B determine whether an input signal on the row input line 1142 is passed to the output line 1152. The inverters 1154, 1156 may act as a latch.

A product term circuit 208 in FIG. 11A with CMOS circuits, such as the CMOS circuit 1140 shown in FIG. 11B, may perform functions faster, use lower voltage and/or current, and be more scalable than a product term circuit 208 implemented by one or more sense amplifiers.

Figure 13:
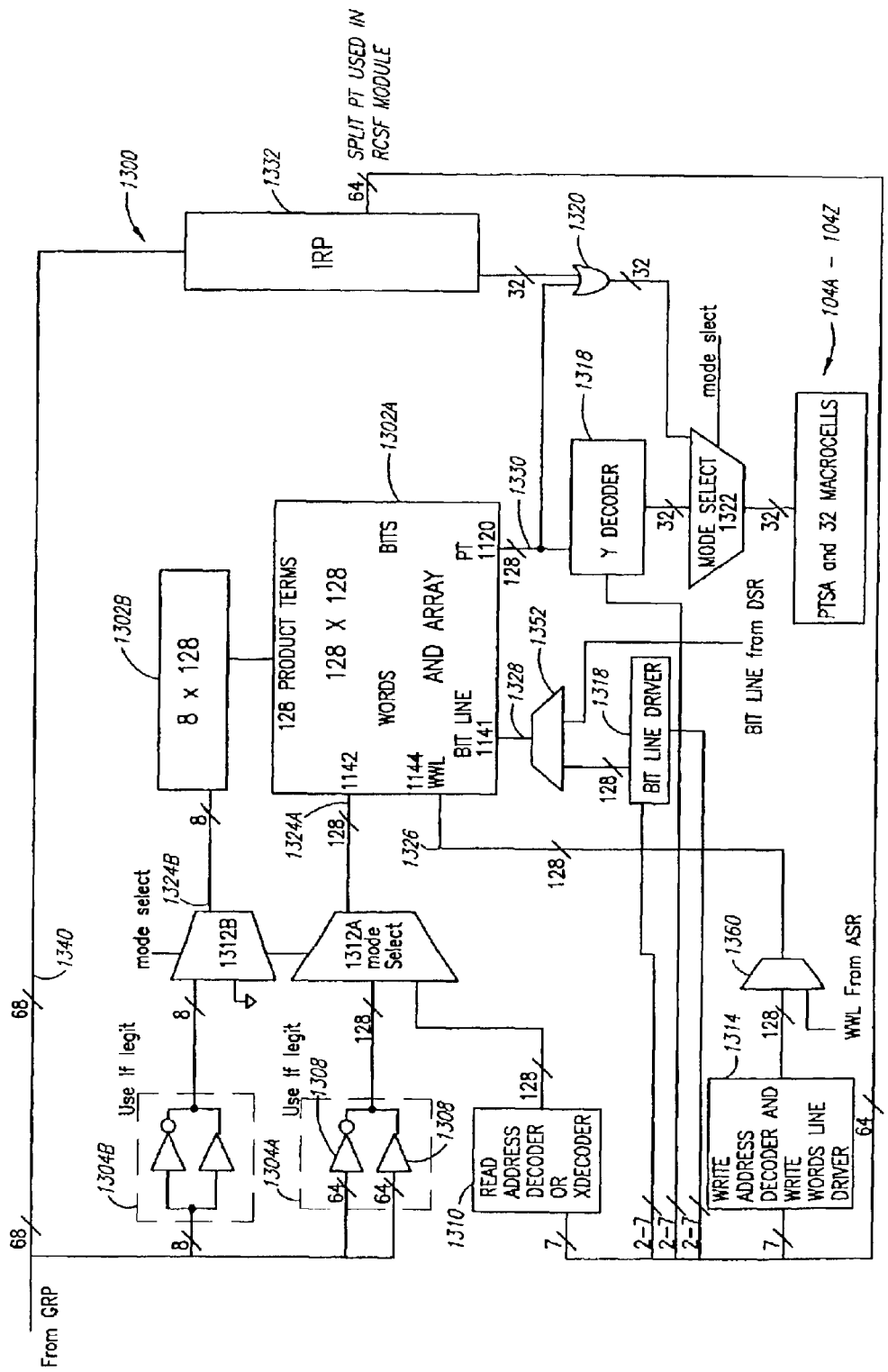
FIG. 13 illustrates one embodiment of a CPLD/RAM circuit, which may represent the GLB in FIGS. 2A, 2B, 6A or 6B.

In FIG. 2A, the AND array 200 of the CPLD 102 comprises a row/column structure. In order to describe the AND array 200 in FIG. 2A consistently with FIGS. 11B and 13, FIG. 2A is described below as rotated clockwise by 90 degrees, with product term columns 208A–208Z and buffered input rows 206A–206Z. Similarly, in order to describe the product term circuit 208 in FIG. 11A consistently with FIGS. 11B and 13, FIG. 11A is described below as rotated clockwise by 90 degrees.

In FIG. 2A (rotated clockwise by 90 degrees), the rows of buffers 206A–206Z are driven by logic inputs. The columns of product term circuits 208A–208Z in FIG. 2A and FIG. 11A form functions (product terms) of the inputs. In one configuration, there are 68 inputs and 68 inverted/complemented inputs, which provide a total of 136 inputs. The function of each product term column is determined by the programmed states of 136 configuration cells. Each configuration cell, such as the cell 1140 in FIG. 11B, controls a row/column crosspoint. In FIG. 11B, when a configuration cell 1140 is programmed by the row write word line (RWWL) 1144 and the row write bit line (RWBL) 1146, the logic input at an input row 1142 is allowed to pass to a corresponding column as an input to the NAND gate 1150.

FIG. 11A (rotated clockwise by 90 degrees) illustrates one product term circuit 208 associated with one product term column in FIG. 2A and rows of inputs. In FIG. 2A, the product terms are connected to OR logic gates 212, 214 and then routed to macrocell inputs.

Split AND Array and Control Logic Overview

As shown in FIGS. 2A–2C, a GLB 102 comprises the AND array 200 in FIG. 2A, which comprises a plurality of SRAM cells, such as the SRAM cell 1140 shown in FIG. 11B, and additional control logic to support various memory functions, as described above with reference to FIGS. 1A–10L and described below with reference to FIGS. 12–18.

Figure 12:
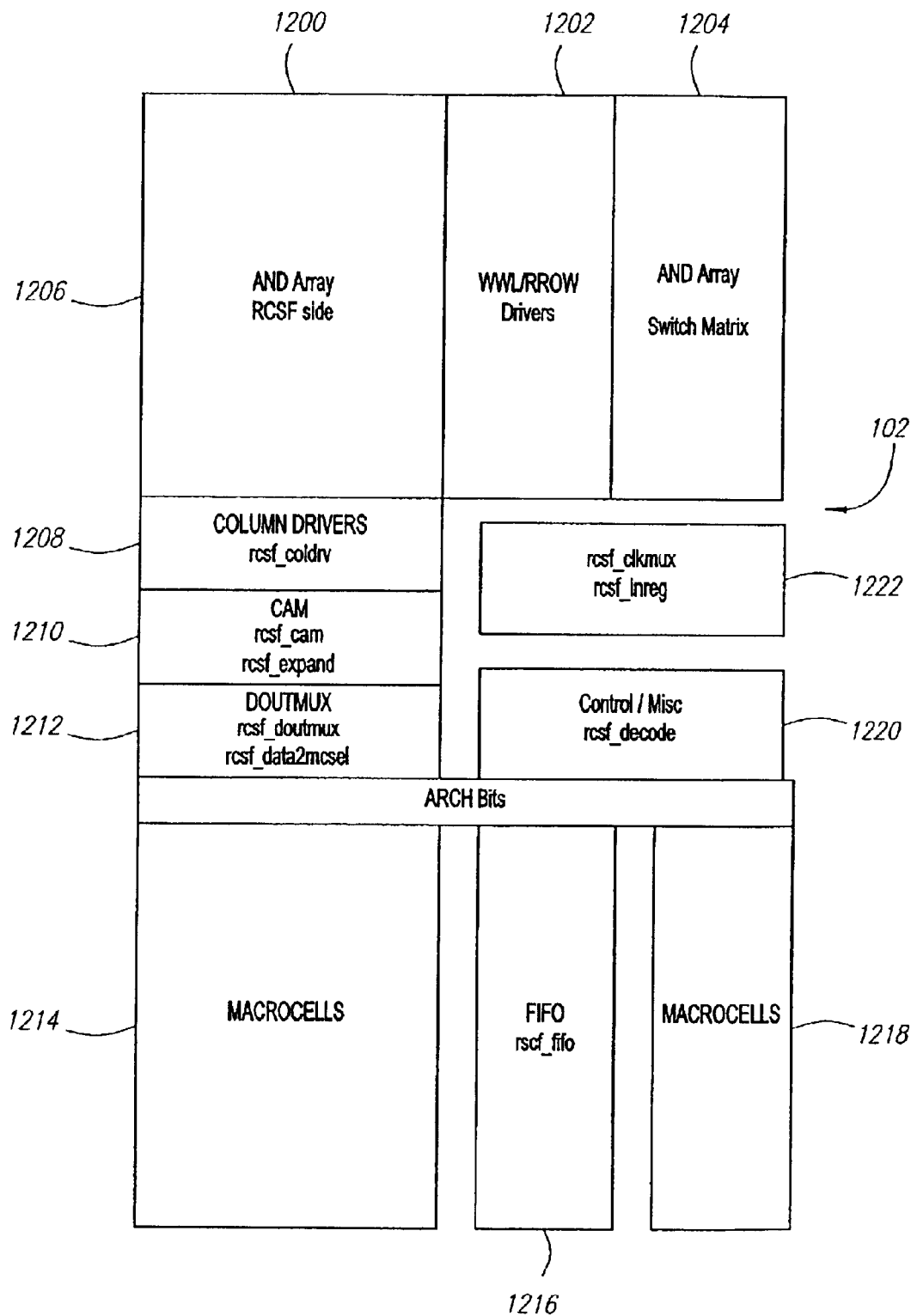
FIG. 12 illustrates one embodiment of the GLB in FIG. 1A.

FIG. 12 illustrates one embodiment of a GLB 102 in FIG. 1A. The GLB 102 comprises a RCSF AND array portion

1200, one or more write word line (WWL)/read row drivers 1202, an input routing AND array portion 1204, one or more column drivers 1206, CAM control logic 1208, a data out multiplexer (DOUTMUX) 1210, RCSF clock MUXes and RCSF input registers 1222, a control/miscellaneous RCSF decoder 1220, architecture configuration cells (ARCH) 1212, a plurality of macrocells 1214, 1218 and FIFO control logic 1216.

In one embodiment, all structures shown in FIG. 12 are implemented in hardware or hardwired logic and are self-contained within a GLB 102 (FIG. 1B), e.g., inside a die. In other words, the GLB 102 in FIG. 12 advantageously does not require logic external to the GLB 102 to perform CPLD, dual-port RAM, ROM, FIFO, CAM and switch functions.

In one embodiment, the RCSF AND array portion 1200 in FIG. 12 comprises 128 AND array product term circuits 208, which are described herein with reference to FIGS. 2A, 11A, 11B, 14A, 14B and 15. In addition, the RCSF AND array portion 1200 may comprise other circuits.

In one embodiment, the input routing AND array portion 1204 comprises 32 AND array product term circuits 208, which are described herein with reference to FIGS. 2A, 4B, 6A, 11A and 11B. The AND array portion 1204 may further comprise four AND array product term circuits 208 that are used for special purposes. The input routing AND array portion 1204 may be coupled to a global routing pool 110 (FIG. 1A) or some other routing structure.

The WWL/RROW drivers 1202 in FIG. 12 may represent address decoders 1310, 1314 in FIG. 13, address decoders 1608A, 1608B in FIG. 16, a row driver 1304 in FIG. 13, row drivers 1604A, 1604B in FIG. 16 and/or a row driver in FIG. 18, which are described below. The WWL/RROW drivers 1202 in FIG. 12 may drive the WWL line 1144 and row input line 1142 in FIG. 11B, WWL lines 1424A, 1424B and a row input line 1415 in FIG. 14A, a WWL line 1448 in FIG. 14B, and/or WWL lines 1510A, 1510B, 1512A, 1512B in FIG. 15.

The column drivers 1206 in FIG. 12 may represent a bit line driver 1316 in FIG. 13, bit line drivers 1610A, 1610B in FIG. 16 and/or a y-decoder 1810 in FIG. 18, which are described below. The column drivers 1206 may drive a column select line 1418 and bit lines 1422A, 1422B in FIG. 14A, bit lines 1442, 1444 in FIG. 14B and/or a column select line 1506 and bit lines 1508A, 1508B in FIG. 15.

The RCSF clock MUXes and RCSF input registers 1222 in FIG. 12 may represent any of the clock MUXes and input registers described herein, such as the input registers 502, 504 in FIGS. 5A–5D, and the clock MUXes 648, 650, 652, 654, 666, 668, 670, 672 and the registers 674, 678, 680, 682 in FIG. 6A.

The CAM control logic 1208 in FIG. 12 may represent one or more priority encoders in FIGS. 8E, 8F, 8K and 18 and a product term expansion circuit (product term expander)(FIG. 4A) with cascaded inputs. For example, the CAM control logic 1208 can cascade the output of the product term circuit 208F with the product term circuit 208F' in FIG. 4A to form a product term based on 136 inputs (68 inputs×2) and expand the width of a CAM.

Figure 16:
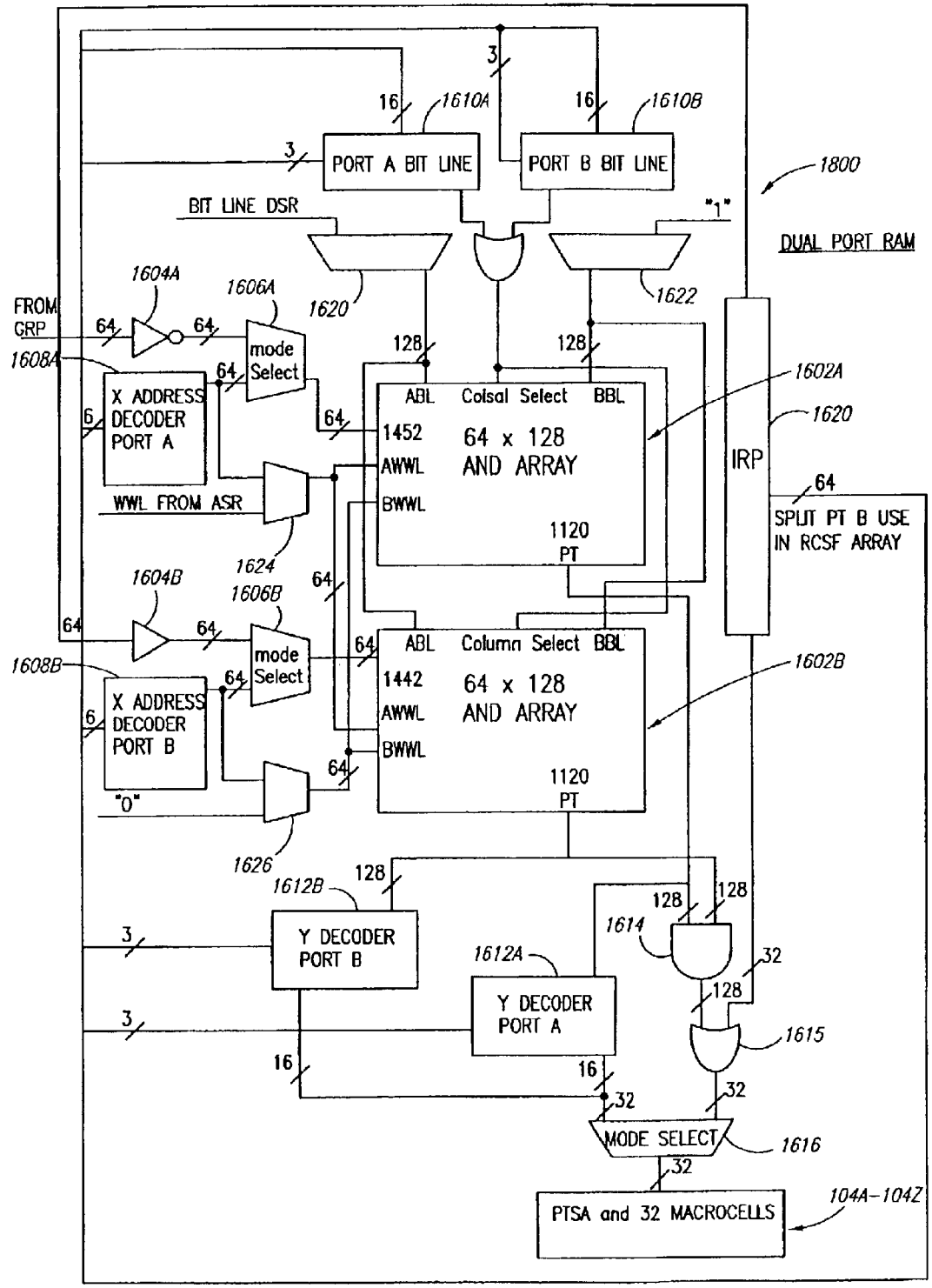
FIG. 16 illustrates one embodiment of a dual-port RAM circuit, which may represent the GLB in FIG. 2C, 7A or 7B.

The data out multiplexer (DOUTMUX) 1210 in FIG. 12 may represent a y-decoder 1318 and a mode select circuit 1322 in FIG. 13, and/or y-decoders 1612A, 1612B and a mode select 1618 in FIG. 16. As described below, the y-decoder 1318 in FIG. 13 and the y-decoders 1612A, 1612B in FIG. 16 may comprise a plurality of multiplexers.

The architecture configuration memory cells (ARCH) 1212 in FIG. 12 are configured to store configuration bits that control the PTSA 202 (FIG. 2A). The architecture configuration cells (ARCH) 1212 may store configuration bits that control other circuits described herein, such as mode select circuits 1312, 1322, 1606A, 1606B, 1618 in FIGS. 13 and 16, the macrocells 104A–104Z (FIG. 2A), etc. In one embodiment, the architecture configuration memory cells (ARCH) 1212 comprise a plurality of memory cells, such as the memory cell 1140 in FIG. 11B.

Figure 17:
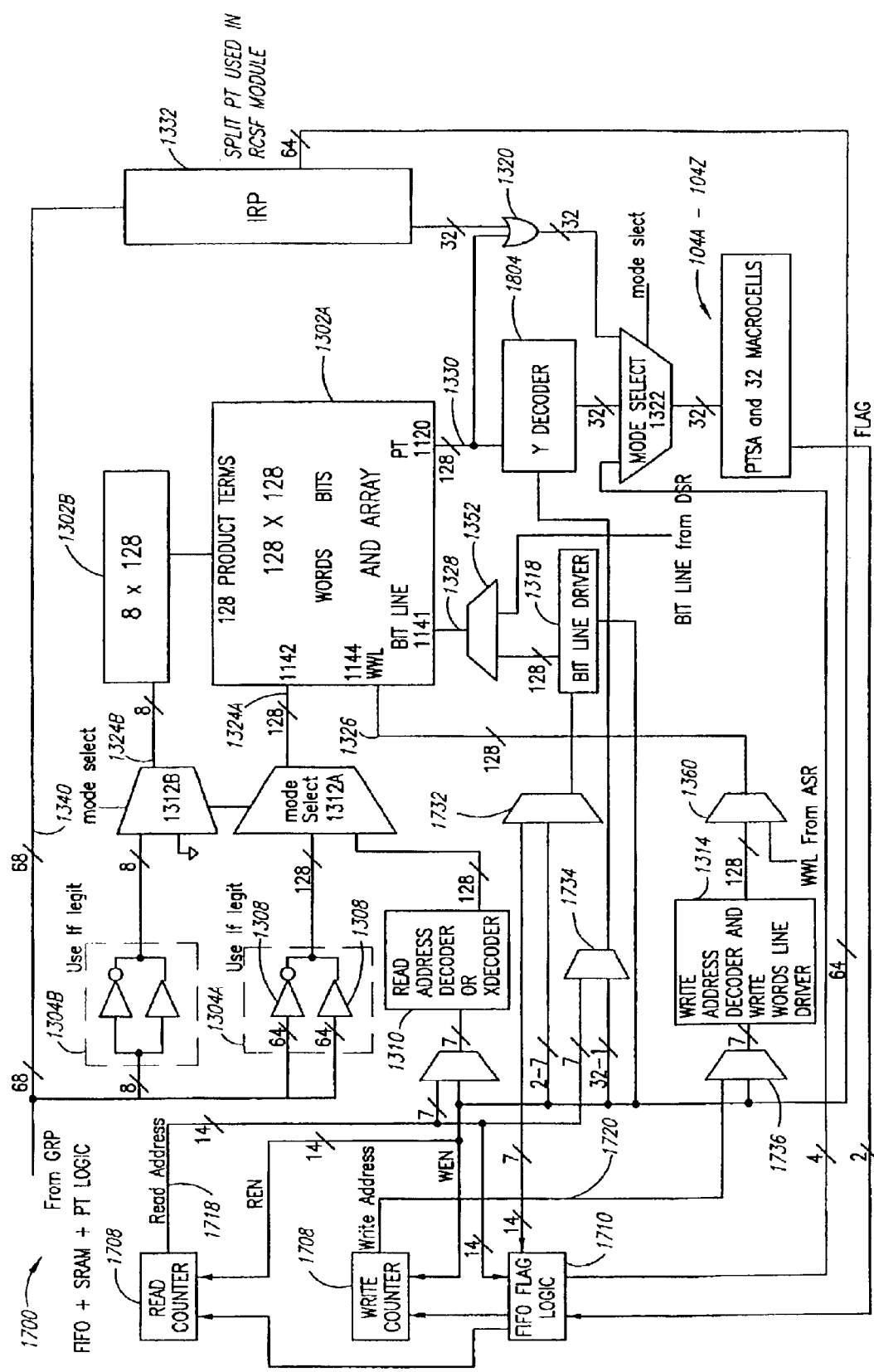
FIG. 17 illustrates one embodiment of a FIFO circuit, which may represent the GLB in FIG. 2B, 9A or 9E.

The FIFO control logic 1216 in FIG. 12 may represent read and write address decoder logic 902, 904, flag logic and pointers 944, 948 in FIG. 9A and/or read and write counters 1706, 1708 and FIFO flag logic 1710 in FIG. 17.

CPLD/RAM Circuit with Control Logic

FIG. 13 illustrates one embodiment of a CPLD/RAM circuit 1300, which may represent the GLB 102 in FIGS. 2A, 2B, 6A or 6B. The circuit 1300 in FIG. 13 comprises two portions 1302A, 1302B of the AND array 200 in FIG. 2A and additional logic to function as either a memory (SRAM/RAM) or a CPLD.

The additional logic comprises row drivers 1304A, 1304B, a read x-address decoder ('x-decoder') 1310, mode select circuits 1312A, 1312B, a write address decoder and write word line (WWL) driver 1314, a bit line driver or drivers 1316, select circuits 1350, 1352, a read column-address decoder ('y-decoder') 1318, an array 1320 of OR gates, another mode select circuit 1322, a PTSA 202 and a set of macrocells 104A–104Z (FIG. 2A). Each row driver 1304 may comprise a plurality of buffers and inverters. In one configuration, for example, the row driver 1304A comprises 64 buffers and 64 inverters, and the row driver 1304B comprises 4 buffers and 4 inverters.

The mode select circuit 1312A receives configuration bits for CPLD mode or RAM mode from the circuit 1312B and then selects either the output of the row driver 1304A (CPLD mode) or the output of the read address decoder 1310 (RAM mode) to send to the AND array portion 1302A via lines/bus 1324A.

In one embodiment, to perform CPLD functions, the row drivers 1304A and 1304B receive and pass 68 input bits and their 68 inverted input bits (136 total) to the mode select circuits 1312A and 1312B. The mode select circuits 1312A and 1312B pass the 136-bit output of the row drivers 1304A and 1304B to the AND array portions 1302A and 1302B via lines/bus 1324A and 1324B to implement product term logic. The combined AND array portions 1302A and 1302B send 128 outputs to the array 1320 of OR gates, and the mode select circuit 1322 passes the outputs of the array 1320 to the PTSA 202 and 32 macrocells 104A–104Z (FIG. 2A). The array 1320 of OR gates may represent an array of 32 6-input OR gates 212 (FIG. 2A) and/or an array 32 5-input OR gates.

A second AND array portion 1332 (e.g., an input routing pool (IRP)) takes the same 68 inputs from the GRP and generates another 32 product terms for a total of 160 product terms to send to the array 1320 of OR gates.

In RAM mode, one configuration of the AND array portion 1302A in FIG. 13 stores 128 words, where each word comprises 128 bits. The 128 bits are the result of 128 product terms. The AND array portion 1302A may be configured to function as any one of the RAM configurations listed in FIG. 6D.

To perform a RAM read function, the read address decoder 1310 receives and decodes a 7-bit address to select one of 128 possible memory row entries ($2^7$=128) in the AND array portion 1302A to be read. The read address decoder 1310 sends one active signal ('1') on one of 128 lines to the mode select circuit 1312A and '0s' on the other 127 lines to the mode select circuit 1312A. Thus, the read address decoder 1310 may be described as a '1-hot' decoder circuit. In another configuration, the read address decoder 1310 is configured to send one '0' on one of 128 lines to the mode select circuit 1312A and send '1s' on the other 127 lines to the mode select circuit 1312A.

The mode select circuit 1312A sends the output of the read address decoder 1310 to the AND array portion 1302A via lines/bus 1324A. The row input line 1142 in FIG. 11B is a part of the lines/bus 1324A in FIG. 13. The output of the read address decoder 1310 selects a row of 128 SRAM cells (e.g., cell 1140 in FIG. 11B or cell 1400 in FIG. 14A). The output of the read address decoder 1310 selects one SRAM cell from each product term circuit 208 (FIG. 11A) in the AND array portion 1302A (FIG. 13) to output via lines/bus 1330. The output line 1120 in FIG. 11A is a part of the lines/bus 1330 in FIG. 13. In RAM read mode, the AND array portion 1302A outputs a 128-bit output to the y-decoder 1318 (used in RAM mode) via lines/bus 1330.

The y-decoder 1318 allows the output of the AND array portion 1302A to be configurable to various data widths. In one configuration, the y-decoder 1318 is configurable to act as a 4-to-1 multiplexer (MUX) to output 32 of 128 bits at a time. In other configurations, the y-decoder 1318 is configurable to act as an 8-to-1 MUX to output 16 bits at a time, a 16-to-1 MUX to output 8 bits at a time, a 32-to-1 MUX to output 4 bits at a time, a 64-to-1 MUX to output 2 bits at a time, or an 128-to-1 MUX to output 1 bit at a time.

The mode select circuit 1322 selects either the outputs of the y-decoder 1318 (RAM mode) or the outputs of the OR gate array 1320 (CPLD mode) to send to the PTSA 202 and macrocells 104A–104Z.

Another AND array 1332 (FIG. 13), also called an input routing pool (IRP), generates 64 outputs from 68 GRP inputs. The 64 outputs are used by the circuit 1300 configured as a RAM as address, input data, control signals and other things.

To perform a RAM write function, the write address/write word line (WWL) driver 1314 receives and decodes a 7-bit address to select one of 128 possible memory row entries ($2^7$=128) in the AND array portion 1302A to write data. The write address decoder 1314 sends a single ('1' or '0') on one of 128 lines 1326 to the AND array portion 1302A via the select circuit 1350, which receives a WWL signal from an address shift register (ASR). The row write word line (RWWL) 1144 in FIG. 11B is a part of the lines/bus 1326 in FIG. 13.

The bit line driver 1316 receives a 32-bit word and a 2-bit address (00, 01, 10, 11) to select which group of 32 bits to write at one time in a row of 128 SRAM cells (see FIG. 11B or 1140 in FIG. 14B), which is activated by the write address decoder 1314. The bit line driver 1316 sends an output to the AND array portion 1302A via select circuit 1352 and lines/bus 1328. The select circuit 1352 receives a bit line input from a data shift register (DSR). The row write bit line (RWBL) 1146 in FIG. 11B, or Bit Line 1442, Bit Line Bar 1444 in FIG. 14B, is a part of the lines/bus 1328 in FIG. 13.

Figure 13A:
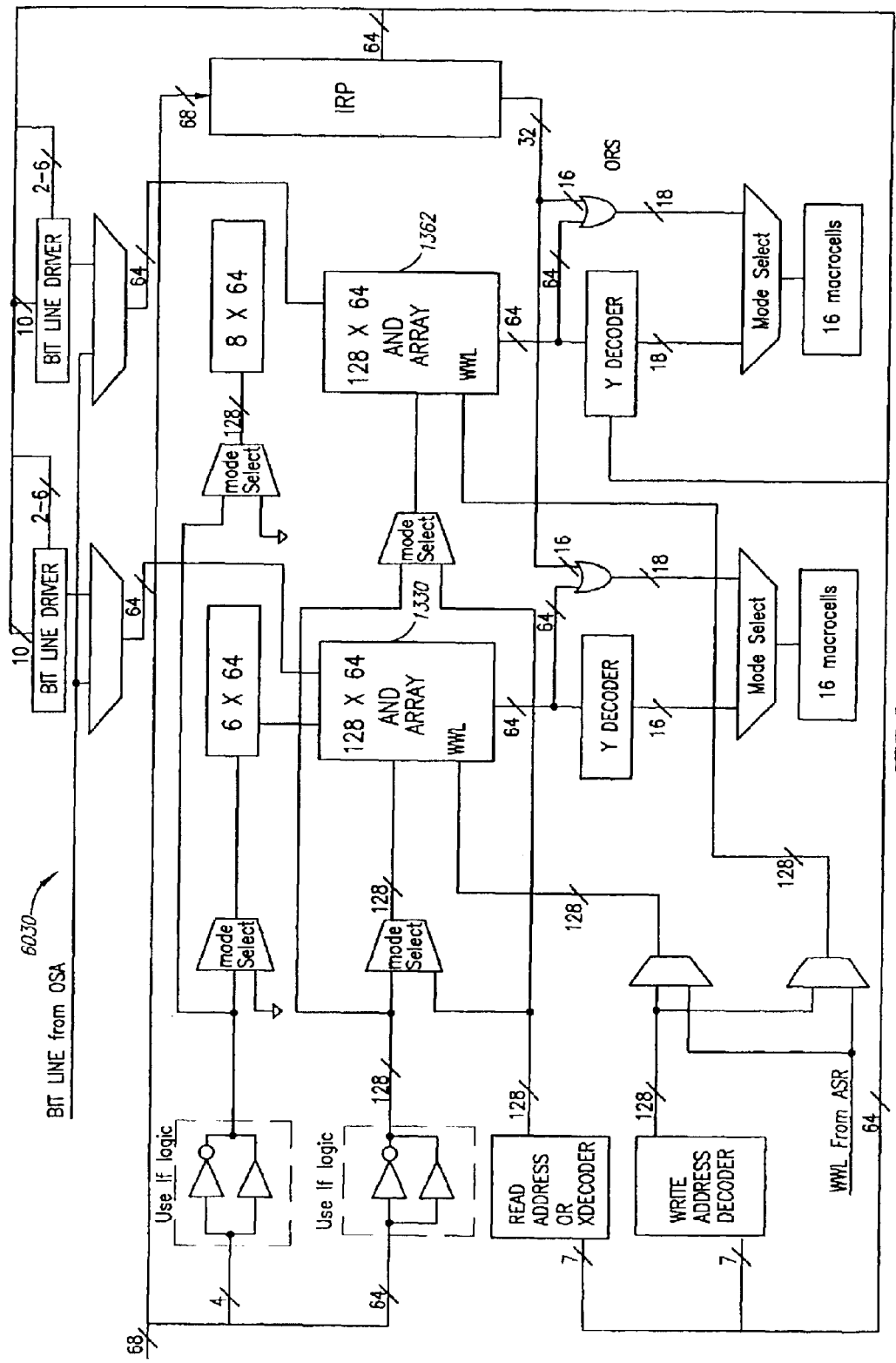
FIG. 13A illustrates one embodiment of a CPLD/RAM circuit with a half of the AND array of FIG. 13 used for logic and another half of the AND array used for memory.

FIG. 13A illustrates one embodiment of a CPLD/RAM circuit with a half 1360 of the AND array 1302A of FIG. 13 used for logic and another half 1362 of the AND array 1302A used for memory. In general, the AND array 1302A may be "split" (functionally, not necessarily physically) where each portion may perform a function in logic mode or a memory mode independently from another portion.

A Dual-Write Port SRAM Cell

In one embodiment, the product term circuits 208 (FIGS. 2A, 11A) in the input routing AND array portion 1204 in FIG. 12 (e.g., the split AND array switch matrix 624A for input routing in FIG. 6A) comprises a plurality of CMOS circuits 1140 of FIG. 1B. In comparison, the product term circuits 208 (FIGS. 2A, 11A) in the RCSF AND array portion 1200 in FIG. 12 (e.g., the SRAM block 600A in FIG. 6A) comprises a plurality of SRAM cells 1400 of FIG. 14A.

FIG. 14A illustrates one embodiment of a SRAM cell 1400 (also called a "dual-port RAM cell"), which is an enhanced version of the SRAM cell 1140 in FIG. 11B. The SRAM cell 1400 in FIG. 14A comprises two sets of independent row input bit lines (ABL, /ABL and BBL, /BBL) 1422A, 1422B, 1422C, 1422D, two independent row write word lines (AWWL and BWWL) 1424A, 1424B, a column select line 1418, eight NMOS gates 1402A, 1404A, 1410A, 1412A, 1402B, 1404B, 1410B, and 1412B, two inverters 1410, 1412, a NAND gate 1414, a row driver line 1415 and an output line 1416. The SRAM cell 1400 in FIG. 14A is configured to store one bit of data.

In one embodiment, SRAM cells such as cell 1400 in FIG. 14A allow the GLB 102 in FIG. 2C to provide a dual-port RAM. The SRAM cell 1400 in FIG. 14A has two independent row write word lines AWWL 1424A and BWWL 1424B coupled to two write wordline drivers (e.g., drivers 1608A, 1608B in FIG. 16) and two sets of independent row write bit lines ABL 1422A, /ABL 1422C and BBL 1422B, /BBL 1422D coupled to two bitline drivers (e.g., bit line drivers 1610A, 1610B in FIG. 16) to support a dual-port SRAM (port A and port B). The word line BWWL 1424B and bit lines BBL 1422B, /BBL 1422D are included to support an additional write port (port B) for a dual-port RAM.

Data may be written on a row-by-row basis by selecting one of the write word lines AWWL 1424A or BWWL 1424B and applying data to the corresponding sets of bit lines ABL 1422A, /ABL 1422C or BBL 1422B, /BBL 1422D. The column select line 1418 is driven by a column address decoder (Y decoder) 1612B (FIG. 16) for write logic to write selected words in the row. This is useful for applications where a data width is less than the row width, i.e., where each row comprises more than one word, e.g., each row comprises 4 words of 32 bits (4×32=128 bits per row). The column select line 1418 is asserted when either port A or port B is selected. Data may be read/output, such as during a verify period, by selecting the row line driver 1415 on a row-by-row basis.

In one embodiment, dual port read is achieved by reading from each port's write word lines and bit lines. This embodiment may have sense amplifiers attached to bit line A and bit line B.

In another embodiment, the read path NAND 1414 and row driver line for each port is duplicated. Since the SRAM cell 1400 in FIG. 14A has only one read port 1416, another way to achieve dual-port read is by writing duplicated copies to two halves of the AND array portion 1302A (FIG. 13). In other words, to support dual-port RAM read operations, the AND array portion 1302A (FIG. 13) may be split into two halves 1602A, 1602B (FIG. 16). The two halves 1602A, 1602B have identical contents and may be read independently by two read ports.

In other embodiments, the product term circuit 208 in FIG. 11A may use various configurations of SRAM cells, such as a 6-transistor (6-T) cell in FIG. 14B.

FIG. 14B illustrates another embodiment of a SRAM cell 1440 that may be used in the product term circuit 208 in FIG. 11A. The SRAM cell 1440 in FIG. 14B comprises two NMOS gates 1446A, 1446B, two inverters (each inverter comprises 2 transistors), a NAND gate 1452, a bit line (BL) 1442, a bit line bar 1444 (or 'bit bar line'), a read port 1450, and a read word line 1454. The read word line 1454 in FIG. 14B is similar to the row driver line 1415 in FIG. 14A.

A Dual Write Port Cell with Shadow Memory

FIG. 15 illustrates one embodiment of a circuit 1500 that comprises a dual write port cell 1502A and a shadow memory cell 1502B, which can be used in the GLB 102 of FIG. 1A to implement a switch (e.g., main memory array 1005 and shadow memory array 1004 in FIG. 10A). The dual write port cell 1502A is stacked with a shadow memory cell 1502B via a plurality of NMOS gates 1504A–1504D. In a 'shadow memory' method, data is first written into every other cell or cells in 'even' rows, such as cell 1502B. In an 'update' cycle, the data written in one cell may be loaded (written or updated) into a neighboring cell, such as cells in 'odd' rows, such as cell 1502A. The NMOS gates 1504A–1504D control loading signals from the bottom cell 1502B to the top cell 1502A.

In one embodiment, the circuit 1500 may further comprise two NAND gates 1520 and 1522.

Dual-Port RAM Circuit

FIG. 16 illustrates one embodiment of a dual-port RAM circuit 1600, which may represent the GLB 102 in FIG. 2C, 7A or 7B. The dual-port RAM circuit 1600 comprises an array of 64 inverters 1604A, a port A x-address decoder 1608A, a port A mode select 1606A, an array of buffers 1604B, a port B x-address decoder 1608B, a port B mode select 1606B, a port A bit line driver 1610A, a port B bit line driver 1610B, an AND array portion 1602A, another AND array portion 1602B, a port A y-address decoder 1612A, a port B y-address decoder 1612B, an array 1614 of AND gates, an array 1616 of OR gates, a mode select 1618, select circuits 1620–1626, a PTSA 202 and 32 macrocells 104A–104Z (FIG. 2A).

The operation of the dual-port RAM circuit 1600 in FIG. 16 is similar to the CPLD/RAM circuit 1300 in FIG. 13, except the AND array portion 1302A (FIG. 13) is split into two halves 1602A, 1602B to provide dual-port read and dual-port write.

In one embodiment, the two AND array portions 1602A, 1602B are not separated physically but are shown as separate portions for the purposes of illustration. The two AND array portions 1602A, 1602B may comprise even and odd rows of CMOS circuits, respectively, such as the CMOS circuits 1400, 1500 shown in FIGS. 14 and 15. In another embodiment, the two AND array portions 1602A, 1602B comprise top and bottom portions of an AND array 200 (FIG. 2A).

In RAM-mode operation, the port A x-decoder 1608A may decode port A addresses and write the same data to both AND array portions 1602A, 1602B simultaneously. The port B x-decoder 1608B may decode port B addresses and write data to both AND array portions 1602A, 1602B simultaneously. Likewise, the port A bit line driver 1610A may activate 'A' bit lines in both AND array portions 1602A, 1602B simultaneously. The port B bit line driver 1610B may activate 'B' bit lines in both AND array portions 1602A, 1602B simultaneously. Thus, the AND array portions 1602A, 1602B will both store the same data.

If the port A and port B x-decoders 1608A, 1608B and bit line drivers 1610A, 1610B attempt to write to the same memory location in one of the AND array portions 1602A, 1602B, then the data written is not valid. The circuit 1600 may assert an error flag.

In another embodiment, the port A x-decoder 1608A writes data to the AND array portion 1602A, and the port B x-decoder 1608B writes data to the AND array portion 1602B. If data is written to the AND array portion 1602A, then the data is copied to the AND array portion 1602B. Similarly, if data is written to the AND array portion 1602B, then the data is copied to the AND array portion 1602A.

Two independent port y-decoders 1612A, 1612B in FIG. 16 may read the data written in the AND array portions 1602A and 1602B and transfer the data to the mode select 1618 and then to 32 macrocells 104A–104Z via the PTSA 202.

In CPLD mode, the mode select 1606B may pass 64 buffered inputs to the AND array portion 1602B. The mode select 1606A may pass 64 inverted inputs to the AND array portion 1602A. The two AND array portions 1602A, 1602B produce outputs to an array 1614 of AND gates, where each AND gate may be the AND gate 1108 in FIG. 11A or AND gate circuit 402 in FIG. 4B. The array 1614 of AND gates produces outputs to the array 1616 of OR gates. The array 1616 of OR gates may represent an array of 32 6-input OR gates 212 (FIG. 2A) and/or an array of 32 5-input OR gates 214. The array 1616 of OR gates may transfer the data to the PTSA 202 (FIG. 2A) and 32 macrocells 104A–104Z.

FIFO Circuit

FIG. 17 illustrates one embodiment of a FIFO circuit 1700, which may represent the GLB 102 in FIG. 2B, 9A or 9E. The FIFO circuit 1700 comprises a read counter/pointer 1706, a read address line 1718, a write counter/pointer 1708, a write address line 1720, an SRAM portion 1302A, a read data output line 1330, FIFO flag logic 1710, a mode select 1322, select circuits 1730–1736 and 32 macrocells 104A–104Z (FIG. 2A), among other components described above with FIG. 13. In one embodiment, the read counter/pointer 1706, write counter/pointer 1708 and FIFO flag logic 1710 comprise hardwired logic, which may also be called 'FIFO control logic.'

In one embodiment, the read counter 1706 and half of the FIFO flag logic 1710 in FIG. 17 are equivalent to the flag logic and flag pointer 944 in FIG. 9A. Similarly, the write counter 1708 and half of the FIFO flag logic 1710 in FIG. 17 are equivalent to the flag logic and flag pointer 948 in FIG. 9A.

The read counter/pointer 1706 in FIG. 17 sends an address of the next FIFO memory location to be read/output via the read data line 1330 to the AND array portion 1302A. The write counter/pointer 1708 sends an address of the next FIFO memory location to be written to the AND array portion 1302A. In one embodiment, the FIFO circuit 1700 further comprises a read clock line and a write clock line that are independent and asynchronous.

The SRAM portion 1302A in FIG. 17 represents an AND array configured as SRAM to store data.

A RCLK line, WCLK line, and write data line may all connected to IRP 1332. The mode select 1322 in FIG. 17 is equivalent to the mode select 1322 in FIG. 13. The SRAM 1302A is configured to match a FIFO data width.

The FIFO flag logic 1710 compares the values of the read counter 1706 and write counter 1708. For example, the FIFO flag logic 1710 may subtract the read counter 1706 from the write counter 1708 to determine an actual depth of the memory 1302A. The FIFO flag logic 1710 may then compare the actual depth of the memory 1302A with a predetermined depth value to determine whether the memory 1302A is full. The FIFO flag logic 1710 in FIG. 17 may assert a FULL flag when the memory 1302A is full (read counter 1706=write counter 1708), an EMPTY flag when the memory 1302A is empty, an ALMOST FULL flag and an ALMOST EMPTY flag. The FULL flag causes the write counter 1708 to stop writing data to the memory 1302A.

The FIFO flag logic 1710 may have timing circuits to handle two time domains, one time domain for the read counter 1706 and another time domain for the writer counter 1708, and avoid oscillations of the flags. Thus, the FIFO flag logic 1710 may protect the integrity of data stored in the memory 1302A, i.e. prevent overwriting or losing data. The FIFO flag logic 1710 may output flag statuses to other circuits.

CAM Circuit

Figure 18:
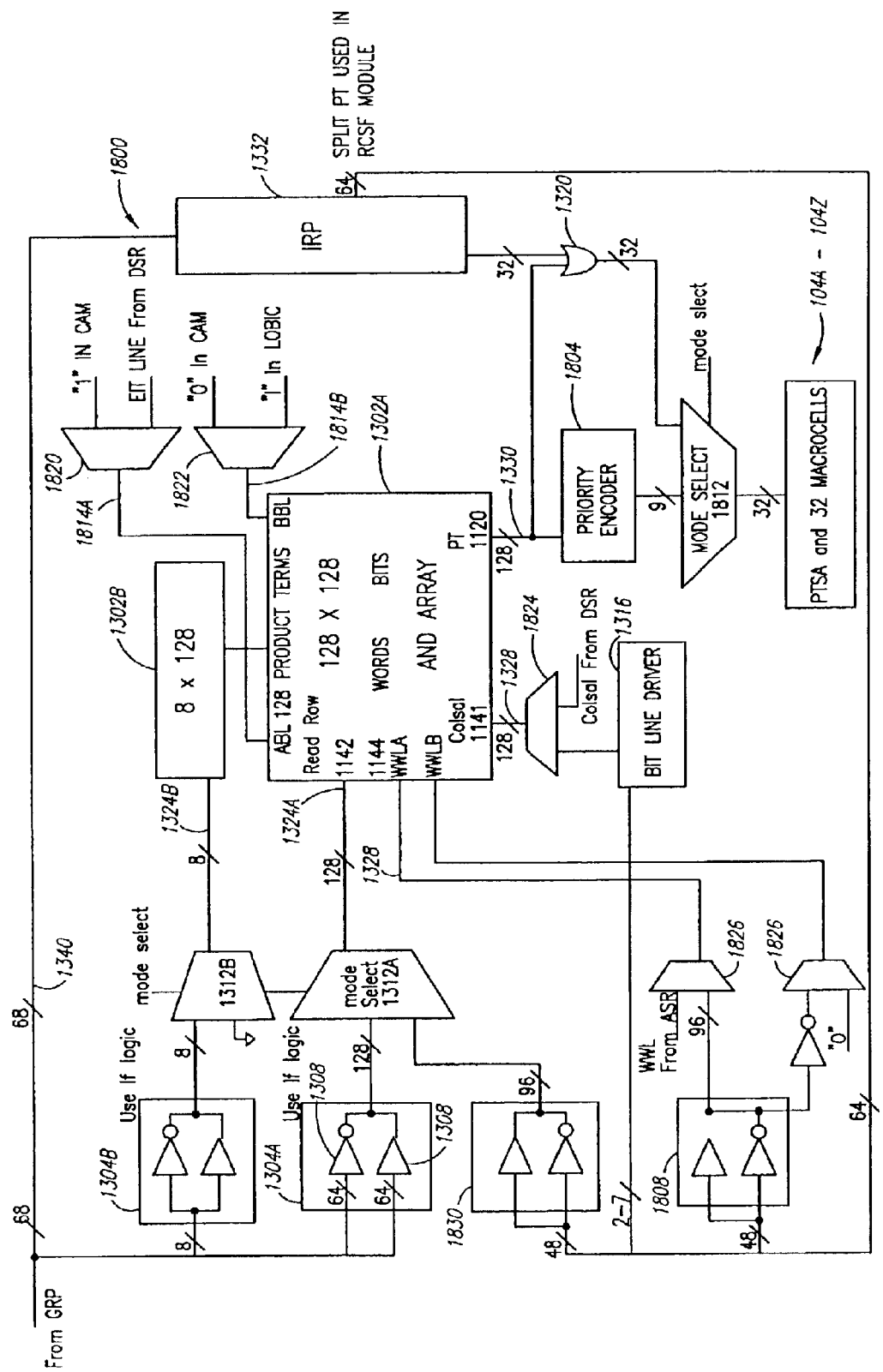
FIG. 18 illustrates one embodiment of a CAM circuit, which may represent the GLB in FIG. 2B, 8A, 8C or 8F.

FIG. 18 illustrates one embodiment of a CAM circuit 1800, which may represent the GLB 102 in FIGS. 2B, 8A, 8C or 8F. The CAM circuit 1800 comprises a CAM AND array portion 1302A, row drivers 1304A and 1830, an x-address decoder 1808, a bit line driver (y-decoder) 1316, a priority encoder 1804, select circuits 1820, 1822, 1824, 1826, 1828 and a mode select 1812, among other components described above with FIG. 13. The CAM AND array portion 1302A is configured to compare an input word with words stored in the CAM AND array portion 1302A, and then output addresses of any matching entries to the priority encoder 1804.

Each CAM 'bit' is represented by two SRAM bits in the CAM AND array portion 1302A. When writing a word A, the CAM circuit 1800 writes each bit AI to its true and complement forms AI and /AI (also called "AIbar") to two SRAM cells in the CAM AND array portion 1302A. As shown in FIG. 18, the CAM circuit 1800 may receive a 48-bit data input (other input lines may be used for control signals or other functions), and the AND array portion 1302A may implement a 48-bit wide, 128-word deep CAM. In another configuration, the AND array portion 1302A may implement a 68-bit wide, 128-word deep CAM. As mentioned above, the product term inputs of multiple GLBs 102 may be cascaded. For example, if four GLBs 102 are cascaded, then a 4×48=192-bit wide, 128-word deep CAM may be implemented (for applications such as a 192-bit Internet address) without external logic.

The CAM compare function may be implemented as a CPLD product term (one column or one product term circuit 208 FIG. 11A) in the AND array 200 in FIG. 2A). When comparing a stored word A (A0–AN) with an input word B (B0–BN), the CAM AND array portion 1302A generates a CPLD product term function of PIT=A0*(/B0)+(/A0)*B0+ . . . +AN*(/BN)+(/AN)*BN. Here the '*' represents AND, and '+' represents OR. The above equation can be re-written to /PT=(A0 XNOR B0)* . . . *(AN XNOR BN). That is two words compared bit-by-bit. The PT is only asserted when every bit of the two words match. The CPLD product term function of the CAM AND array portion 1302A generates a '1' if all of the bits of words A and B match. The priority encoder 1804 (see priority encoder 808 in FIG. 8E) converts PIT-compared results to an encoded address of the CAM AND array portion 1302A.

The CAM write operation may be implemented similar to a dual-port SRAM described above, except for the differences described herein. Assuming CAM words are compared PT-by-PT, words may be written into the CAM AND array portion 1302A in the column direction (column-by-column) because PTs are aligned in the column direction. One way to update/write a column is to update row-by-row and enable one column select line 1418 in FIG. 14. This process will take 128 cycles for one CAM word update.

To speed up the CAM update process, a CAM circuit may select and write to all rows in a enabled column that should be written with a '1' in the CAM AND array portion 1302A in one cycle. Then the CAM circuit selects and writes to all the rows in a enabled column that should be written with a '0' in the CAM AND array portion 1302A in the next cycle. This reduces a CAM write operation to two cycles.

In one embodiment, the CAM write operation may be done in one cycle, and a multi-match may be done in one cycle. To update all rows in an enabled column in one cycle, the row drivers 1304A, 1830 and the x-address decoder 1808 in FIG. 18 may select and write to all rows that should be written with a '1' through port A, and select and write to all rows that should be written with a '0' through port B. In this embodiment, the row drivers 1304A, 1830 and x-address decoder 1808 in FIG. 18 are somewhat similar to the CPLD row drivers 1304 in FIG. 13. Port A x-address decoder may be the inverse of the port B x-address decoder. In this embodiment, the Port A bit line (ABL) 1814A receives a '1,' and the Port B bit line (BBL) 1814B receives a '0.'

Cross-Point Switch

A cross-point switch (FIGS. 10A–10L) may be implemented through CPLD product terms, with the configuration restriction that only one of the inputs is programmed. It is a special case in CPLD that only one input constitutes a product term. Since the configuration can be updated any time through CAM write, the cross point switch may change its connectivity whenever desired.

Mask Programming

To reduce manufacturing costs and improve performance, a manufacturer may produce a device with mask-programmed circuits derived from a field-programmable device 100 (described above, e.g., FIGS. 1A–1C) with multiple field-programmable GLBs 102 (described above, e.g., FIG. 2A). For example, the manufacturer gives a field-programmable device 100 (described above, e.g., FIGS. 1A–1C) with multiple field-programmable GLBs 102 (described above, e.g., FIG. 2A) to a designer. The designer may be an application specific integrated circuit (ASIC) manufacturer, a cell phone manufacturer, a computer manufacturer or some other electronic device maker.

The designer prototypes the field-programmable device 100 (with multiple GLBs 102) to implement a particular function or set of functions, such as functions in a cell phone. The designer may determine that the particular function needs, for example, X % of the GLBs 102 in the device 100 to perform PT logic, Y % of the GLBs 102 to perform RAM, and Z % of the GLBs 102 to perform FIFO. The designer informs the manufacturer that the designer desires a device with a desired ratio of PT logic vs. memory functions (e.g., X % of the GLBs 102 in the device 100 to perform PT logic, Y % of the GLBs 102 to perform RAM, and Z % of the GLBs 102 to perform FIFO).

The designer may provide additional instructions to the manufacturer on how a device desired by the designer should be programmed and configured. For example, the designer may provide a specific configuration fusemap that specifies each pin's function and routing information inside the device 100. This fusemap is used in the field to program the device 100. The designer gives this fusemap to the manufacturer and asks the manufacturer to make a mask that follows the information in the fusemap.

Based on the designer's instructions, the manufacturer creates a second device with one or more "mask-programmed" sections that are pre-programmed in the manufacturer's factory, and are not programmable in the field. Specifically, the manufacturer replaces one or more field-programmable circuits in the device 100 with mask-programmed circuits to perform the function(s) specified by the designer. The manufacturer uses mask steps (dedicated to a function specified by the designer) in a multi-step IC device manufacturing process to create the mask-programmed circuits. Since mask-programmed circuits cannot be changed in the field, the mask-programmed part of the second device is essentially customized for a given designer. The relationship between the first device 100 and the second device may be similar to the relationship between an EEPROM and a Mask ROM.

The combination of the first programmable device and the second device with a mask-programmed section offer a greater value for the designer than either device by itself. Because the second device includes a mask-programmed section, the second device is less expensive to manufacture than the first device. The mask programmed circuits may be much smaller and faster than field-programmable circuits. Thus, mask-programmed circuits offer a cheaper and higher performance part to a designer.

In one embodiment, all of the programmable circuits in the first device 100 are converted to pre-programmed, non-field-programmable, mask-programmed circuits to form the second device. For this embodiment, the manufacturer is able to replace all switches that controlled by fuse with metal connection/disconnection. The manufacturer may be able to eliminate all non-volatile cells.

In another embodiment, the finished second device may comprise a combination (or ratio) of one or more pre-programmed, non-field-programmable, mask-programmed circuits and one or more field-programmable circuits, such as the configurable product term circuits of FIGS. 2A, 11B, 14A, 14B, 15. For example, the second device may comprise 70% mask-programmed circuits (according to the designer's fusemap) and 30% field-programmable circuits, such as the GLBs 102 described above. The second device may have, for example, a few programmable bits for localized functions. For this embodiment, the manufacturer has to keep 30% SRAM as controlled switches and NV cells, but is able to eliminate 70% of the programmable circuits.

In both embodiments above, the manufacturer can generate a smaller die with reduced circuits. The new die should have higher performance because of the smaller die and several configuration switches are replaced by metal connections. Both embodiments will work for designers who use PLD during prototyping and change to ASIC during production.

ASIC I/O Module

The device 100 described above may further comprise one or more programmable input/output (I/O) modules configured to allow the device 100 to select an input/output interface standard (e.g., output voltage) from a plurality of predetermined interface standards, such as 5.0-volt and 3.3-volt output voltages, differential output voltages (the output signal is the difference in voltage between two pins), open drain and other output voltage standards known to those of ordinary skill in the art.

In one embodiment, the programmable input/output (I/O) module comprises a plurality of advanced I/O cells (ASIC I/Os), where each advanced I/O cell may be configured to use one I/O interface standard while another advanced I/O cell is configured to use another I/O interface standard. Thus, various I/O interface standards are used simultaneously at different I/O cells. In another embodiment, the programmable input/output (I/O) module comprises one or more low voltage differential signal (LVDS) input/output modules.

Other Components: Phase Locked Loop, State Machine

The programmable device 100 may further comprise an on-chip phase locked loop (PLL) to enhance clock functionality, a state machine to allow an external CPU to program the device, a state machine to allow JTAG programmability and/or a state machine to allow In-System Programmability (ISP).

Package and Pinout Migration

According to one aspect of the invention, a manufacturer may provide a family of integrated circuit devices, where each integrated circuit device comprises a different number of GLBs, i.e., a different number of macrocells, where one GLB corresponds to 32 macrocells in one embodiment. For example, the manufacturer may offer devices with 256, 368, 384, 512, 768, 1024, 1536 or 2048 macrocells. The number of macrocells in a device may be referred to as the "density" or "capacity" of the device.

An integrated circuit device may be assembled into a "package." A device with a particular density (e.g., 512 macrocells) may be assembled in a number of different package configurations. Each package configuration may have a different number of total pins, such as 160, 208, 272, 388 or 484 pins. Some of the pins are I/O pins and some of the pins are control signal pins (e.g., VCC, VSS, CLK, control). For example, a device with a particular density (e.g., 512 macrocells) may be assembled in packages with 160, 208, 272, 388 or 484 pins. For each of these packages, a various number of pins are assigned to function as 10 pins, such as 104, 156, 196, 212, 256 or 304 I/O pins.

In addition, each package configuration with a set number of pins may be configured to house devices with different densities, one at a time. This may be called "package migration." To house devices with different densities (one at a time) in the same package configuration, all devices preferably have the same pinout definition or specification to accommodate specific signals (e.g., VCC, VSS, CLK, CONTROL, global signals, and macrocell I/Os) assigned to pins at specific locations of the package. For example, if pin 38 on a 272-pin package is assigned to VCC, then all devices that may be housed in that package are configured to accommodate VCC at pin 38. If pin N on a package is assigned to I/O, then pin N is I/O or "not connected" for a device assembled in the package. In one embodiment, all signals such as VCC, VSS, CLK, CONTROL, etc. are at identical pins on the devices. "Pinout migration" refers to devices with various densities and an identical pinout, which can be housed in one package configuration.

For example, a package with 388 pins can house a device with 512 macrocells, where 256 of the 388 pins are used as I/O pins. Alternatively, the same 388-pin package can house a device with 768 macrocells, where 304 of the 388 pins are used as I/O pins. The packaged device with 512 macrocells has more "not connected" pins than the packaged device with 768 macrocells because the device with 768 macrocells uses more pins on the package as I/O pins. Thus, a user can use the 388-pin package as a socket and swap or replace a device with 768 macrocells with a device with 512 macrocells and use the extra "not connected" pins for other inputs/outputs.

These packages allow a user to migrate (i.e., "drop-in," replace or "swap") a higher or lower capacity integrated circuit device without redesigning the layout of a circuit board or any support chip. For example, a first device with 512 macrocells may be housed in either a 484-pin package or a 388-pin package. A second device with 256 macrocells may be housed in a 388-pin package or a 272-pin packages or 100 pins. As a result of the pin configurations, the first and second packaged devices are swappable by the customer one at a time on a system printed circuit board.

In one design process, a customer designs an application (e.g., an Internet traffic controller) with a design entry software. The customer then uses a place-and-route design software to select (1) a device density that fits the application density, and (2) a package configuration based on a number of IOs suitable for the design. In the future, if the customer needs to add or remove logic, the customer can switch to a higher or lower density device, and still use the same package configuration. This may be called plug-in replacement.

Various types of memories, MUXes, DEMUXes, input/output devices, caches, controllers, registers and/or processing components may be used in accordance with the present invention. The scope of the present invention is not limited to a particular type of memory, input/output device, cache, controller, register and/or processing component. Various embodiments of the device 100 may comprise other components in addition to or instead of the components shown in the Figures without departing from the scope of the invention. For example, the device 100 in FIG. 1A may comprise additional memories, caches, controllers, registers and/or processing components.

The above-described embodiments of the present invention are merely meant to be illustrative and not limiting. It will thus be obvious to those skilled in the art that various changes and modifications may be made without departing from this invention in its broader aspects. The appended claims encompass all such changes and modifications as fall within the true spirit and scope of this invention.

What is claimed is:

1. A programmable logic device including a plurality of logic blocks, each logic block, comprising:
    a plurality of product term circuits each operable to provide a product term output;
    a plurality of M OR gates, wherein each OR gate is configured to receive a subset of the product term outputs and provide a sum of products output;
    a plurality of M macrocells corresponding to the plurality of M OR gates, wherein each macrocell is configurable to register the sum of products output from its corresponding OR gate; and
    a plurality of M multiplexers corresponding to the plurality of M OR gates and the plurality of M macrocells, wherein each multiplexer is configured to select between a product term output and a carry-in signal to provide a carry-out signal, and wherein the multiplexers are arranged from a first multiplexer to an Mth multiplexer to form a carry cascade such that the carry-out signal from the first multiplexer becomes the carry-in signal for the second multiplexer, the carry-out signal from the second multiplexer becomes the carry-in signal for the third multiplexer, and so on.

2. The programmable logic device of claim 1, wherein the selection by each multiplexer is controlled by the sum of products output from its corresponding OR gate.

3. The programmable logic device of claim 2, wherein each logic block further comprises:
    a plurality of M exclusive OR gates corresponding to the plurality of M OR gates, wherein each exclusive OR gate is configured to receive the sum of product output from its corresponding OR gate and the carry-in signal to generate a sum signal.

4. The programmable logic device of claim 3, wherein each macrocell is configurable to register the corresponding sum signal.

5. The programmable logic device of claim 4, further comprising a routing structure, wherein the routing structure is configurable to route the carry-out signal corresponding to the Mth macrocell in a given logic block into the carry-in signal corresponding to the first macrocell in another logic block.

6. The programmable logic device of claim 4, wherein the first macrocell in each logic block is configurable to generate its corresponding carry-in signal.

7. The programmable logic device of claim 6, wherein each logic block is configurable to receive a user-generated signal as the carry-in signal for its first multiplexer.

8. A programmable logic device including a plurality of logic blocks, each logic block comprising:
    a plurality of product term circuits each operable to provide a product term output;
    a plurality of N OR gates, wherein each OR gate is configured to receive a subset of the product term outputs and provide a sum of products output;
    a plurality of N macrocells corresponding to the plurality of OR gates, wherein each macrocell is configurable to register the corresponding sum of products output and wherein the macrocells are arranged from a first macrocell to an Nth macrocell; and
    a means for generating a carry cascade from the first macrocell to the Nth macrocell, wherein, for each macrocell, the means uses the sum of product term output from the corresponding OR gate to control the carry propagation.

9. The programmable logic device of claim 8, wherein the carry cascade is the carry cascade for an arithmetic addition.

10. The programmable logic device of claim 9, further comprising means for generating a sum signal for each macrocell, wherein the means uses the sum of products output from the corresponding OR gate and the macrocell's carry-in signal to generate each macrocell's sum signal.

11. The programmable logic device of claim 10, wherein each macrocell is configurable to register its corresponding sum signal.

12. The programmable logic device of claim 8, wherein the carry cascade is the carry cascade for an arithmetic subtraction.

13. The programmable logic device of claim 8, wherein the carry cascade is the carry cascade for a magnitude comparison.

14. A method, comprising:
    providing a logic block having a plurality of macrocells arranged from a first macrocell to an Nth macrocell, each macrocell being configurable to register a corresponding sum of products output;
    generating a carry-in signal for the first macrocell;
    generating a carry-out signal from either the carry-in signal or a product term output, wherein selection of either the carry-in signal or the product term output is based upon the sum of products output corresponding to the first macrocell; and
    continuing the carry cascade such that the carry-out signal from the first macrocell becomes a carry-in signal for the second macrocell, a carry-out signal for the second macrocell becomes the carry-in signal for the third macrocell, and so on, wherein the carry generation at each macrocell is based upon its corresponding sum of products output.

15. The method of claim 14, further comprising:
    for each macrocell, generating a sum signal using the macrocell's carry-in signal and the corresponding sum of product output.

16. The method of claim 15, further comprising:
    within each macrocell, registering its sum signal.

17. The method of claim 14, further comprising:
    for a given logic block, receiving the carry-out signal from the Nth macrocell, and routing the received carry-out signal into the carry-in signal for the first macrocell in another logic block.

18. A programmable logic device including a plurality of logic blocks, one or more logic blocks comprising:

a plurality of product term circuits each operable to provide a product term output;

a plurality of OR gates each configured to receive a subset of the product term outputs and provide a sum of products output;

a plurality of macrocells each configurable to register the sum of products output from an OR gate; and a plurality of multiplexers corresponding to the plurality of macrocells, each multiplexer configurable to select between a product term output and a carry-in signal to provide a carry-out signal;

wherein the multiplexers are arranged to form a carry cascade such that the carryout signal from a first multiplexer becomes the carry-in signal for a second multiplexer, and the carry-out signal from the second multiplexer becomes the carry-in signal for a third multiplexer.

19. The programmable logic device of claim 18, wherein a logic block further comprises:

a plurality of exclusive OR gates each configured to receive the sum of product output from an OR gate and the carry-in signal to generate a sum signal.

20. The programmable logic device of claim 18, further comprising a routing structure configurable to route the carry-out signal corresponding to a macrocell in a given logic block into the carry-in signal corresponding to a macrocell in another logic block.

* * * * *